United States Patent
Brown et al.

(10) Patent No.: US 9,381,731 B2
(45) Date of Patent: Jul. 5, 2016

(54) EPITAXIAL LIFT OFF SYSTEMS AND METHODS

(71) Applicant: ALTA DEVICES, INC., Santa Clara, CA (US)

(72) Inventors: Brian Brown, Palo Alto, CA (US); Brian Burrows, San Jose, CA (US); David Berkstressor, Los Gatos, CA (US); Gang He, Cupertino, CA (US); Thomas J Gmitter, Sunnyvale, CA (US)

(73) Assignee: ALTA DEVICES, INC., Sunnyvale, CA (US)

( * ) Notice: Subject to any disclaimer, the term of this patent is extended or adjusted under 35 U.S.C. 154(b) by 75 days.

(21) Appl. No.: 14/281,386

(22) Filed: May 19, 2014

(65) Prior Publication Data
US 2014/0251547 A1    Sep. 11, 2014

Related U.S. Application Data

(62) Division of application No. 13/039,307, filed on Mar. 2, 2011.

(60) Provisional application No. 61/309,625, filed on Mar. 2, 2010.

(51) Int. Cl.
| | |
|---|---|
| *B32B 43/00* | (2006.01) |
| *H01L 21/67* | (2006.01) |
| *H01L 21/677* | (2006.01) |
| *H01L 21/78* | (2006.01) |
| *H01L 31/18* | (2006.01) |

(52) U.S. Cl.
CPC .......... *B32B 43/006* (2013.01); *H01L 21/6776* (2013.01); *H01L 21/67086* (2013.01); *H01L 21/67092* (2013.01); *H01L 21/67132* (2013.01); *H01L 21/67706* (2013.01); *H01L 21/67721* (2013.01); *H01L 21/7813* (2013.01); *H01L 31/1896* (2013.01); *Y02E 10/50* (2013.01); *Y10T 156/1111* (2015.01); *Y10T 156/15* (2015.01)

(58) Field of Classification Search
CPC .................................................... B32B 43/006
USPC ............................................................ 216/40
See application file for complete search history.

(56) References Cited

U.S. PATENT DOCUMENTS

| | | | |
|---|---|---|---|
| 4,846,931 | A | 7/1989 | Gmitter et al. |
| 5,201,996 | A | 4/1993 | Gmitter et al. |
| 5,286,335 | A | 2/1994 | Drabik et al. |
| 5,344,517 | A | 9/1994 | Houlding |
| 6,214,733 | B1 | 4/2001 | Sickmiller |
| 7,037,854 | B2 | 5/2006 | Bachrach et al. |
| 8,003,492 | B2 | 8/2011 | Gmitter et al. |
| 2004/0134416 | A1 | 7/2004 | Furuyama |
| 2007/0160454 | A1 | 7/2007 | Iida |
| 2010/0001374 | A1 | 1/2010 | Gmitter et al. |
| 2010/0151689 | A1 | 6/2010 | Gmitter et al. |
| 2011/0214805 | A1 | 9/2011 | Brown et al. |

*Primary Examiner* — Roberts Culbert
(74) *Attorney, Agent, or Firm* — Arent Fox LLP

(57) ABSTRACT

Epitaxial lift off systems and methods are presented. In one embodiment a tape is disposed on the opposite side of the epitaxial material than the substrate is used to hold the epitaxial material during the etching and removal steps of the ELO process. In various embodiments, the apparatus for removing the ELO film from the substrates without damaging the ELO film may include an etchant reservoir, substrate handling and tape handling mechanisms, including mechanisms to manipulate (e.g., cause tension, peel, widen the etch gap, etc.) the lift off component during the lift off process.

14 Claims, 40 Drawing Sheets

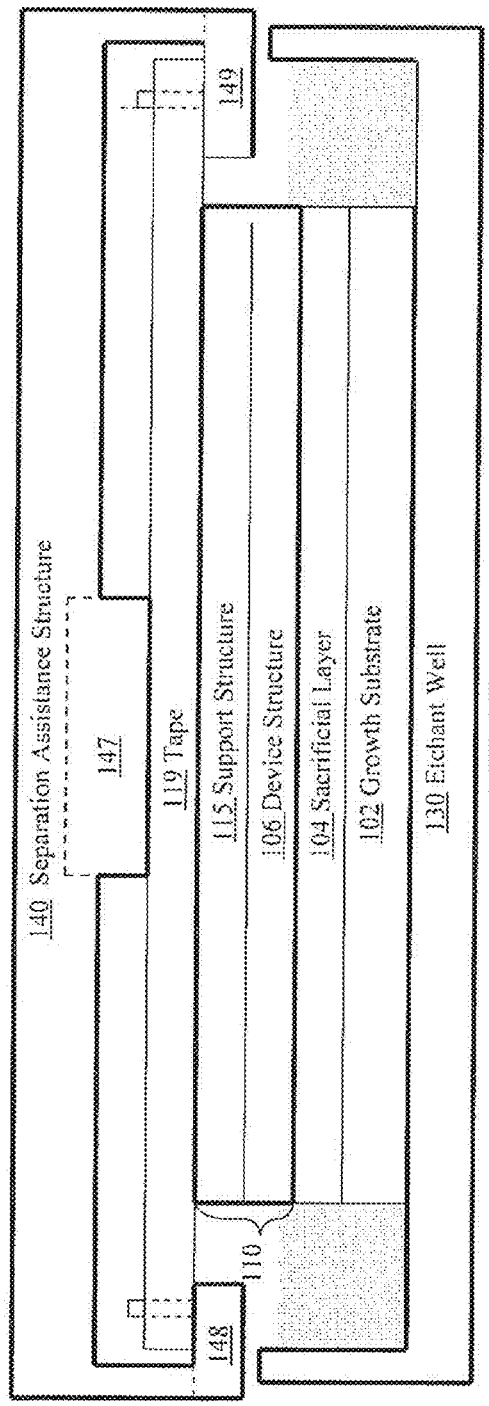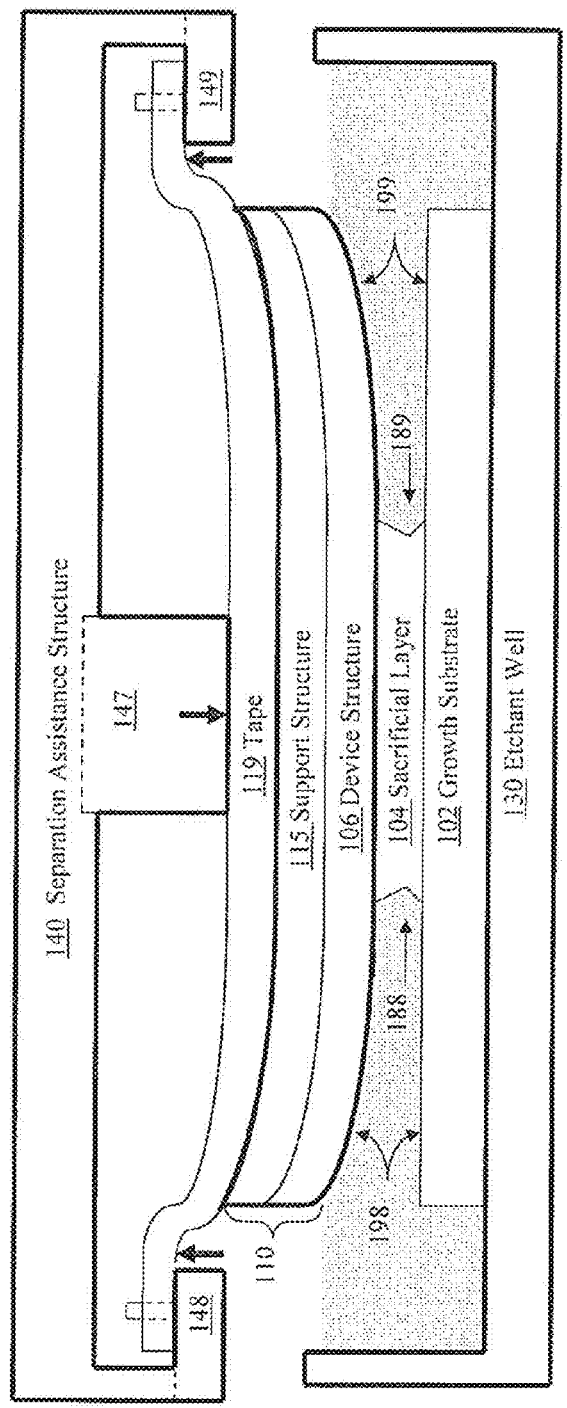

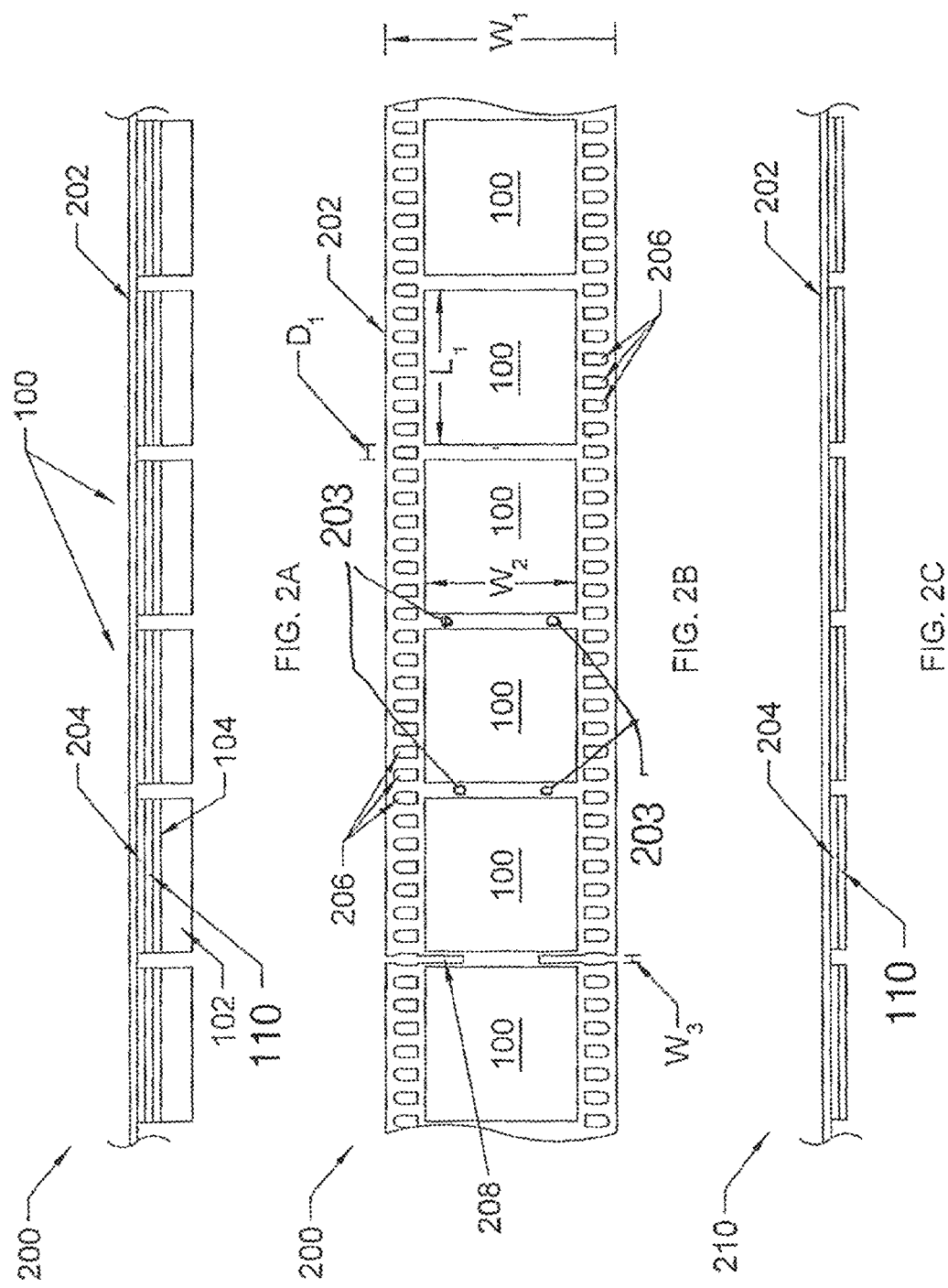

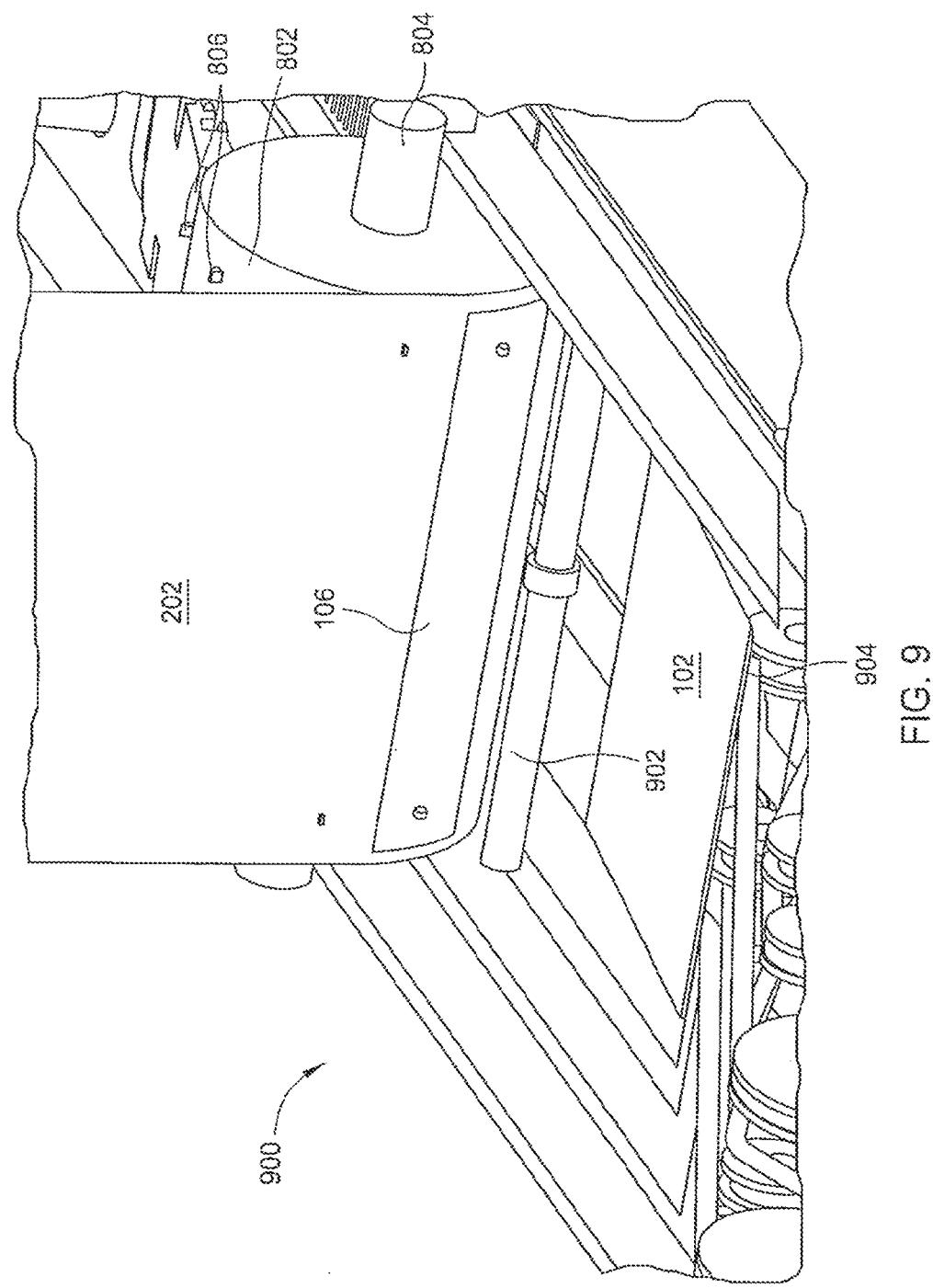

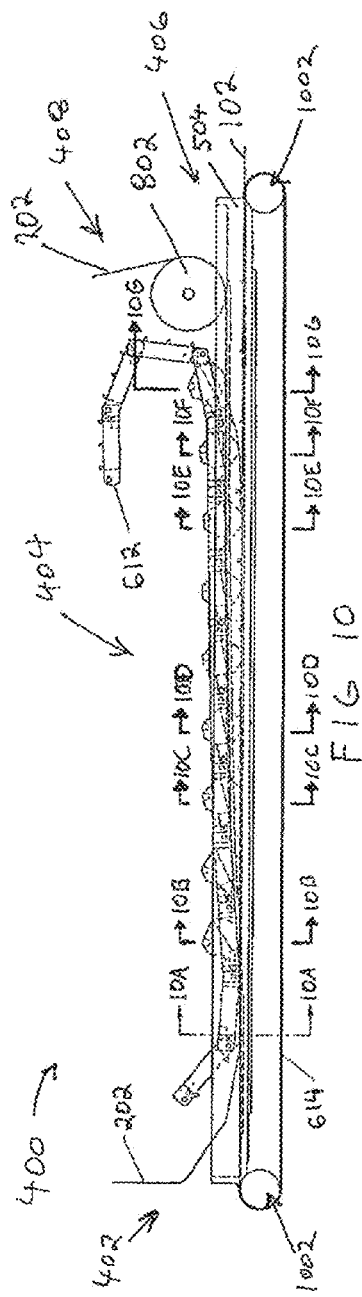

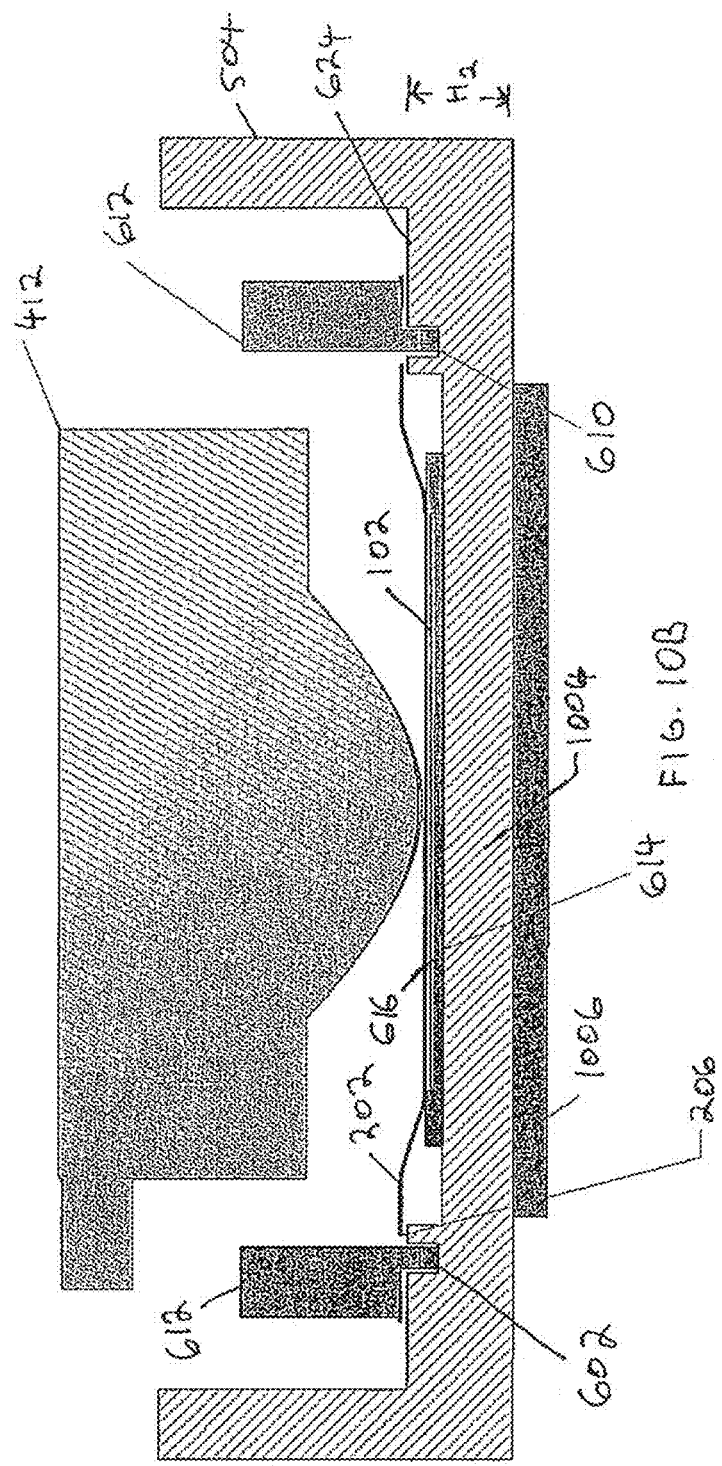

FIG. 10C

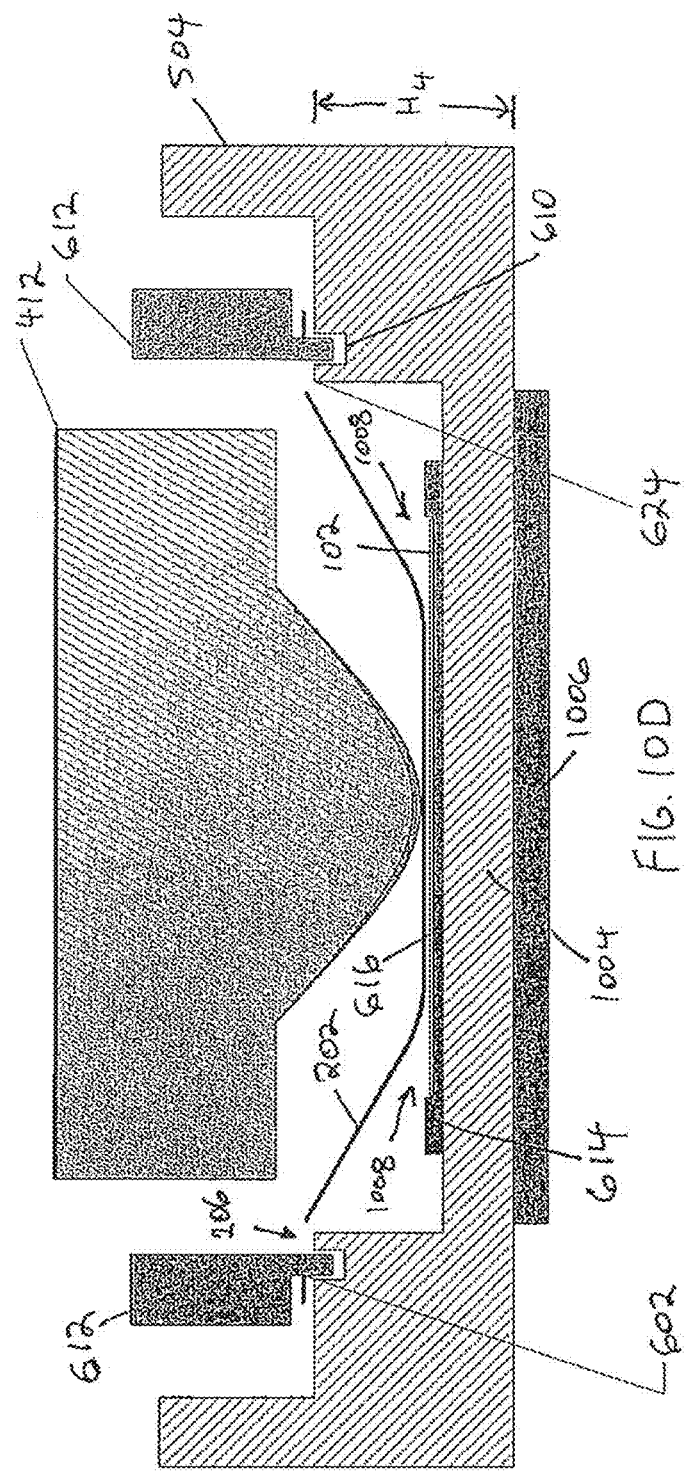

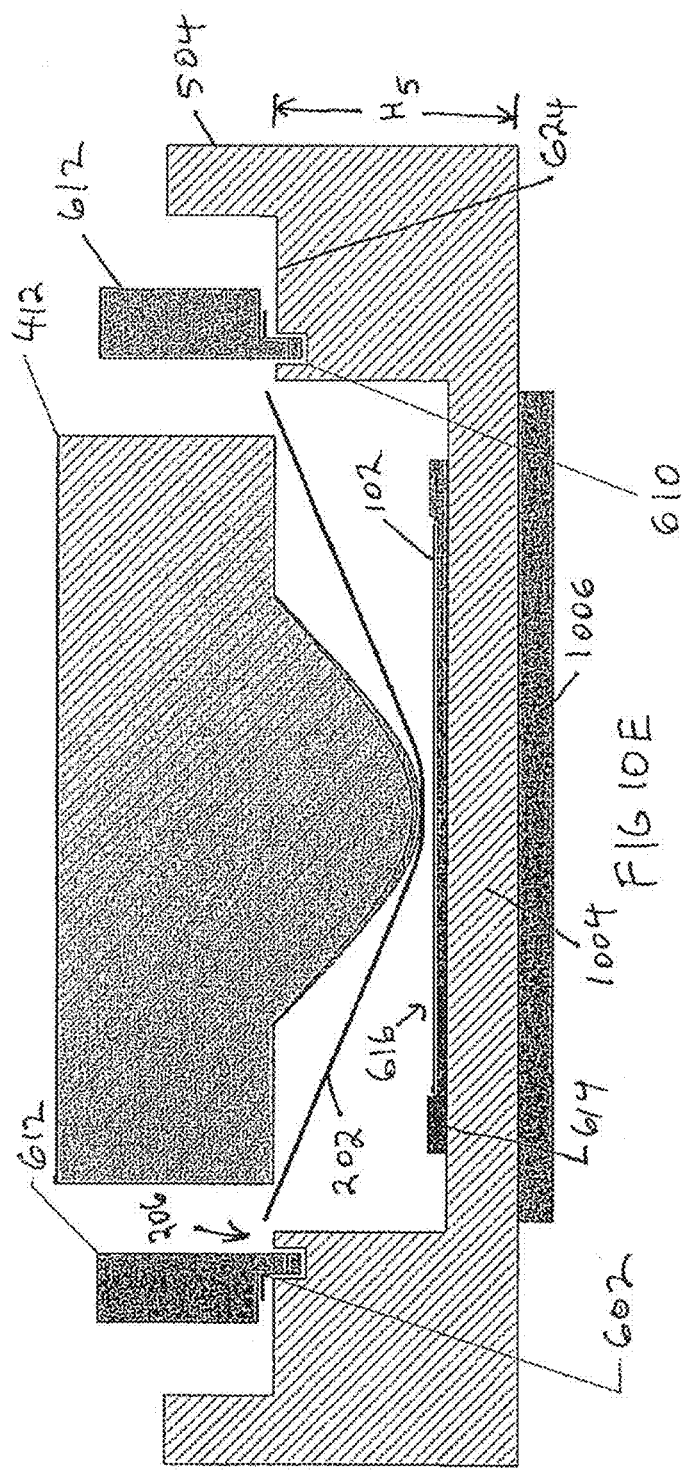

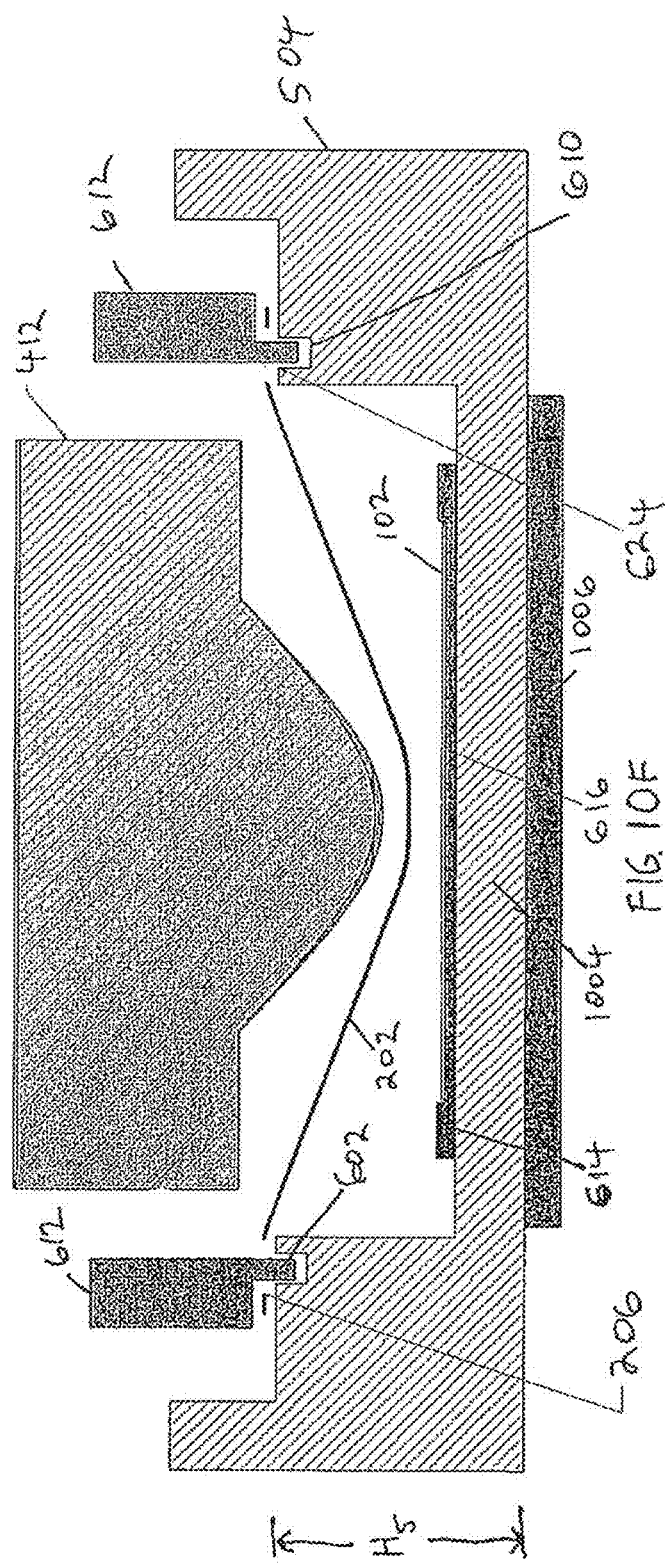

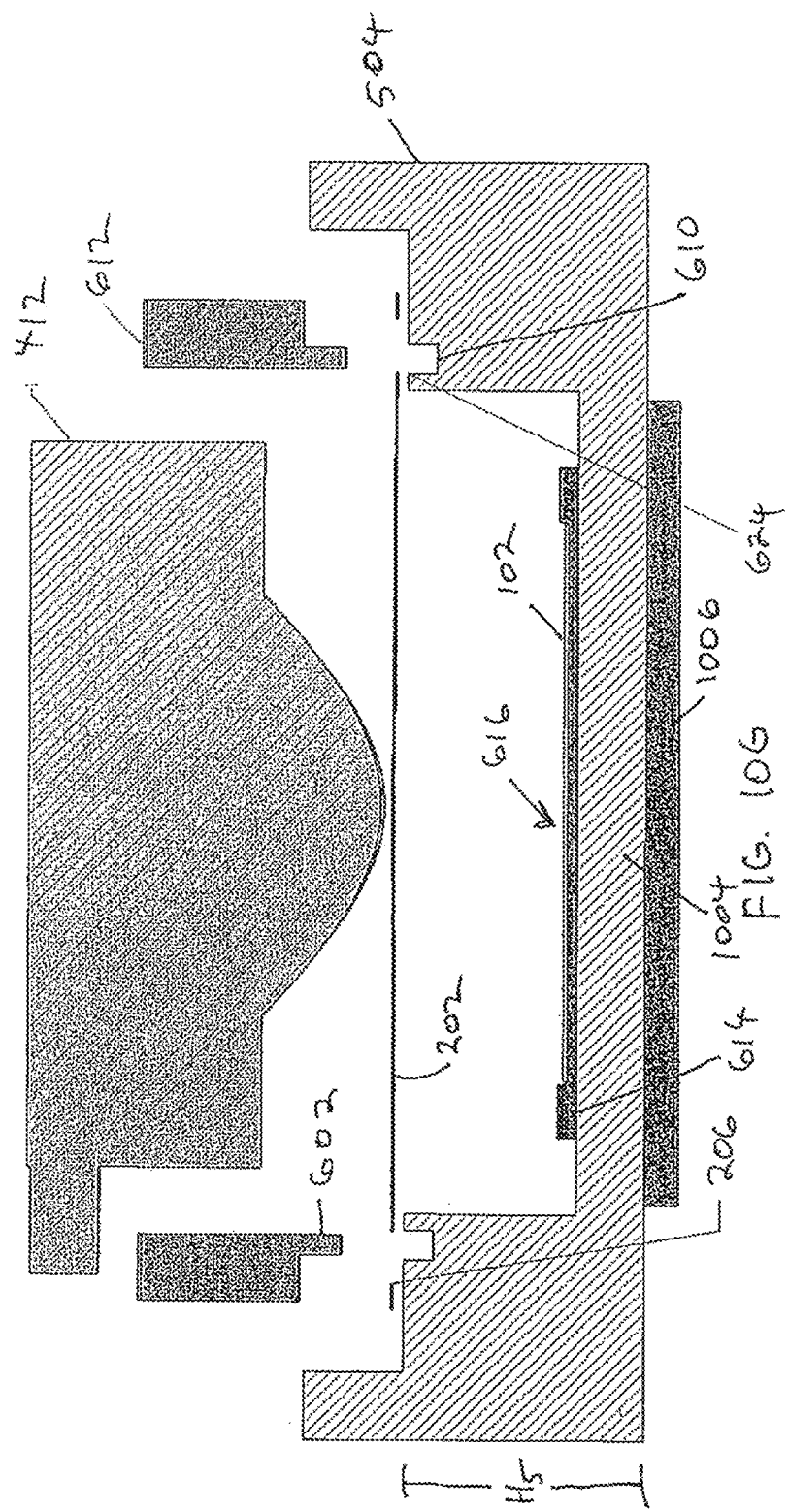

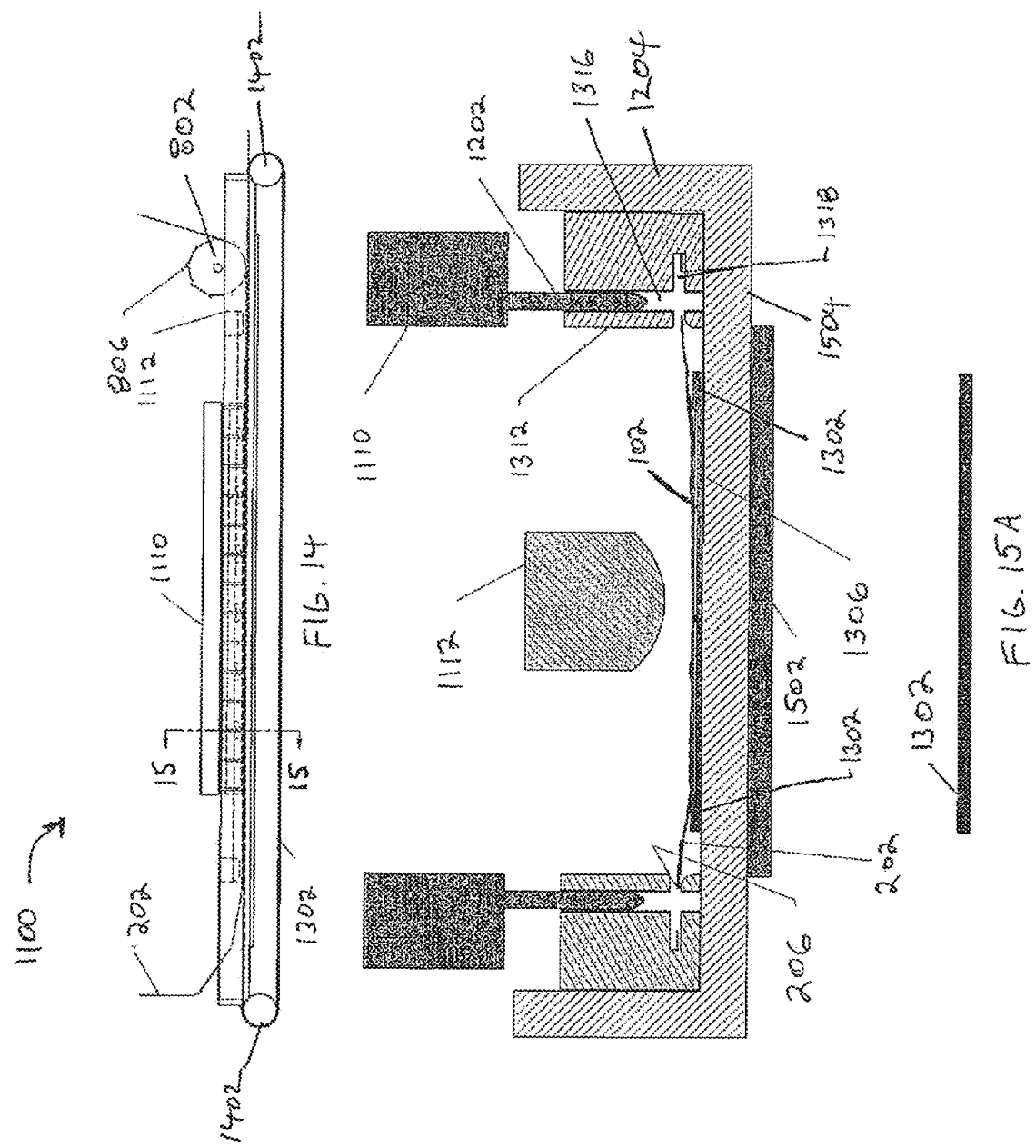

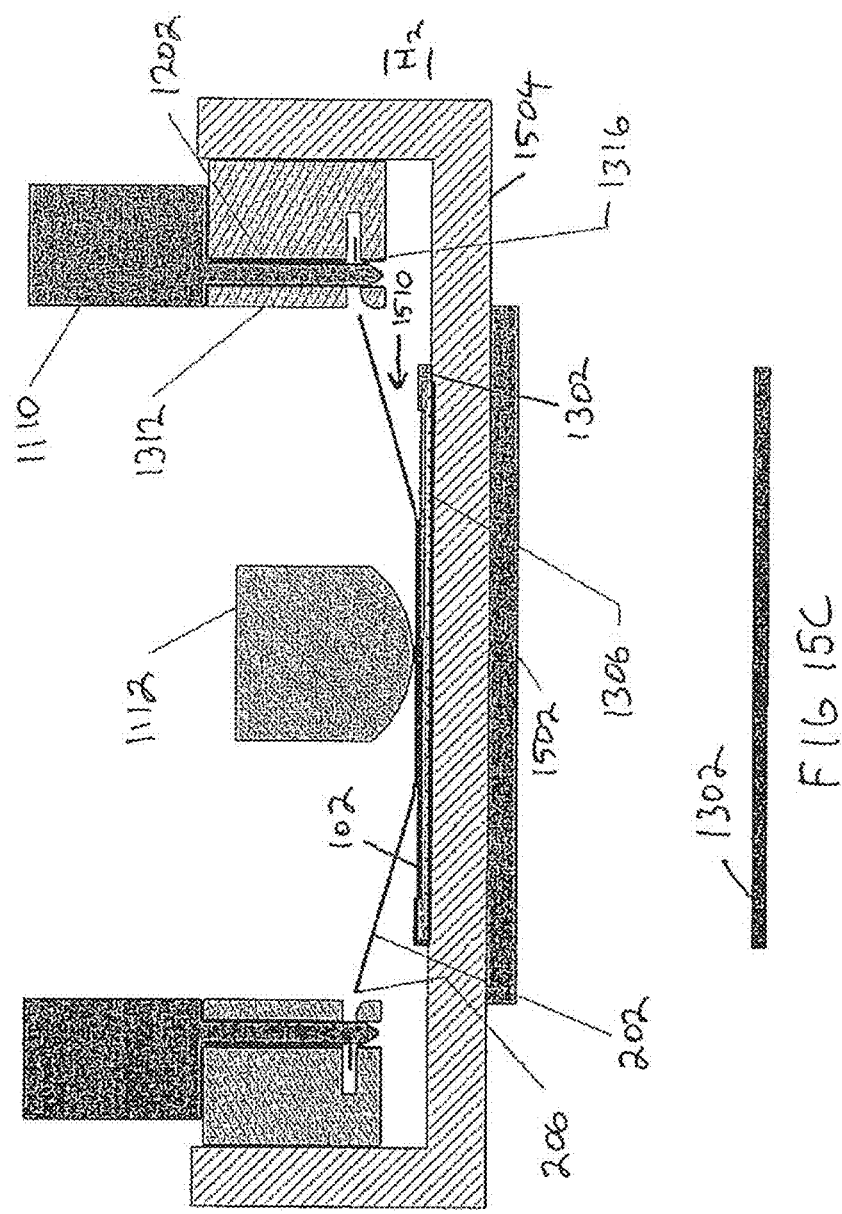

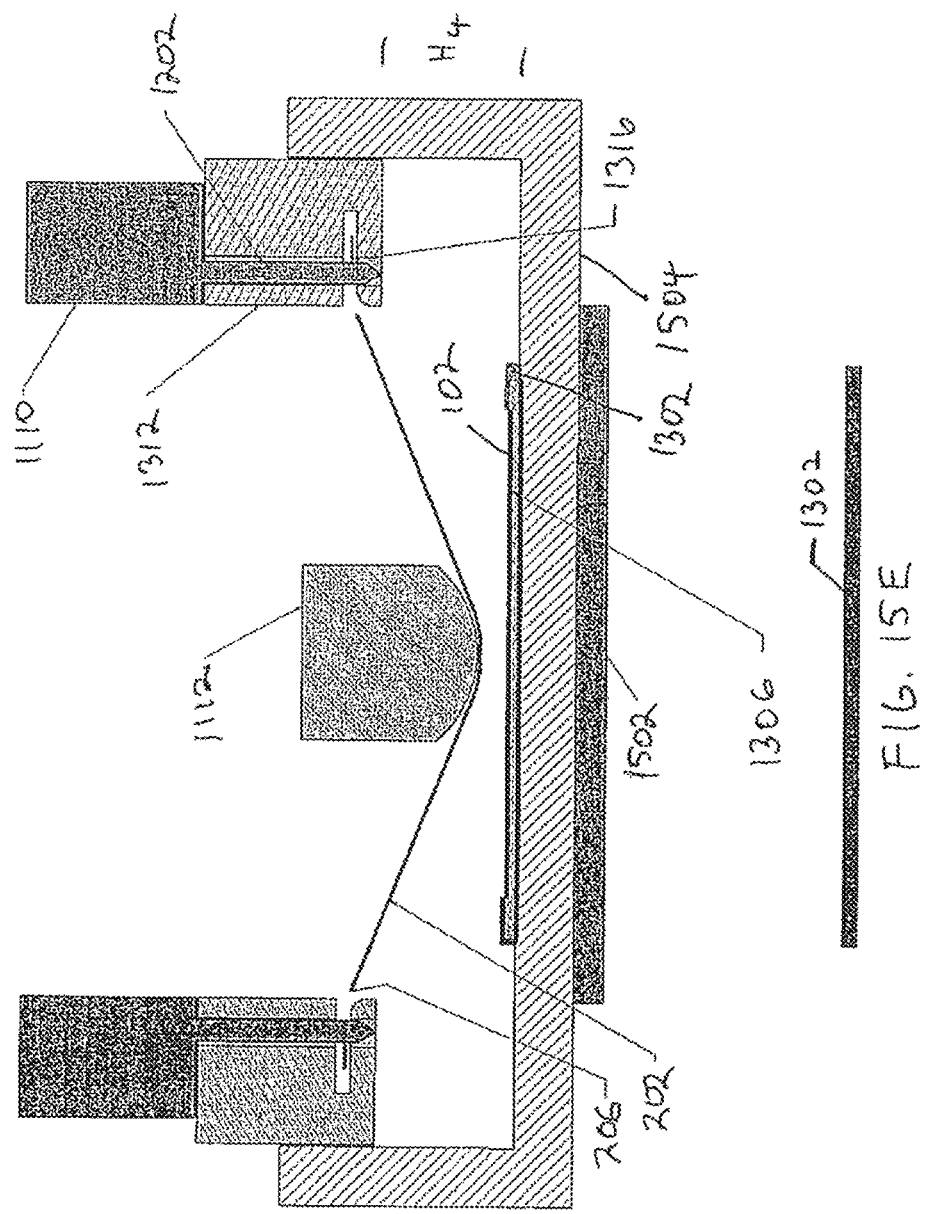

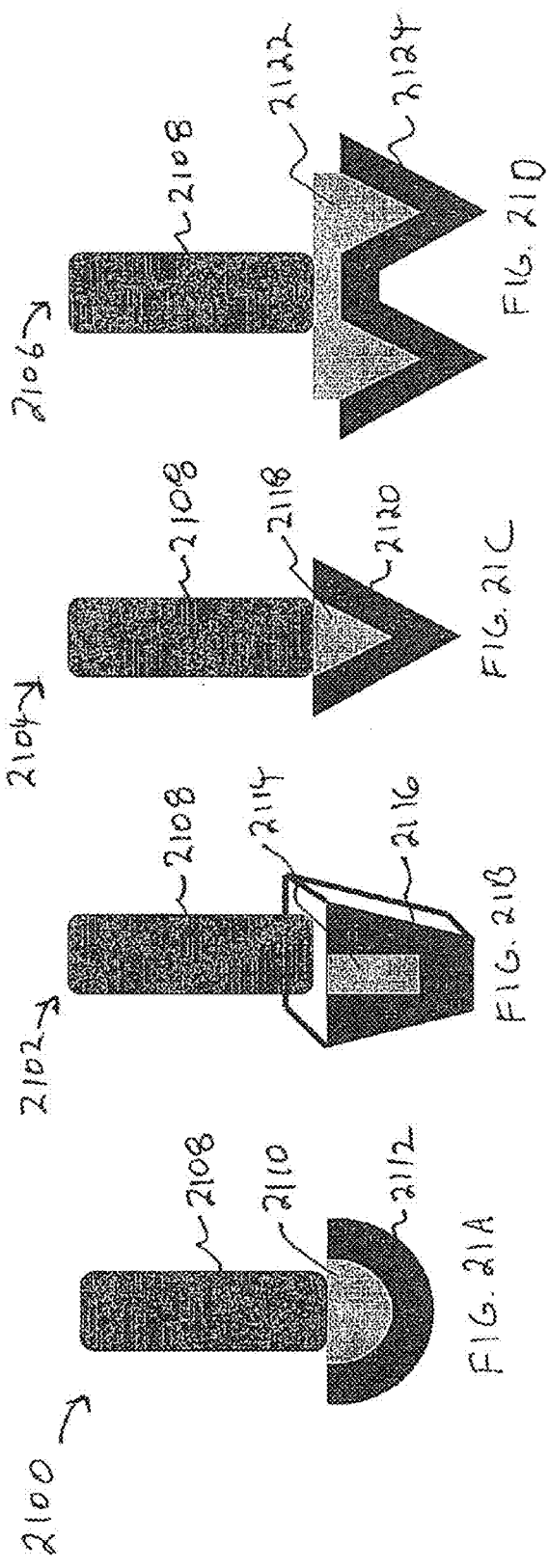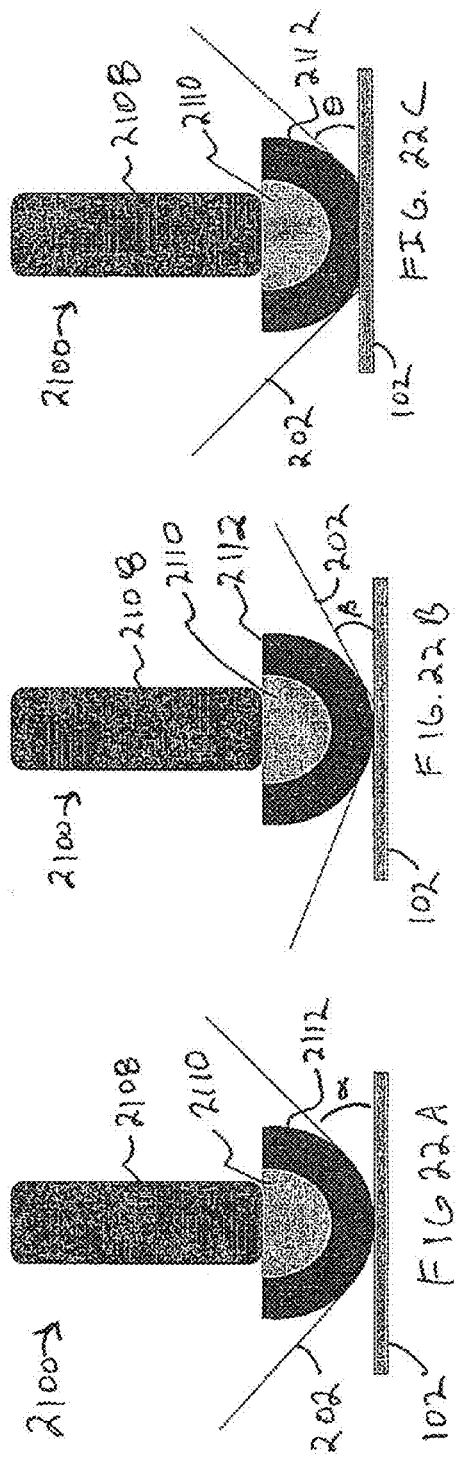

EPITAXIAL LIFT OFF SYSTEMS AND METHODS

RELATED APPLICATIONS

The present application is a divisional of application Ser. No. 13/039,307 filed Mar. 2, 2011, which claims the benefit of priority to Provisional Application 61/309,625 entitled "Reduced Etchant Consumption Methods and Apparatus for Tape-Based Epitaxial Lift Off" filed Mar. 2, 2010, which are all incorporated herein by reference.

FIELD OF THE INVENTION

Embodiments of the invention generally relate to apparatus and methods for epitaxial lift off (ELO) processes, including reducing etchant consumption and volume during ELO processes.

BACKGROUND

Various devices and circuits are often utilized in a number of applications to achieve advantageous results. The devices and circuits can be utilized to increase productivity and reduce costs in a variety of activities (e.g., power generation, information processing, communication, etc.). The devices (e.g., including photovoltaic devices, solar conversion devices, solar cell devices, opto-electric devices, optical devices, photonic devices, mechanical devices, semiconductor devices, electronic thin film devices, other thin film devices, etc.) can include thin films or layers. Manufacturing and utilizing thin film devices can be very complex and complicated.

Conventional manufacturing techniques typically involve a relatively large volume of etchant (e.g., HF, etc.). The etchant is usually used to remove a sacrificial layer during an epitaxial lift of process. Traditional etchant approaches are often rather expensive and increase the cost of the ELO process. In addition, the ethcants (e.g., Hydrogen fluoride, hydrofluoric acid, fluorine, derivatives thereof, combinations thereof, etc.) can be extremely hazardous compounds in large quantities. Added expensive safety precautions to guard against system leaks, contamination and evaporation are often required when increased large volumes of etchant chemicals are used in fabrication processes. For example, regulatory organizations (e.g., Occupational Safety and Health Administration (OSHA), etc.) typically rate fabrication processes differently when large amounts of hydrogen fluoride or hydrofluoric acid are used. The corresponding requisite safety precautions often result in higher facility construction costs and higher operational costs. Large volumes of hydrogen fluoride or hydrofluoric acid can also create other inconveniences. For example, fabrication facility location can be restricted.

SUMMARY OF THE INVENTION

Epitaxial lift off systems and methods are presented. In one embodiment, a tape is disposed on the opposite side of the epitaxial material than a substrate and is used to transport and manipulate (e.g., peel, pull, etc.) a portion of the epitaxial material during the etching and removal steps of the ELO process. The manipulation can be directed to widening a gap between a substrate and an epitaxial lift off component to enable increase etchant access to an etchant front. In various embodiments, the apparatus for removing the ELO film from the substrates without damaging the ELO film may include an etchant reservoir, substrate handling and tape handling mechanisms, including mechanisms to manipulate (e.g., cause tension, peel, widen the etch gap, etc.) the lift off component during the lift off process.

In one embodiment, the system includes an etchant application component, a separation assistance component and a tape application component. The etchant application component is configured to apply etchant to a sacrificial layer between an epitaxial lift off component and a growth substrate. The separation assistance component is configured to manipulate the epitaxial lift off component to assist separation of the epitaxial lift off component from the substrate, wherein manipulation of the epitaxial lift off component is controlled to facilitate exposure of an etchant to an etch face of the sacrificial etch layer. The tape application component is configured to couple the epitaxial lift off component to a tape, wherein the tape assists the manipulation and transportation of an epitaxial lift off component while etchant is applied to the sacrificial layer. The manipulation by the separation assistance component includes applying a force to increase a gap distance between portions of the epitaxial lift off component and the growth substrate prior to final separation. In one embodiment, the force is applied to the tape and the tape pulls on the epitaxial lift off component. In one embodiment, the manipulation by the separation assistance component includes applying a force to assist mitigation of adverse impacts associated with final separation of the epitaxial lift off component from the growth substrate.

In one embodiment, the separation assistance component includes a drive link ramp including an elongated slot and having a height that increases from the first end of the apparatus through the etching section; and a chain drive comprising a plurality of drive pins, the plurality of drive pins extend through the plurality of slots in the tape and into the elongated slots, wherein the chain drive drives the tape along the drive link ramp causing the sides of the tape along and up the increasing height of the drive link ramps. In one exemplary implementation, the separation assistance component further comprises a plurality of point loads that contact the center of the tape as the tape is driven along and up the increasing height of the drive link ramps.

In one embodiment, the separation assistance component includes two guide rails, each guide rail including a slot that receives one side of the tape, and a plurality of index pin receiving holes; and two pin rails, each pin rail including a plurality of index pins; wherein the pin rails are operable to be lowered with respect to the guide rails such that the plurality of index pins extend into the index pin receiving holes and through the plurality of slots along the sides of the tape; and wherein the pin rails and the guide rails are operable to raise the sides of the tape. In one exemplary implementation, the separation assistance component further comprises a weight bar that provides force on a center of the tape and substrates. In one exemplary implementation the etchant application component includes: a substrate pocket configured to support the substrate and hold the etchant; and an etchant supply component configured to deliver etchant to the substrate and the substrate pocket.

In one embodiment, the separation assistance component includes a plurality of roller drive shafts each roller driveshaft supporting one roller of the series of rollers; a plurality of driven miter gears, each miter gear mounted on the end of one of the plurality of roller drive shafts; and a gear driveshaft including a plurality of driving miter gears, each driving miter gear engaging one of the driven miter gears, such that when the gear driveshaft is driven the series of rollers rotate to support the tape and substrate assembly as it proceeds through the etching section. In one exemplary implementation, an etchant supply comprises a plurality of etching spray nozzles that direct an etchant spray toward the tape and substrate assembly in the etching section, either continuously or periodically. The etchant delivery systems can route the etchant to the sacrificial layer between the tape and substrate.

BRIEF DESCRIPTION OF THE DRAWINGS

The accompanying drawings, which are incorporated in and form a part of this specification, are included for exemplary illustration of the principles of the present embodiments and not intended to limit the present invention to the particular implementations illustrated therein. The drawings are not to scale unless otherwise specifically indicated.

FIG. 1C is a block diagram of an exemplary lift off separation system in accordance with one embodiment of the present invention.

FIG. 1D is a block diagram of an exemplary lift off separation system as a sacrificial layer is being etched away in accordance with one embodiment of the present invention.

FIG. 2A is a side view of an assembly formed of a plurality of ELO stacks and substrates adhered to a support tape, according to embodiments of the invention.

FIG. 2B is a plan view of the bottom of the assembly of FIG. 2A.

FIG. 2C is a side view of an assembly formed of a plurality of ELO stacks attached to a support tape, according to embodiments of the invention.

FIG. 9 is an isometric view of a positive substrate detachment assembly for use with embodiments of the ELO process apparatus of the invention.

FIG. 10 is a schematic side view of the apparatus of FIG. 4.

FIG. 10A is a cross section through section line 10A-10A of FIG. 10.

FIG. 10B is a cross section through section line 10B-10B of FIG. 10.

FIG. 10C is a cross section through section line 10C-10C of FIG. 10.

FIG. 10D is a cross section through section line 10D-10D of FIG. 10.

FIG. 10E is a cross section through section line 10E-10E of FIG. 10.

FIG. 10F is a cross section through section line 10E-10F of FIG. 10.

FIG. 10G is a cross section through section line 10G-10G of FIG. 10.

FIG. 14 is a schematic side view of the apparatus of FIG. 11.

FIGS. 15A-15E is a cross sections through section line 15-15 of FIG. 14 during various stages of the operation of the apparatus of FIG. 11.

FIGS. 21A-21D are side views of several embodiments of pushers that may be used with various embodiments of the ELO apparatus of the present invention.

FIGS. 22A-22C are side views of the pusher of FIG. 21A, showing various physical positions between the pusher, the tape and the substrate.

DETAILED DESCRIPTION

Reference will now be made in more detail to preferred embodiments, examples of which are illustrated in the accompanying drawings. While the invention will be described in conjunction with these embodiments, it will be understood that they are not intended to limit the invention to these embodiments. On the contrary, the invention is intended to cover alternatives, modifications and equivalents, which may be included within the spirit of the appended claims. Furthermore, in the following detailed description, numerous specific details are set forth in order to provide an understanding to one of ordinary skill in the art. However, one ordinarily skilled in the art will understand that the present invention may be practiced without these specific details. In some instances, other embodiments, methods, procedures, components, and circuits have not been described in detail as not to unnecessarily obscure aspects of the current invention.

The following descriptions are explained in many instances with respect to epitaxial lift off (ELO) thin film devices with support structures and methods used to form such devices and support structures. It is appreciated that the present invention is not limited to such embodiments and can be utilized in a variety of other configurations and applications. It is appreciated that various items may be referred to with a modifier "epitaxial" (e.g., epitaxial film stack, epitaxial lift off layer, etc.) and that in addition to epitaxially grown portions the item may include components or portions that were not necessarily epitaxially grown (e.g., adhesive layer, support structure, etc.). It is also appreciated that terms such as comprising, including, containing, and so on are inclusive and open ended and do not exclude additional elements or process operations, whether recited or un-recited.

Some of the present epitaxial lift off fabrication systems and methods involve manipulating (e.g., adjusting, bending, peeling, etc) a portion of a wafer during epitaxial lift off to facilitate decoupling or separation of a lift off component from a substrate. In one embodiment, a force or tension is applied to a portion of a wafer or components coupled to the wafer. It is appreciated the force can impart various effects or have various impacts on components of the wafer during an epitaxial lift off process. The force(s) can be utilized to facilitate etchant exposure or access to an etch face. The force(s) can also be utilized to facilitate mitigation of potential detrimental impacts (e.g., cracking, breaking, etc.) associated with final separation. Many of the present described embodiments generally relate to fabrication of a variety of apparatuses (e.g., including photovoltaic devices, solar conversion devices, solar cell devices, opto-electric devices, optical devices, photonic devices, mechanical devices, semiconductor devices, electronic thin film devices, other thin film devices, etc.).

Figure 1A:
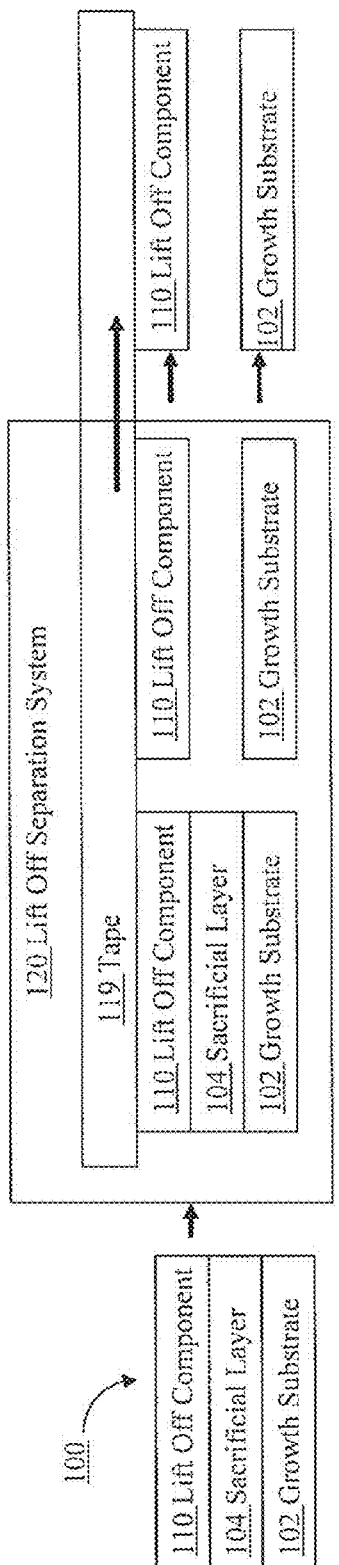
FIG. 1A is a block diagram of an exemplary lift off separation system in accordance with one embodiment of the present invention.

FIG. 1A is a block diagram of an exemplary lift off separation system 120 in accordance with one embodiment of the present invention. A portion of a wafer 100 (e.g., including an epitaxial lift off component 110 attached to growth substrate 102 by sacrificial layer 104, etc.) is forwarded to lift off separation system 120 which outputs epitaxial lift off component 110 decoupled or separated from growth substrate 102. Wafer 100 is forwarded to lift off separation system 120 and is coupled (e.g., bonded. laminated, etc.) to tape 119. The wafer 100 is transported with tape 119 though the lift off separation system 120 which etches the sacrificial layer and decouples or separates growth substrate 102 from the epitaxial lift off component 110. In one embodiment the epitaxial lift off component 110 includes a tape tensioner that engages the tape and pulls or lifts the tape away from the growth substrate 102.

During the decoupling or separation, lift off separation system 120 manipulates (e.g., bends, peels, etc.) epitaxial lift off component 110 to facilitate or assist separation of the epitaxial lift off component 110 from the growth substrate 102. In one embodiment, the manipulation (e.g., application of force(s), introduction of tension(s), etc.) is controlled to facilitate exposure of an etchant to an etch face of the sacrificial etch layer. In one exemplary implementation, the manipulation includes applying a force to increase a gap distance between portions of the lift off component 110 and growth substrate 102 prior to final separation. The manipulation can also be controlled to facilitate mitigation of adverse impacts associated with final separation of the lift off component 110 from the growth substrate 102. Additional information describing various exemplary manipulations of the lift off component during etching is set forth in following sections of the detailed description. It is appreciated that the epitaxial lift off separation component 120 can be implemented in a variety of configurations (e.g., apparatus 300, apparatus 400, apparatus 1100, apparatus 1600, etc.). In one embodiment, the epitaxial lift off component 110 includes a tape tensioner that engages the tape and pulls or lifts the tape away from the growth substrate 102.

Figure 1B:
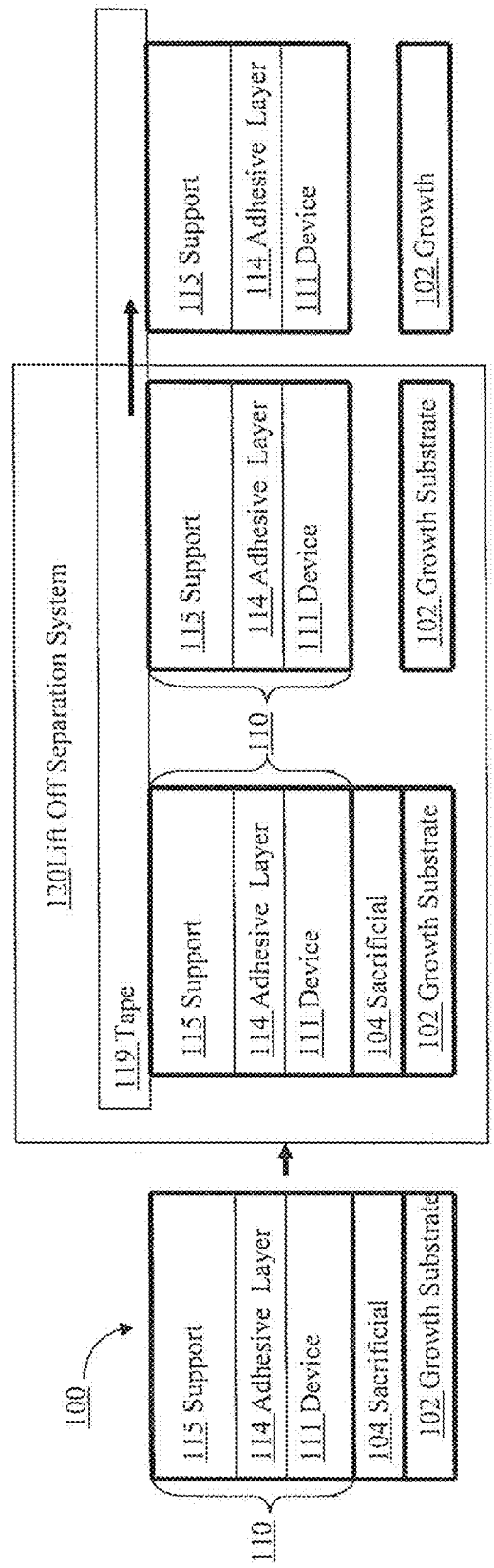
FIG. 1B is a block diagram of an exemplary epitaxial lift off component including a device structure and optional support structure in accordance with one embodiment of the present invention.

It is appreciated that epitaxial lift off component 110 can have a variety of configurations and features. Epitaxial lift off component 110 can include a variety of layers and structures. The epitaxial lift off component 110 can include portions of a thin film epitaxial lift off stack. FIG. 1B is a block diagram of an exemplary implementation of epitaxial lift off component 110 including a device structure 111 and optional support structure 115 in accordance with one embodiment of the present invention. Lift off component 110 can also include an adhesive layer or structure to assist coupling the device structure 111 to support structure 115. Device structure 111 can include various device components (e.g., active devices, passive devices, photo-electric diodes, transistors, etc.). Support structure 115 can supplement various features and characteristics of lift off component 110. Support structure 115 can supplement structural and mechanical integrity of the device structure 111 (e.g., enhance ability to avoid or withstand adverse impacts associated with cracking propagation, handling tension, bending radius, bending forces, etc.). Support structure 115 can also supplement functional operations of the device structure (e.g. reflect light towards device structure 111, conduct heat from device structure 111, conduct electricity from device structure 111, etc.). Additional information describing lift off component configurations and features is set forth in following sections of the detailed description.

FIG. 1C is a block diagram of an exemplary lift off separation system in accordance with one embodiment of the present invention. The lift off separation system includes etchant well 130 and separation assistance component 140. The components of the lift off separation system cooperatively operate to facilitate decoupling or separation of lift off component 110 from substrate 102. In one embodiment, an etchant etches away sacrificial layer 104. FIG. 1D is a block diagram of an exemplary lift off separation system as the sacrificial layer 104 is being etched away in accordance with one embodiment of the present invention. Etchant well 130 holds the etchant while separation assistance component 140 applies forces that facilitate both etchant front exposure and final separation of the lift off component 110 from substrate 102. In one embodiment, the force(s) help to gradually widen gaps 198 and 199 and allow etchant to more easily reach the etchant fronts (e.g., 188 and 189). Allowing etchant to more easily reach the etch front can facilitate a number of benefits (e.g., reducing the overall amount of etchant, expediting the separation, etc.). In one embodiment, separation assistance component 140 is included in a tape tensioner.

It is appreciated that separation assistance component 140 can include a variety of configurations (e.g., similar to components of apparatus 300, apparatus 400, apparatus 1100, apparatus 1600, etc) and can apply various forces to facilitate etchant front exposure and separation. For example, separation assistance component 140 can apply forces by pushing, pulling and combinations of pushing and pulling. In one embodiment the, forces are applied by components or members of separation assistance component 140 to tape 119 which in turn impacts the lift off component 110. In one embodiment, component or member 148 and 149 exert an upward force on portions of tape 119 while component or member 147 exerts a downward force on another portion of tape 119. In one exemplary implementation, the upward forces cause tape 119 to "pull" or "peel" outer edge portions of lift off component 110 up to create a wider gap 198 and 199 while the downward force exerted by component or member 147 helps hold a portion of lift off component 110 from adversely "snapping" off from remaining portions of sacrificial layer 104. In one exemplary implementation, member 147 allowing for a more gradual and regulated final separation. It also is appreciated that etchant well 130 can include a variety of configurations for holding the etchant and substrates (e.g., similar to components of apparatus 300, apparatus 400, apparatus 1100, apparatus 1600, etc).

Figure 1E:
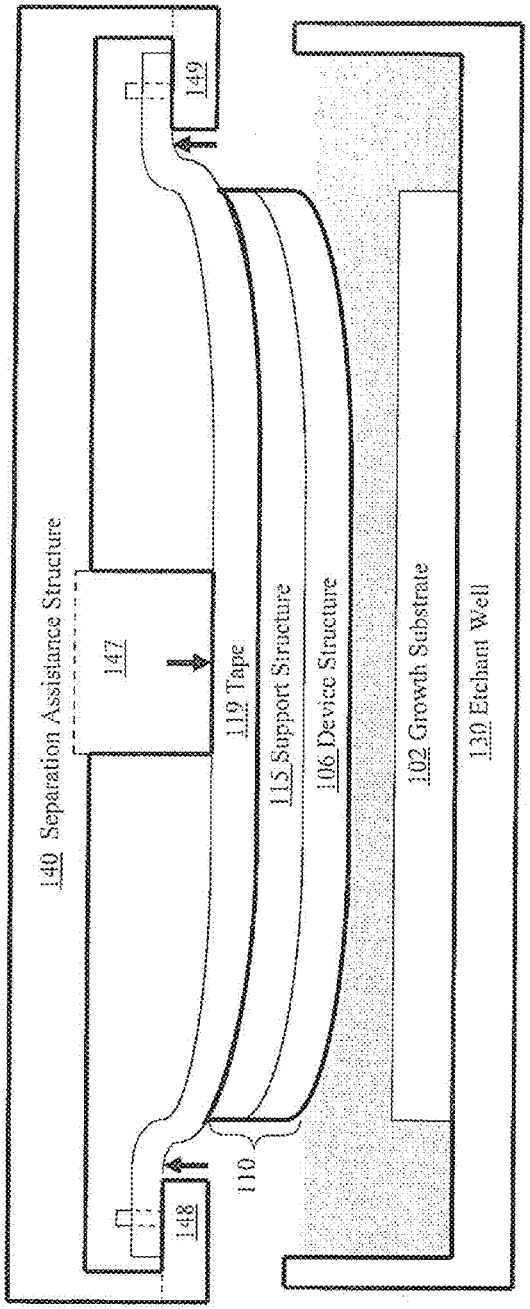
FIG. 1E is a block diagram of an exemplary lift off separation system after a sacrificial layer is etched away in accordance with one embodiment of the present invention.
Figure 1F:
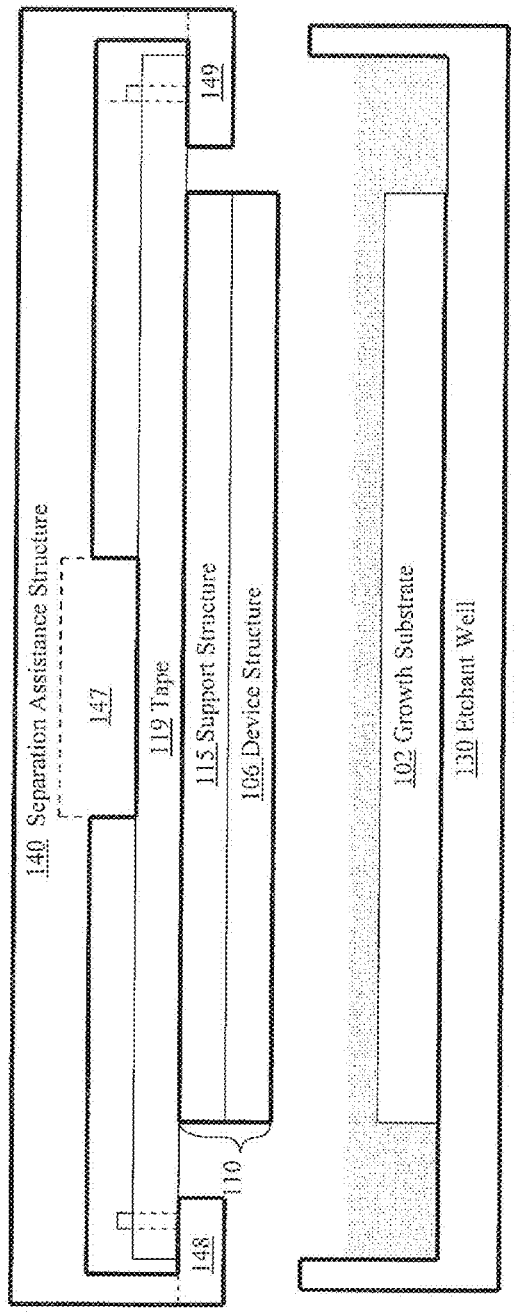
FIG. 1F is a block diagram of an exemplary lift off separation system "separated" and "un-bent" configuration for a lift off component in accordance with one embodiment of the present invention.

FIG. 1E is a block diagram of an exemplary lift off separation system after sacrificial layer 104 is etched away in accordance with one embodiment of the present invention. In one embodiment, the components or members 148 and 149 stop "actively" applying a dynamic force to the tape 119 and the previously downward force exerted by component of member 147 is gradually decreased. The force(s) exerted by separation component 140 can be controlled to facilitate progression to an exemplary "separated" "un-bent" configuration for lift off component 110 as shown in FIG. 1F in accordance with one embodiment of the present invention.

Figure 2D:
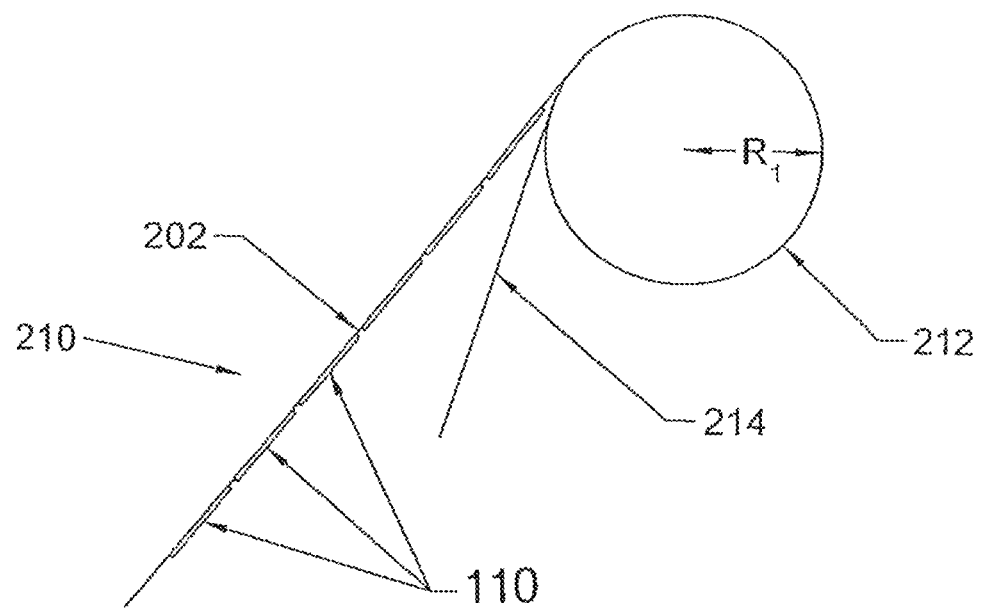
FIG. 2D is a side view of the assembly of FIG. 2C being wound on a support roll, according to embodiments of the invention.

FIGS. 2A through 2F depict various aspects of transferring the lift off component 110 (e.g., epitaxial material, etc.) from the substrate 102 to a tape on a roll, according to embodiments of the invention. FIG. 2A is a side view and FIG. 2B is a bottom view of an assembly 200 that includes a plurality (six shown) of the wafers (e.g., similar to a wafer shown in FIGS. 1A and 1B) attached to a tape 202. Each of the wafers can include a sacrificial layer 104 disposed on or over a substrate 102 and an epitaxial material layer or lift off component 110 disposed on or over the sacrificial layer 104. Above epitaxial material layers or lift off component 110, adhesive layers 204 may be included to adhere the wafers to the tape 202. The adhesive layer 204 can include a variety of configurations and features. The adhesive layers 204 may be made of a pressure sensitive adhesive, a hot melt adhesive, an ultraviolet (UV) curing adhesive, a natural adhesive, a synthetic adhesive, derivatives thereof, or combinations thereof. In one embodiment the material of the adhesive layers 204 is resistant to the etchant used in the etchant process as described below.

In one embodiment, the tape 202 is an elongated thin strip of material, similar in structure to photographic film. The material of tape 202, in some embodiments, includes plastic or polymeric materials. The tape 202 may have a width $W_1$ that is between about 10 mm and about 1000 mm, in one embodiment. In one embodiment, the overall length (not shown) of the tape 202 corresponds to the size of the storage rolls or reels that the tape 202 is wound upon. In one embodiment, the length of the tape 202 is between about 1 m and about 1000 m. Each wafer may have a length $L_1$ in the longitudinal direction of the tape 202 and a width $W_2$, traverse to the tape 202. In one embodiment, $L_1$ is between about 8 mm and about 950 mm, while $W_2$ is between about 8 mm and about 950 mm. The substrates 100, in one embodiment, are substantially centered on the tape, and spaced approximately a distance $D_1$ from each other. In one embodiment, $D_1$ is between about 2 mm and about 20 mm.

The tape 202 may optionally include openings 206 along the sides of the tape 202 for engagement by drive elements and tensioning elements as described below with respect to various embodiments of the apparatus of the invention. In addition, the tape 202 may include regularly spaced slots 208, in some embodiments, to provide a greater degree of flexibility in the transverse direction, as required. The slots 208 are generally centered between two adjacent substrates or wafers 100, and in one embodiment have a width $W_3$ that is between about 0.5 mm and about 2 mm. In one embodiment, the slots 208 are located between substrates or wafers 100 such that between about 2 substrates and about 5 substrates are between adjacent slots 208. Further, in some embodiments, the slots 208 extend between about 25% and about 90% to the center of the tape 202. For example, for tapes having a width $W_1$ of about 20 mm, and slots 208 that extend for about 7 mm each, then each slot 208 would extend about 70% to the center of the tape 202, leaving a connecting edge of about 6 mm between the slots 208. Also, in some embodiments, the tape 202 may include indexing holes 203 located between adjacent substrates 100, for handling purposes, as is more fully described below.

In FIG. 2C, a side view of an assembly 210 is shown that includes a plurality (six shown) of the epitaxial material layers or lift off components 110 of FIG. 2A, attached to the tape substrate 202 by the adhesive layers 204. In some embodiments, the assembly 210 is formed by exposing the sacrificial layer 104 in the assembly 200 of FIGS. 2A and 2B to a wet etch solution during an ELO etching process. In some examples, the wet etch solution contains hydrofluoric acid and may contain a surfactant, a buffer, a corrosion inhibitor, combinations thereof, etc. It is appreciated that various etch rates (e.g., for etching the sacrificial layer, etc.) can be achieved (e.g., sacrificial layer 104 may be etched at a rate of about 0.3 mm/hr, at about 5 mm/hr, at about 10 mm/hr at about 50 mm/hr, at rates between these values, at rates greater than 50 mm/hr, etc.) utilizing a present support structure to facilitate control of the etch rate.

It is appreciated that various etching processes can be utilized. In an alternative embodiment, sacrificial layer 104 may be exposed to an electrochemical etch during the ELO etching process. The electrochemical etch may be a biased process or a galvanic process. Also, sacrificial layer 104 may be exposed to a vapor phase etch during the ELO etching process in another embodiment described herein. The vapor phase etch includes exposing sacrificial layer 104 to hydrogen fluoride vapor. The ELO etching process may be a photochemical etch, a thermally enhanced etch, a plasma enhanced etch, a stress enhanced etch, derivatives thereof, or combinations thereof.

Figure 2E:
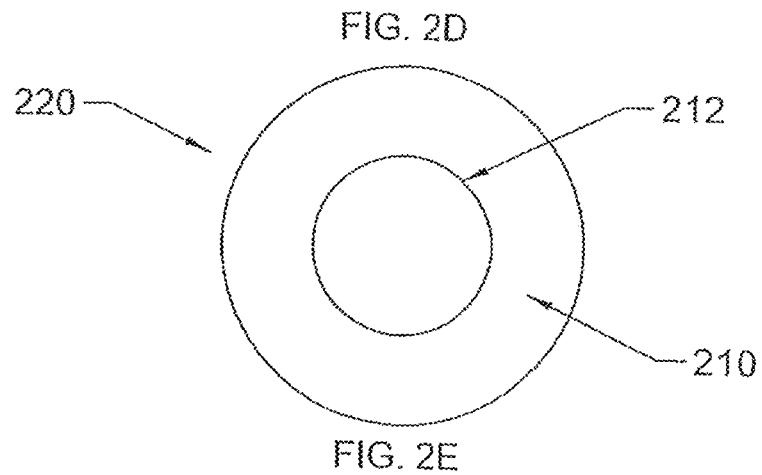
FIG. 2E is a side view of an assembly including the assembly of FIG. 2C wound on a support roll, according to embodiments of the invention.

In FIG. 2E a side view is shown of the assembly 210 of FIG. 2D being wound on a support roll or reel 212. The assembly 210 includes the tape 202 with a plurality of epitaxial material layers or lift off components 110 attached or adhered thereto as described above. The assembly 210 is shown being wound around roll 212 with the epitaxial material layers 110 attached to the bottom of the tape 202 such that the epitaxial material layers 110 are faced toward the surface of the roll 212. In an alternate embodiment, the epitaxial material layers 110 may be above the tape 202 such that the epitaxial material layers 110 are faced away from the surface of the roll 212. A protective film or sheet 214 may be provided to protect the epitaxial material layers 110 from adjacent surfaces. The roll 212 has a minimum (unloaded) radius of $R_1$. In one embodiment, the radius $R_1$ of the roll 212 is between about 10 cm to about 100 cm. The radius $R_1$ of the roll 212, is an important design consideration, as the epitaxial material layers 110 may be cracked or otherwise damaged if they are subjected to a radius of curvature that is too small. Thus the radius $R_1$ of the roll 212 is chosen based on the structural limitations of the epitaxial material layers or lift off component 110 and to prevent cracking and other damage. Once the roll 212 is loaded with an appropriate length of assembly 210, as shown in FIG. 2E, a large number of epitaxial material layers 110 may be handled, transported, or loaded into subsequent processing apparatus as an assembly 220.

In one embodiment, an epitaxial lift off system includes a wafer receiving stage wherein the wafer includes a substrate, a sacrificial etch layer and epitaxial lift off component; a tape coupling application stage, wherein the epitaxial lift off component is coupled to a tape; an etching stage wherein the lift off component is manipulated to assist etchant exposure to an etch face of the sacrificial etch layer and aid separation of the epitaxial lift off component from the substrate. The epitaxial liftoff system can also include, a clean and rinse stage wherein the epitaxial lift off component and the tape are cleaned and rinsed. In one embodiment, there is a tape receiving stage configure to receive the tape and the tape is prepared for participating in further portions of the epitaxial lift off.

Figure 3A:
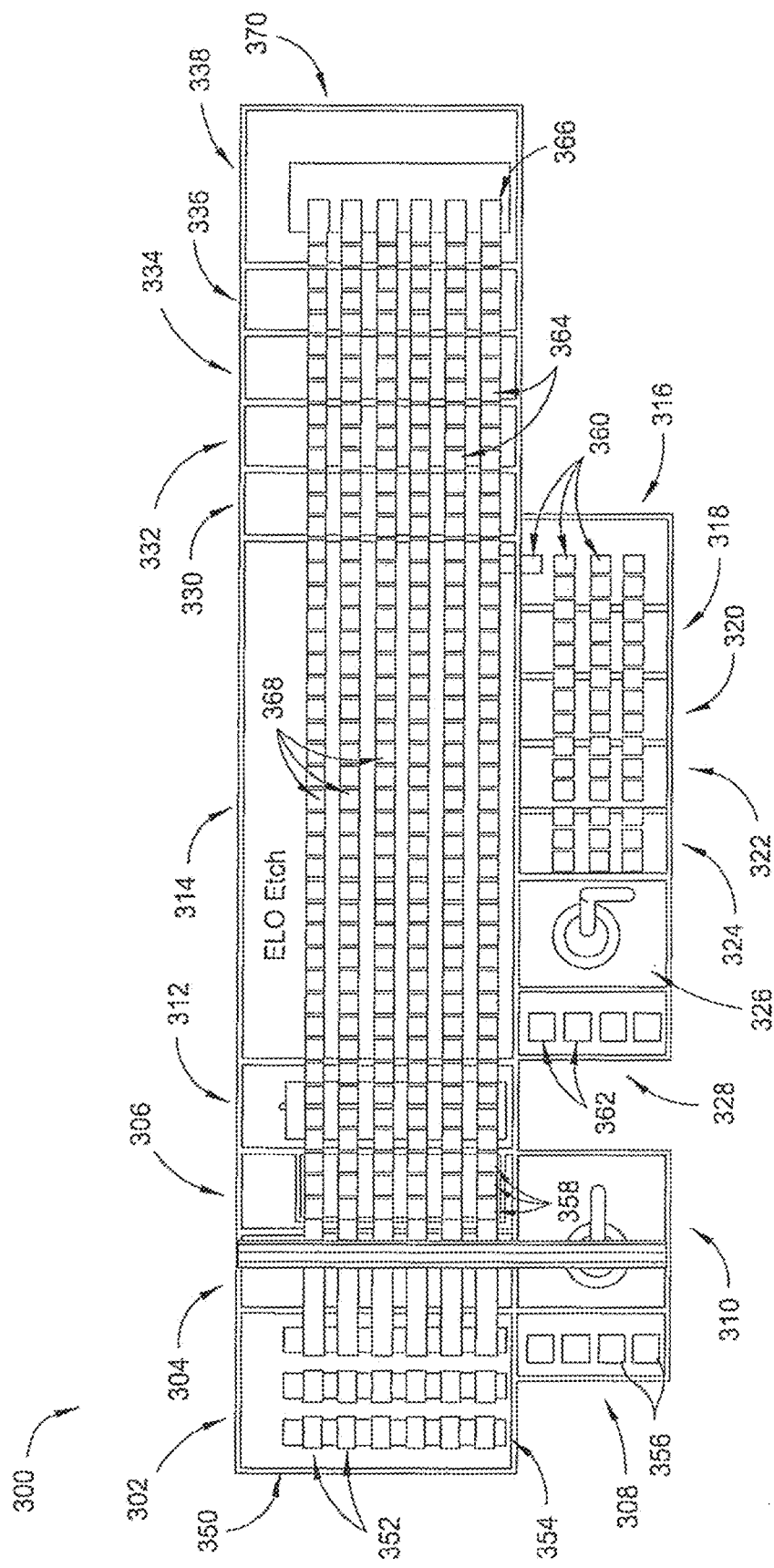
FIG. 3A is a schematic plan view of one embodiment of an apparatus for forming tape based ELO materials and devices in accordance with one embodiment of the present invention.

FIG. 3A is a schematic plan view of one embodiment of an apparatus 300 that is useful for performing a method of forming tape based ELO products. In one embodiment, apparatus 300 is included in a lift off separation system. At a first end 350 of the apparatus 300, a first section 302 includes one or more reels or rolls 354 containing one or more blank or unloaded tapes 352. While six parallel tapes 352 are shown, it is appreciated that there may be more or less number of tapes 352 loaded on one or more rolls 354. In step 2302 of method 2300, the unloaded tapes 352 are unwound from the roll 354, and the unloaded tapes 352 are fed from the roll 354 into a splice/punch section 304. In step 2304 and in one exemplary implementation of the splice/punch section 304, the unloaded tapes 352 are cut, punched, or a combination of cut and punched to form openings in the tape for handling and other purposes. In one embodiment, the openings formed in the tapes 352 during splice/punch section 304 include openings and slots (e.g., openings 206 and the slots 208 as shown in FIG. 2B, etc.). In another other embodiment, the splice/punch section 304 may be omitted from apparatus 300 (e.g., the tape is forwarded without openings and slots in the tape, openings can be punched in a separate operation outside of apparatus 300 or before the tape is rolled unto rolls 354, etc.).

In step 2306 of method 2300, wafers are laminated onto the unloaded tapes. As shown in FIG. 3A, after the splice/punch section 304 (when provided) the unloaded tapes 352 enter a lamination section 306. The lamination section 306, receives wafers 356 from a wafer input section 308. In one embodiment, a robot 310 may be used to load the wafers 356 into the lamination section 306. In one embodiment, the wafer 356 is similar to the wafer in FIG. 1A prior to entering lift off separation system 120. In the lamination section 306, the wafers are coupled (e.g., attached, adhered, bonded, etc.) to the respective tapes 352, as shown by wafers 358 coupled (e.g., attached, bonded, etc.) to the wafer loaded tapes 368. It is appreciated wafers 358 can be coupled to the bottom of tapes 368. In one embodiment, the wafer loaded tapes 368 are similar in structure to the assembly as shown in FIGS. 2A and 2B. In one embodiment, the adhesive 204 is pre-laminated to the tapes 352 of approximately the same size as the wafer 358 and a liner is rewound from the tape before lamination. In another embodiment, the adhesive 204 is applied to the tape prior to the splice/punch section 304.

Figure 23:
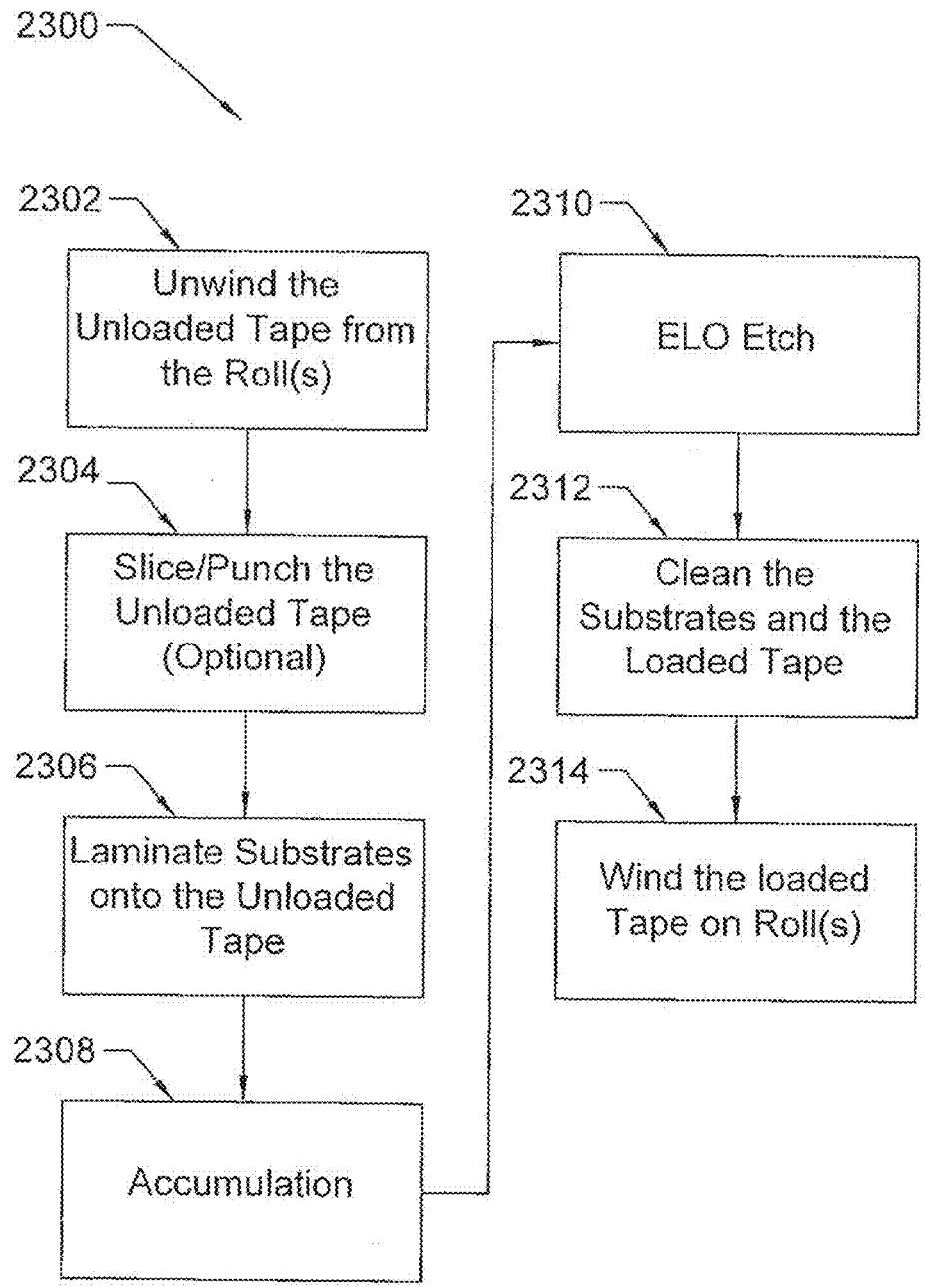
FIG. 23 is a flow chart illustrating one embodiment of a method for forming ELO products that may be performed by the apparatus of FIG. 3A.
Figure 24:
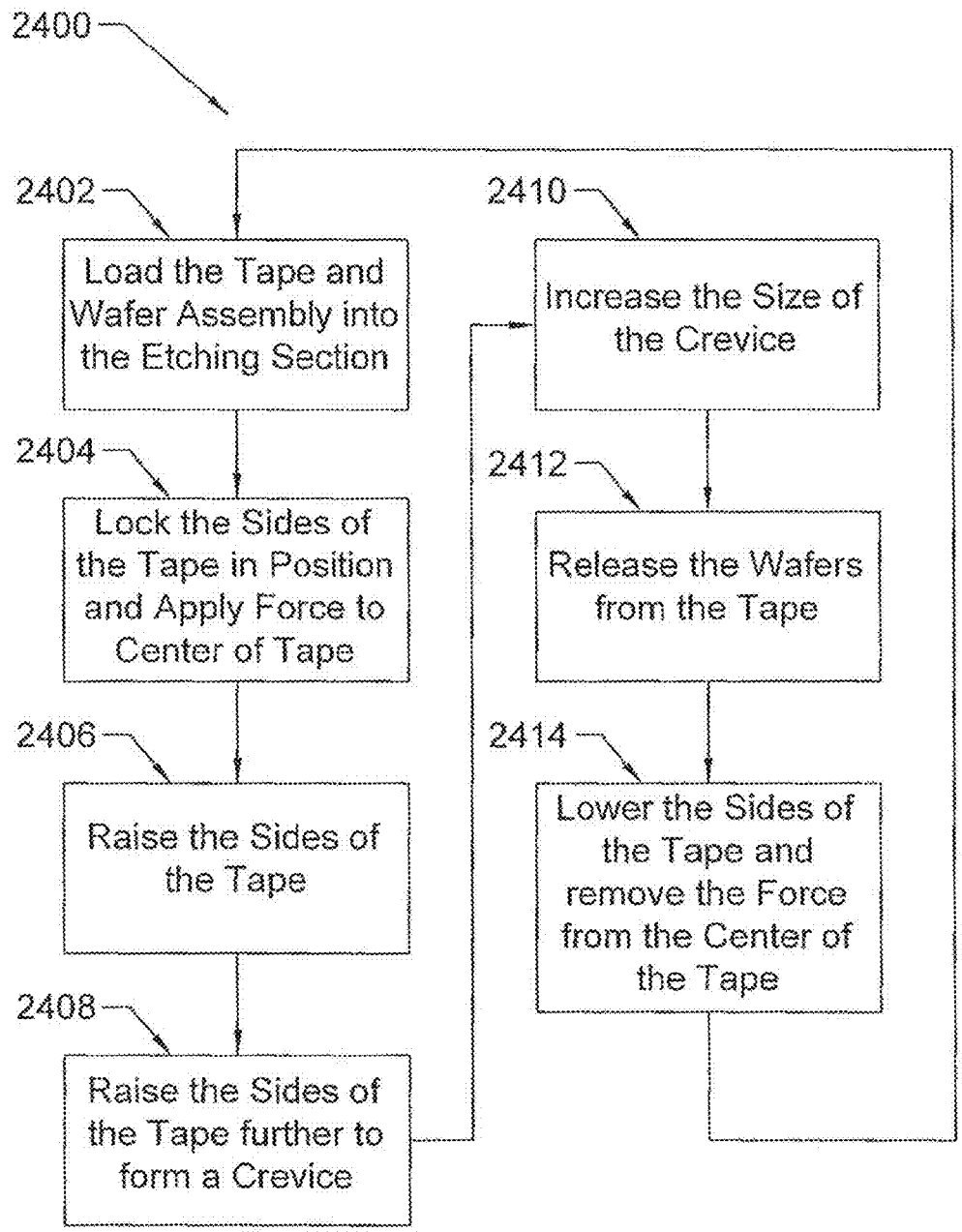
FIG. 24 is a flow chart illustrating one embodiment of a batch ELO method that may be performed by the apparatus of FIGS. 11-15E.

In one embodiment, the loaded tapes 368 enter an accumulation section 312 after leaving the lamination section 306 and the loaded tapes 368 are accumulated prior to entering the ELO etch section 314, as illustrated by step 2308 of method 2300 in FIG. 23. Accumulation section 312 can facilitate mitigation of potential timing issues or problems. Accumulation section 312 can be utilized when the lamination time and the ELO etch process are asynchronous (e.g., when the lamination process is performed step-wise, and the ELO etch process is continuous, etc).

After the accumulation section 312, the substrate loaded tapes 368 enter an ELO etch section 314. In the ELO etch section 314, the sacrificial layer (e.g., example layer 104 in FIGS. 1A and 1B, etc.), is etched to remove the sacrificial layer and decouple or separate the substrate from the wafer loaded tapes 368, in step 2310 of method 2300. The resulting ELO lift off component loaded tapes 364, proceed to tape post etch processing sections, while the unloaded or separated substrates 360 proceed to substrate post etch processing sections, in step 2312 of method 2300. The separated or unloaded substrates 360 enter a conveyor loading section 316, where the unloaded substrates 360 are placed on a conveyor, for example, by a robot (not shown).

In one embodiment, the substrate post etch processing sections include a first substrate rinsing section 318, a substrate cleaning section 320, a second substrate rinsing section 322 and a substrate drying section 324. In one embodiment, the substrate post etch processing sections prepare the substrates to be reused (e.g., in an epitaxial growth process, in a present ELO lift off process, etc.) by removing contaminates from the substrates. In another embodiment, the substrate cleaning process has a series of more than one cleaning sections and rinsing sections not shown before the final drying section 324. A robot 326 can be utilized to unload the substrates from the substrate drying section 324 to a substrate output section 328. The substrates 362 in the substrate output section 328, are ready in one embodiment to have an optional surface treatment followed by sacrificial and epitaxial material layers redeposited thereon. In one embodiment, a conveyor (not shown) may redirect the substrates 362 to a deposition chamber or process. After sacrificial and epitaxial material layers are deposited on the substrates, the resulting wafers (e.g., including the substrates, etc.) may be further conveyed to substrate input section 308 as wafers 356, to be reused in the process. In this manner, the relatively expensive substrates may be used multiple times to grow epitaxial layers.

After removal of the sacrificial layer and the substrate in from the ELO lift off component loaded tapes 368 proceed to tape post etch processing sections. In one embodiment, the tape post etch processing sections include a first tape rinsing section 330, a tape cleaning section 332, a second tape rinsing section 334 and a tape drying section 336. In another embodiment, the tape cleaning process has a series of more than one cleaning section(s) and rinsing section(s) not shown before the final drying section 336. In further embodiments, a large length of tape is loaded into a single tank which is sequentially filled and drained with cleaning chemical and rinse water, followed by a final dry. In one embodiment, the ELO lift off component loaded tapes are similar to the assembly 210 as shown in FIG. 2C. The tape post etch processing sections are designed to clean and dry the ELO loaded tapes 364 to remove contaminates from the tape and epitaxial material loaded thereon. While the plurality of tapes are shown in a horizontal plane, it is appreciated that a plurality of tapes and epitaxial lift off sections could also be configured in a vertical plane.

After the ELO loaded tapes 364 have been cleaned and dried, they proceed to a tape winding section 338 located at a second end 370 of the apparatus 300. In the tape winding section 338 the ELO lift off component loaded tapes 364 are wound onto one or more reels or rolls 366, such as shown in FIG. 2D and in step 2314 of method 2300. Once the roll 366 is fully loaded, the loaded roll is removed from the tape winding section 338 and is replaced by an empty roll ready to receive ELO lift off component loaded tapes.

Figure 3B:
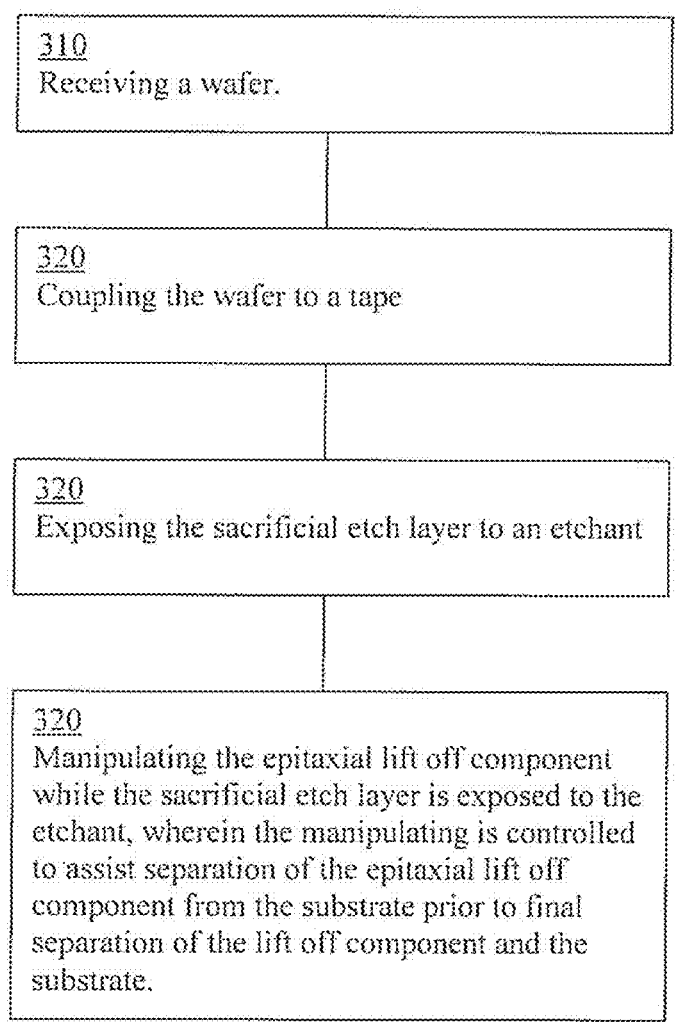
FIG. 3B is a flow chart of an exemplary epitaxial lift off method in accordance with one embodiment of the present invention.

FIG. 3B is a flow chart of epitaxial lift off method 300 in accordance with one embodiment of the present invention. In block 310 a wafer is received. The wafer includes a substrate, a sacrificial etch layer and an epitaxial lift off component. In block 320, the wafer is coupled to a tape. In block 330, the sacrificial layer is exposed to an etchant. In block 340, the epitaxial lift off component is manipulated while the sacrificial layer is exposed to the etchant, wherein the manipulating is controlled to assist separation of the epitaxial lift off component from the substrate prior to final separation of the lift off component and the substrate. In one embodiment, the manipulation is controlled to facilitate exposure of the etchant to an etch face of the sacrificial etch layer. The manipulation can also be controlled to facilitate mitigation of adverse impacts associated with cracking. In one exemplary implementation, the manipulation is controlled to facilitate mitigation of adverse impacts associated with final separation of the epitaxial lift off component from the substrate. In one embodiment, the manipulating includes causing a force to be applied to a portion of the epitaxial lift off component, wherein the force facilitates widening of a gap between the epitaxial lift off component and the substrate.

Figure 4:
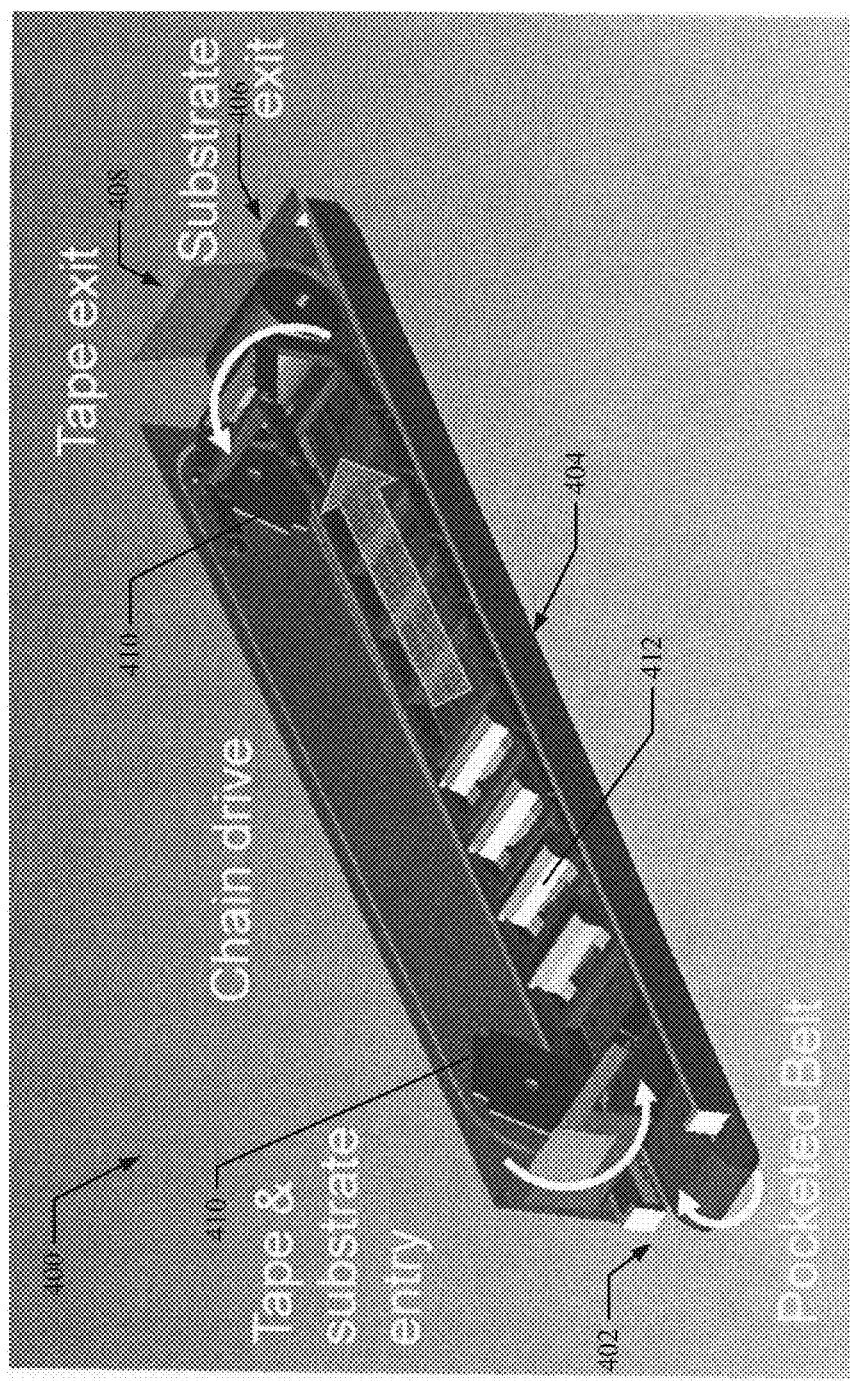
FIG. 4 is a schematic isometric view of one embodiment of an apparatus for performing a continuous ELO process to remove ELO stacks from support substrates.
Figure 5:
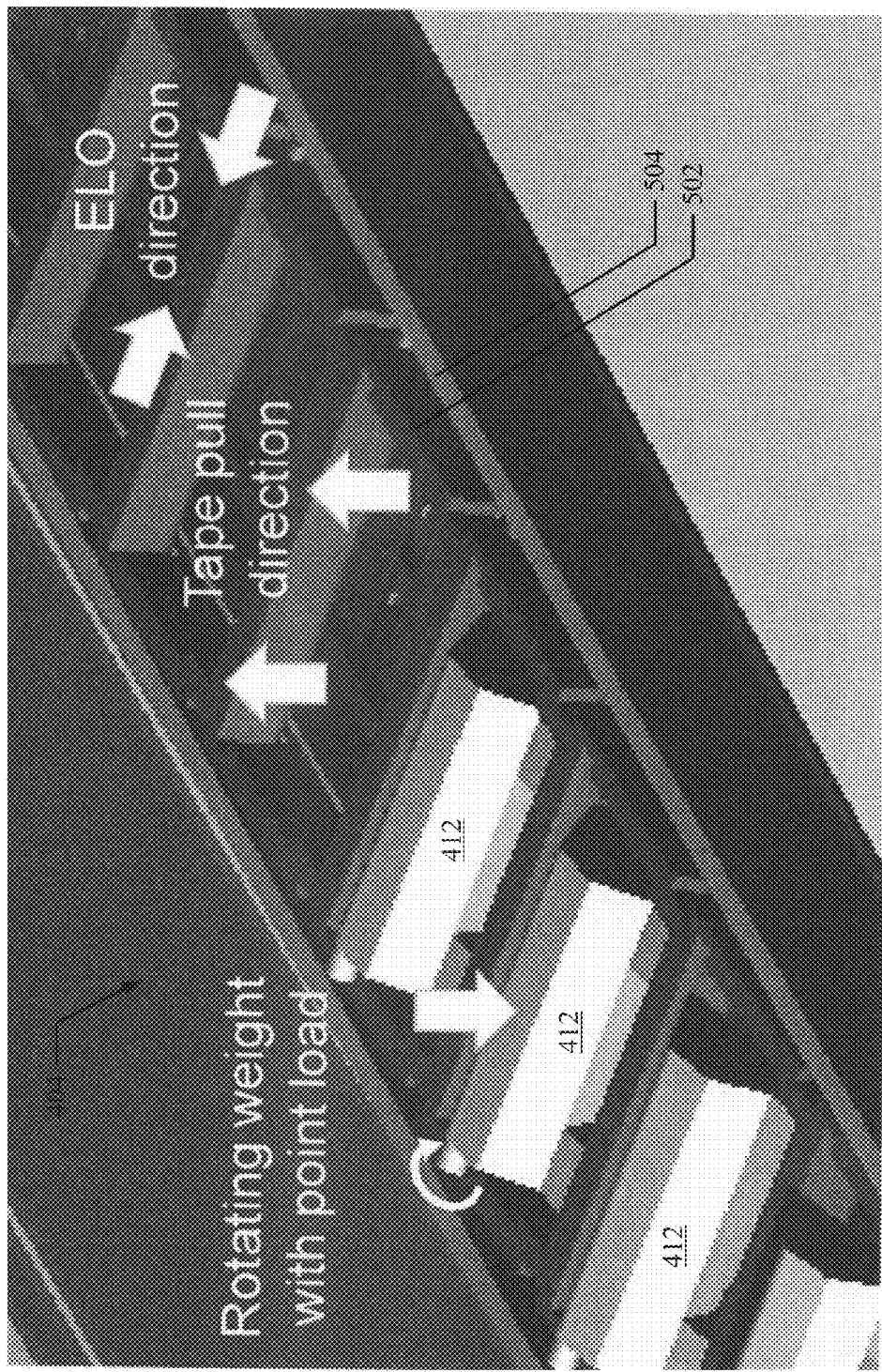
FIG. 5 is an enlarged overhead isometric view of the chain drive and tensioning portion of the apparatus of FIG. 4.
Figure 6:
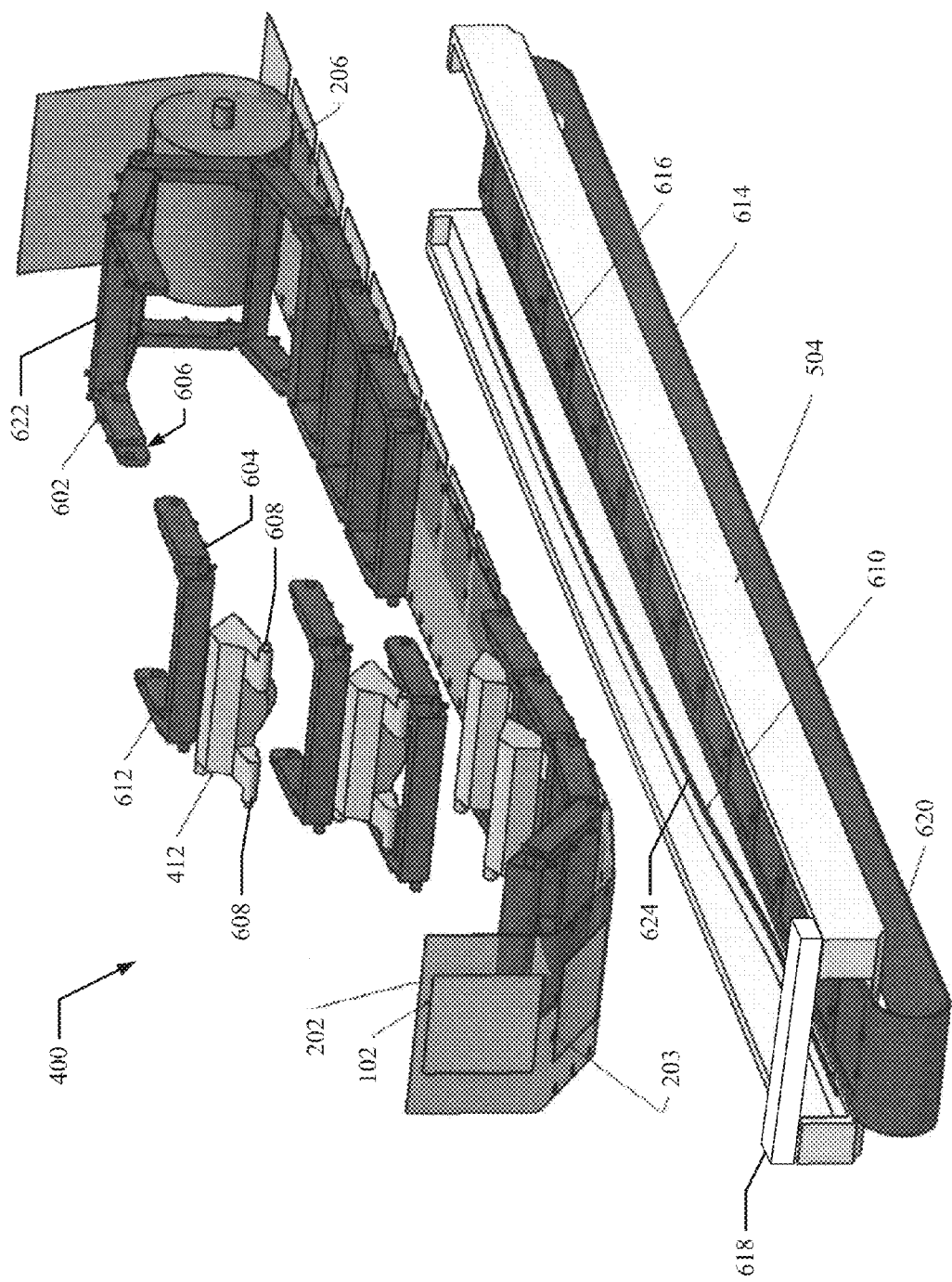
FIG. 6 is an exploded isometric view of the apparatus of FIG. 4.

FIGS. 4 through 6 depict an exemplary belt and chain apparatus 400 utilized in performing etching to decouple or separate lift off components from substrates in accordance with one embodiment. In one embodiment, the process is considered a continuous ELO etch process (e.g., tape and epitaxial layers are continuously removed from the substrates as they proceed through a portion of the etching section, etc). It should be understood that portions of the apparatus 400 have been removed in FIGS. 4-6, for clarity. FIG. 4 is a block diagram overhead view of exemplary belt and chain apparatus 400 in accordance with one embodiment of the present invention. The apparatus 400 includes a tape and substrate loading section 402, an etching section 404, drive pulleys 410, rotatable point load 412, a substrate unload section 406 and a tape unload section 408. FIG. 5 shows a closer overhead view of a portion of exemplary etching section 404 including the chain drive 502 and guide rails 504 of the apparatus 400.

FIG. 6 is a component view block diagram of portions of exemplary belt and chain apparatus 400 in accordance with one embodiment of the present invention. The tape 202 includes a plurality of openings or slots 206 along its sides, similar to those shown in FIG. 2B. The chain drive 502 includes a plurality of drive pins 602 that engage the tape 202 in the slots 206. The chain drive 502 drives the tape through the etching section 404, while also maintaining the lateral position of the sides of the tape 202 by engaging the outside portion of the slots 206, as discussed in detail below. The chain drive 502 is driven by drive pulleys 410 which in turn are driven by drive shafts and a motor (not shown). Chain drive 502 also includes a plurality of cross members 506 that include pins 604 that engage holes 606 to connect the links 612 of the chain drive 502 together. Each link 612 of the chain drive 502 includes a rotatable point load 412. Each point load 412, includes pins 608 that engage holes (not shown) in the links 612 of the chain drive 502. The point loads 412 rotate about pins 608 and apply pressure to the substrates 102, as described in greater detail below. The point loads 412 may apply the pressure to the substrates 102 by their weight alone, or they may be acted upon by a cam (not shown). The guide rails 504 each include a drive link ramp 624 having an elongated slot 610 formed therein. The pins 602 engage in the elongated slots 610 to thereby positively lock the pins 602 into the slots 206 of the tape 202. The drive link ramps 624 each have an increasing height from the tape and substrate loading section 402 through the etching section 404, for tensioning the tape as is further described below.

Below the chain drive 502, the apparatus 400 includes a substrate support in the form of a substrate handling belt 614. The belt 614 includes a plurality of substrate pockets 616 similar to substrate pocket 1306 in FIG. 13. The substrate pockets 616 are sized to receive one substrate 102 each. The substrate pockets 616 are filled with etchant by an etchant delivery device 618, that sprays or drips etchant into the substrate pockets 616. The etchant delivery device 618 is provided etchant by a pump (not shown) that pumps etchant from an etchant sump (not shown) in the bottom of apparatus 400. The substrate handling belt 614 also includes a plurality of indexing pins 620 located on each side of each substrate pocket 616. The indexing pins 620 engage indexing holes 203 in tape 202 to thereby maintain the substrates 102 in the substrate pockets 616. The cross members 506 of the chain drive 502 may include blind bores 622 (one shown in FIG. 6), for receiving indexing pins 620 to further lock pins 620 into indexing holes 203. The substrate handling belt 614 and is mounted on at least two belt rollers (see FIG. 10 below). The operation of apparatus 400 is described below with respect to FIG. 10 and FIGS. 10A-10G.

Figure 7:
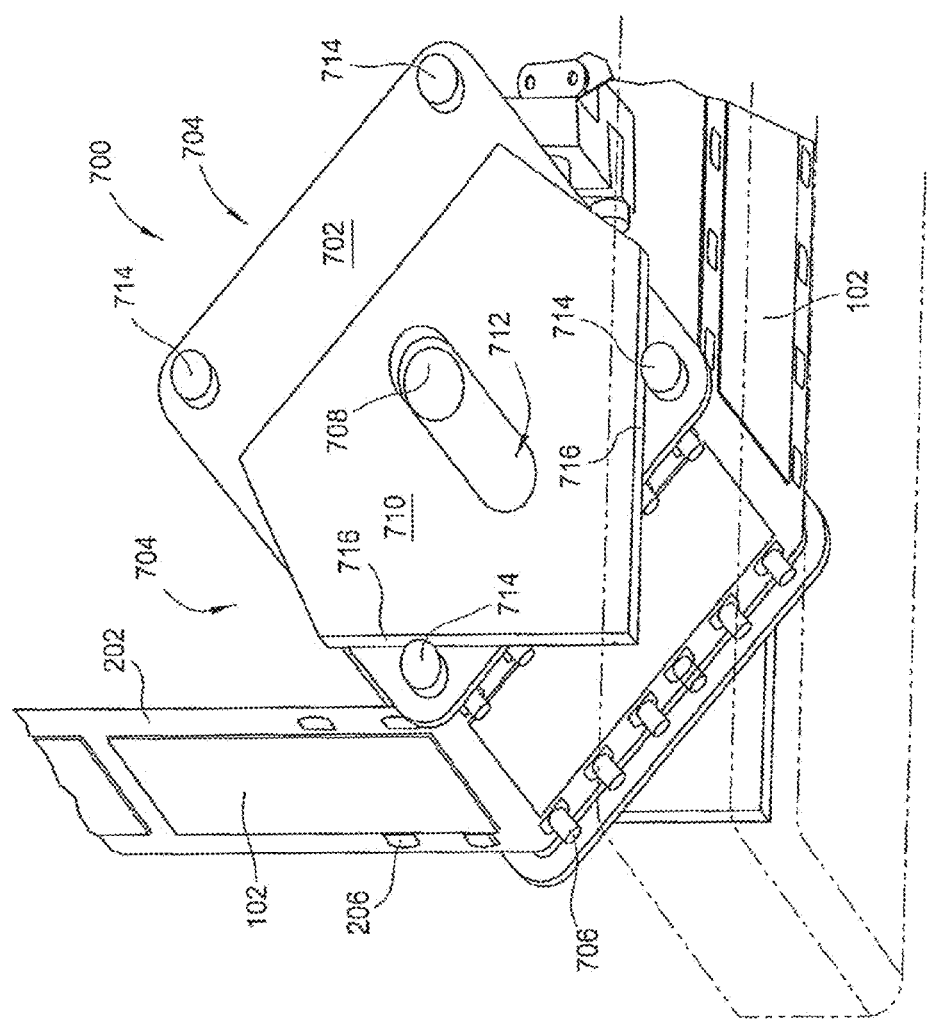
FIG. 7 is an isometric view of a tape and substrate tank entry assembly for use with embodiments of the ELO process apparatus of the invention.

FIG. 7 is an isometric view of one embodiment of a tape and substrate tank entry assembly 700 for use in the tape and substrate loading section 402, (see FIG. 4), of various embodiments of the ELO process apparatus of the invention. The tape and substrate tank entry assembly 700, includes a tape and substrate guiding block 702. While in this embodiment, the tape and substrate guiding block 702 has four tape engaging sides 704, other numbers of sides may be used. Each tape engaging side 704 includes a plurality of pins 706 for engaging the slots 206 in the tape 202. The tape and substrate guiding block 702 rotates about a shaft (not shown) that extends through a centrally located hole 708. A shaft support plate 710 is provided on opposite sides of the tape and substrate guiding block 702, for supporting and guiding the shaft. A slot 712 is provided in each shaft support plate 710, and allows the shaft to oscillate as the tape and substrate guiding block 702 rotates. The tape and substrate guiding block 702 includes guiding pins 714 on each corner of the sides through which the hole 708 extends. The guiding pins 714 engage sides 716 of the shaft support plates 710, so that each corner of the substrate guiding block 702 travels substantially vertically down into the etch bath, before traveling horizontally. The combined interaction of these elements, provides a planar support for each substrate 102 on a side 704 of the substrate guiding block 702 to decrease the likelihood that the tape 202 is torn or otherwise removed from the substrates 102 prior to entering the etch bath 404. By supporting the substrates 102 in this fashion, the chance of the ELO stack being damaged is reduced as the tape and substrate assembly enters the etch bath 404.

Figure 8:
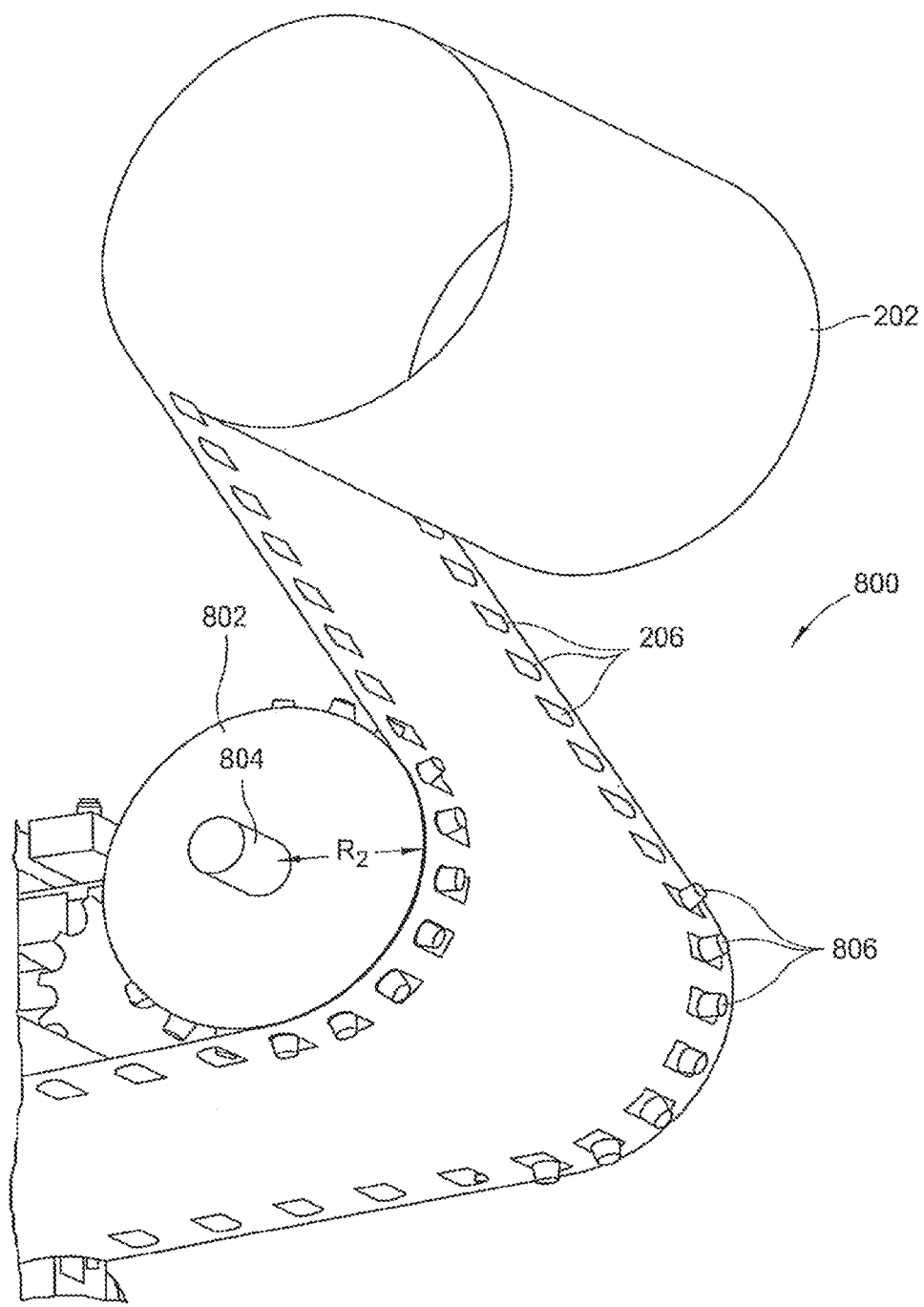
FIG. 8 is an isometric view of a tape extraction assembly for use with embodiments of the ELO process apparatus of the invention.

In FIG. 8, an embodiment of a tape extraction assembly 800 is shown for use in the tape unload section 408 of the various ELO process apparatuses. The tape 202 includes the ELO stacks (not shown) that have been removed from the substrates 102 in the etch bath 404 as previously described. The tape extraction assembly 800 includes a tape engaging drum or roller 802 that rotates about a support shaft 804. The drum 802 includes a plurality of pins 806 that engage the slots 206 in the tape 202. The radius $R_2$ of the drum 802 is of a sufficient size to avoid damaging the ELO stacks on the tape 202, as described above with respect to $R_1$ of FIG. 2D. In one embodiment, after disengaging from the drum 802, the tape 202 with the ELO stacks thereon, proceeds to the tape post etch processing sections of apparatus 300 as described above.

In some cases, the substrates 102 may not be fully removed from the tape 102 in the etch bath, due to multiple processing variables. FIG. 9 depicts a positive substrate detachment assembly 900, which may be used with the various embodiments of the ELO process apparatuses. The positive substrate detachment assembly 900 includes a substrate engaging bar 902 that contacts the leading edge 904 of any substrates 102 remaining on the tape 202 once the tape 202 reaches the drum 802. As the tape 202 is driven around the drum 802 by pins 806, the substrate engaging bar 902 peels the substrate 102 from the tape 202. While this action may damage the ELO stack 110 associated with the substrate 102, the positive substrate detachment assembly 900 avoids tearing of the tape requiring manual intervention by technicians, thereby decreasing downtime and increasing product throughput.

FIG. 10 is a side view of apparatus 400 as shown in FIGS. 4-6. Portions of the apparatus 400 have been omitted from FIG. 10 for clarity. In addition to the features of apparatus 400 that are common to FIGS. 4-6, FIG. 10 also shows two belt rollers 1002 for operating on (e.g., supporting, driving, etc.) substrate handling belt 614, although additional rollers may be provided intermediate the two belt rollers 1002 shown in FIG. 10. The belt rollers 1002 may be driven by a drive system including a motor (not shown), that is synchronized to drive the substrate handling belt 614 at the same speed as drive chain 502. Alternatively, the belt rollers 1002 may be freewheeling, and substrate handling belt 614, may be driven by chain drive 502 as the blind bores 622 engage indexing pins 620 (as shown and described above with reference to FIG. 6). In the tape engaging drum or roller 802 is also shown in FIG. 10 in relation to apparatus 400.

FIG. 10A is a cross-section taken through section line 10A-10A in FIG. 10. In this portion of apparatus 400, the tape and substrate assembly is leaving the tape and substrate loading section 402 and entering the etching section 404. The point load 412 has been omitted from FIG. 10A for clarity. The drive link ramps 624 are at their lowest level, as indicated by $H_1$. The drive links 612 are above the drive link ramps 624, such that pins 602 have not entered slots 610, and the point load 412 (not shown) has not yet contacted the tape 202. The tape 202 is not yet under tension and is in a substantially planar orientation. A substrate 102 is shown positioned within a substrate pocket 616, that has been previously filled with etchant by the etchant delivery device 618 (see FIG. 6). A bed 1004 supports guide rails 504 and the substrate handling belt 614. In one embodiment a heater 1006 is mounted below the bed 1004 and heats the bed 1004, as well as the etchant in the substrate pocket 616. The etching process may be accelerated by heating the etchant.

FIG. 10B is a cross-section taken through section line 10B-10B in FIG. 10. In this portion of apparatus 400, the tape and substrate assembly has advanced further into the etching section 404. The drive links 612 are supported on the drive link ramps 624, such that pins 602 are fully engaged in the slots 610, and the point load 412 is in contact with the approximate center of the tape 202. By contacting the center of the tape 202, the point load 412 maintains the substrate 102 in the substrate pocket 616. The drive link ramps 624 have increased in height, as indicated by $H_2$. The tape 202 is coming under tension and is no longer in a planar orientation. The pins 602 extend through the drive holes 206 of the tape 202, to maintain the sides of the tape 202 in position. In this position in apparatus 400, while the tape 202 is under tension, the substrate 102 has not yet begun to be released from the tape 202.

Figure 10C:
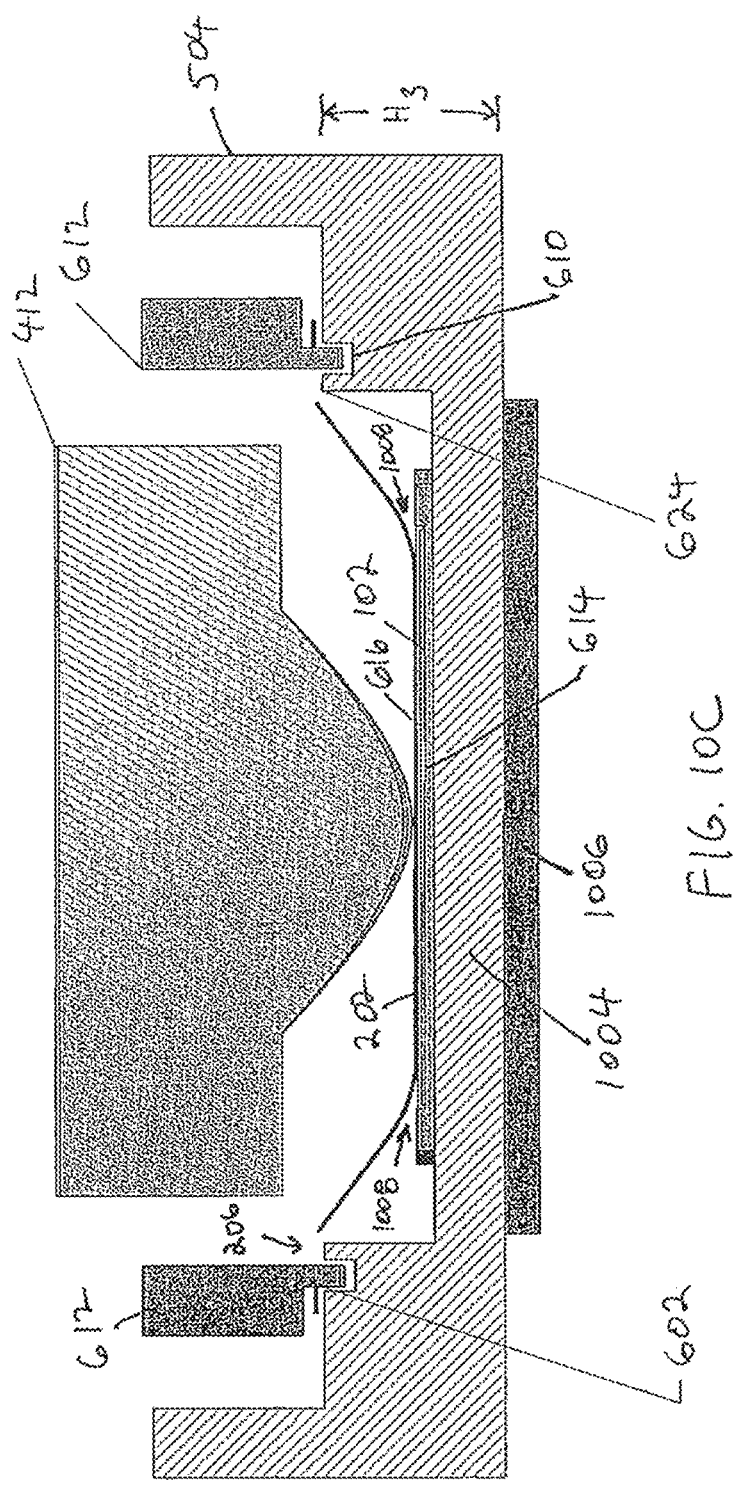

FIG. 10C is a cross-section taken through section line 10C-10C in FIG. 10. In this portion of apparatus 400, the tape and substrate assembly has advanced even further into the etching section 404. The drive links 612 are supported on the drive link ramps 624, such that pins 602 are fully engaged in the slots 610, and the point load 412 is in contact with the approximate center of the tape 202. The point load 412 continues to maintain the substrate 102 in the substrate pocket 616. The drive link ramps 624 have increased further in height, as indicated by $H_3$. The tape 202 is under increased tension as the pins 602 continue to maintain the sides of the tape 202 in position. In this position in apparatus 400, the increased tension placed on the tape 202 forms a crevice 1008 between the sides of the substrate 102 and the sides of the tape 202, such that the sides of the substrate 102 have started to be released from the tape 202.

FIG. 10D is a cross-section taken through section line 10D-10D in FIG. 10. In this portion of apparatus 400, the tape and substrate assembly has advanced yet further into the etching section 404. The drive links 612 are supported on the drive link ramps 624, such that pins 602 are fully engaged in the slots 610, and the point load 412 is in contact with the approximate center of the tape 202. The point load 412 continues to maintain the substrate 102 in the substrate pocket 616. The drive link ramps 624 have increased further in height, as indicated by $H_4$. The tape 202 is under further increased tension as the pins 602 continue to maintain the sides of the tape 202 in position. In this position in apparatus 400, the further increased tension placed on the tape 202 increases the size of the crevice 1008 between the sides of the substrate 102 and the sides of the tape 202, such that the sides of the substrate 102 are further released from the tape 202.

FIG. 10E is a cross-section taken through section line 10E-10E in FIG. 10. In this portion of apparatus 400, the tape 202 and substrate 102 have advanced further into the etching section 404. The drive links 612 are supported on the drive link ramps 624, such that pins 602 are fully engaged in the slots 610, and the point load 412 is in contact with the approximate center of the tape 202. The drive link ramps 624 have increased further in height to their maximum, as indicated by $H_5$. The pins 602 continue to maintain the sides of the tape 202 in position. In this position in apparatus 400, the substrate 102 has been completely released from the tape 202. The point load of 412 no longer applies pressure to the substrate 102. The substrate 102 may be maintained in the substrate pocket 616 by gravity.

FIG. 10F is a cross-section taken through section line 10E-10F in FIG. 10. In this portion of apparatus 400, the tape 202 and substrate 102 are beginning to exit the etching section 404. The drive links 612 are supported on the drive link ramps 624, such that pins 602 are fully engaged in the slots 610. The drive link ramps 624 have maintained their height, as indicated by $H_5$. The pins 602 continue to maintain the sides of the tape 202 in position. In this position in apparatus 400, the point load 412 is starting to retract and no longer contacts the tape 202, thereby allowing the tension in the tape 202 to decrease. In embodiments where the point loads 412 are not cam operated, but act under their weight alone, the point load may still be contacted and supported by the tape 202. The substrate 102 is maintained in the substrate pocket 616 as both exit the etching section 404.

FIG. 10G is a cross-section taken through section line 10G-10G in FIG. 10. In this portion of apparatus 400, the tape 202 and substrate 102 have exited the etching section 404. The drive links 612 have retracted such that they no longer contact the drive link ramps 624, and the pins 602 have exited the slots 610. The drive link ramps 624 have maintained their height, as indicated by $H_5$. The pins 602 are no longer needed to maintain the sides of the tape 202 in position, as the tape 202 is no longer in tension and has resumed its original planar configuration. The tape 202 proceeds to the tape unload section 408 and the substrate 102 is maintained in the substrate pocket 616 and proceeds to the substrate unload section 406.

The right-hand side of FIG. 10 illustrates how the tape 202 proceeds, in some embodiments, to tape post etch processing sections, such as those shown in FIG. 3A. The substrates 102 proceed, in some embodiments, to substrate post etch processing sections also as shown in FIG. 3A. The etchant remaining in the substrate pocket 616 may be dumped into a sump (not shown) as the substrate handling belt 614 proceeds around roller 1002 on the right-hand side of FIG. 10. In some embodiments, the etchant may proceed to an etchant processing section such as a filter, prior to being returned to the sump. In some embodiments, a sump may not be used, and fresh etchant is supplied to the substrate pockets 616. In these embodiments, the used etchant may be collected for cleaning or disposal.

Figure 11:
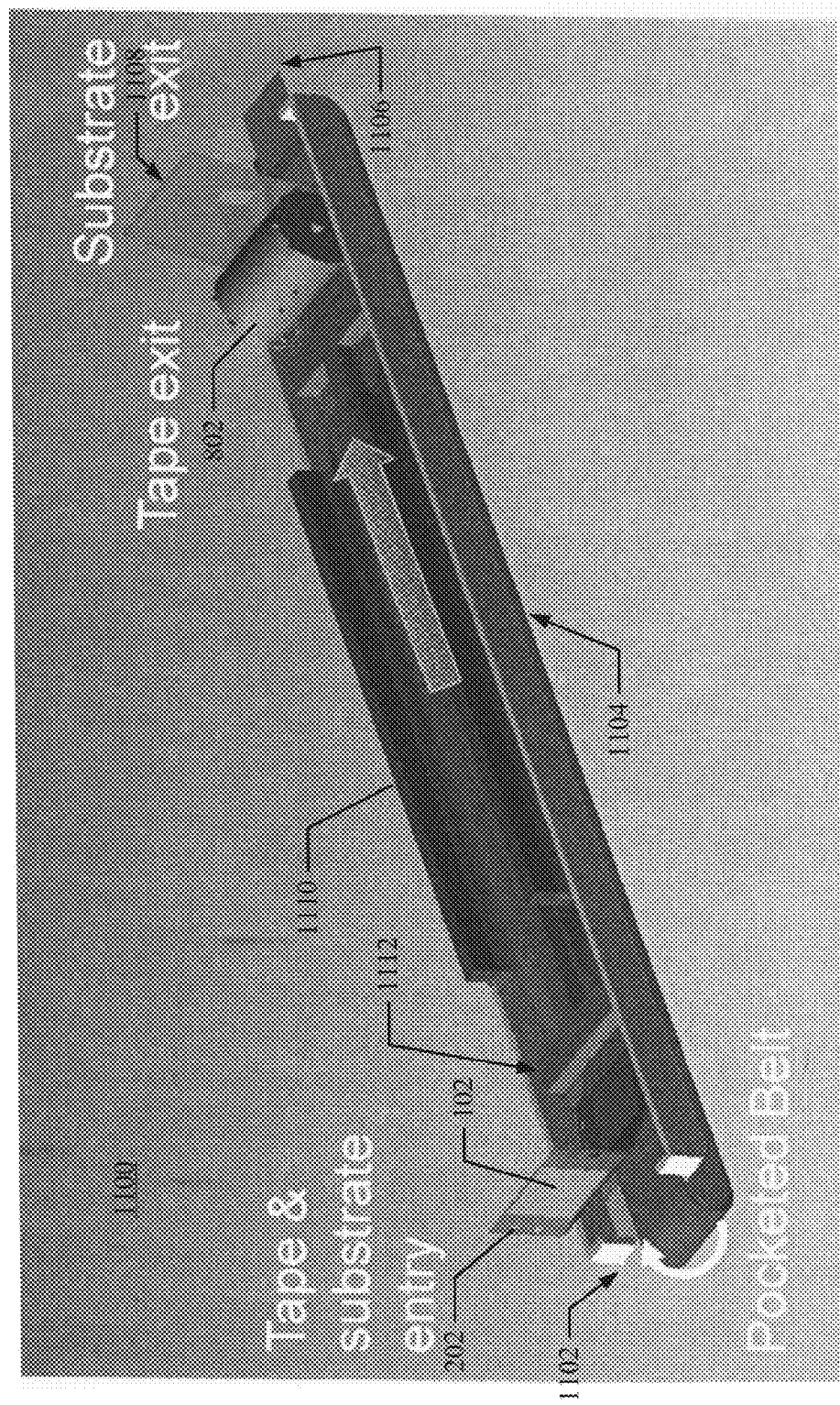
FIG. 11 is a schematic isometric view of one embodiment of an apparatus for performing a batch ELO process to remove ELO stacks from support substrates.
Figure 12:
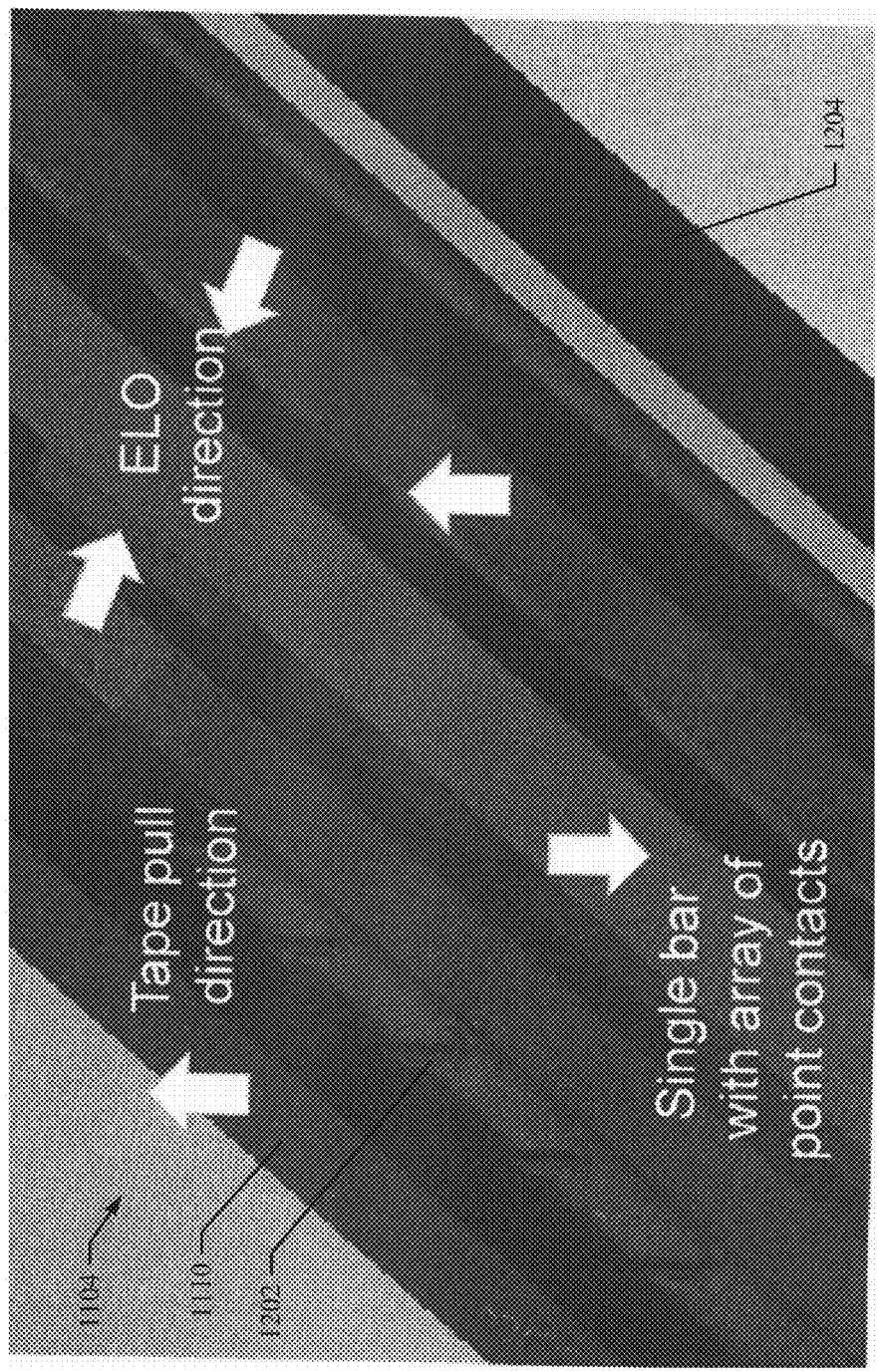
FIG. 12 is an enlarged overhead isometric view of the tensioning portion of the apparatus of FIG. 11.
Figure 13:
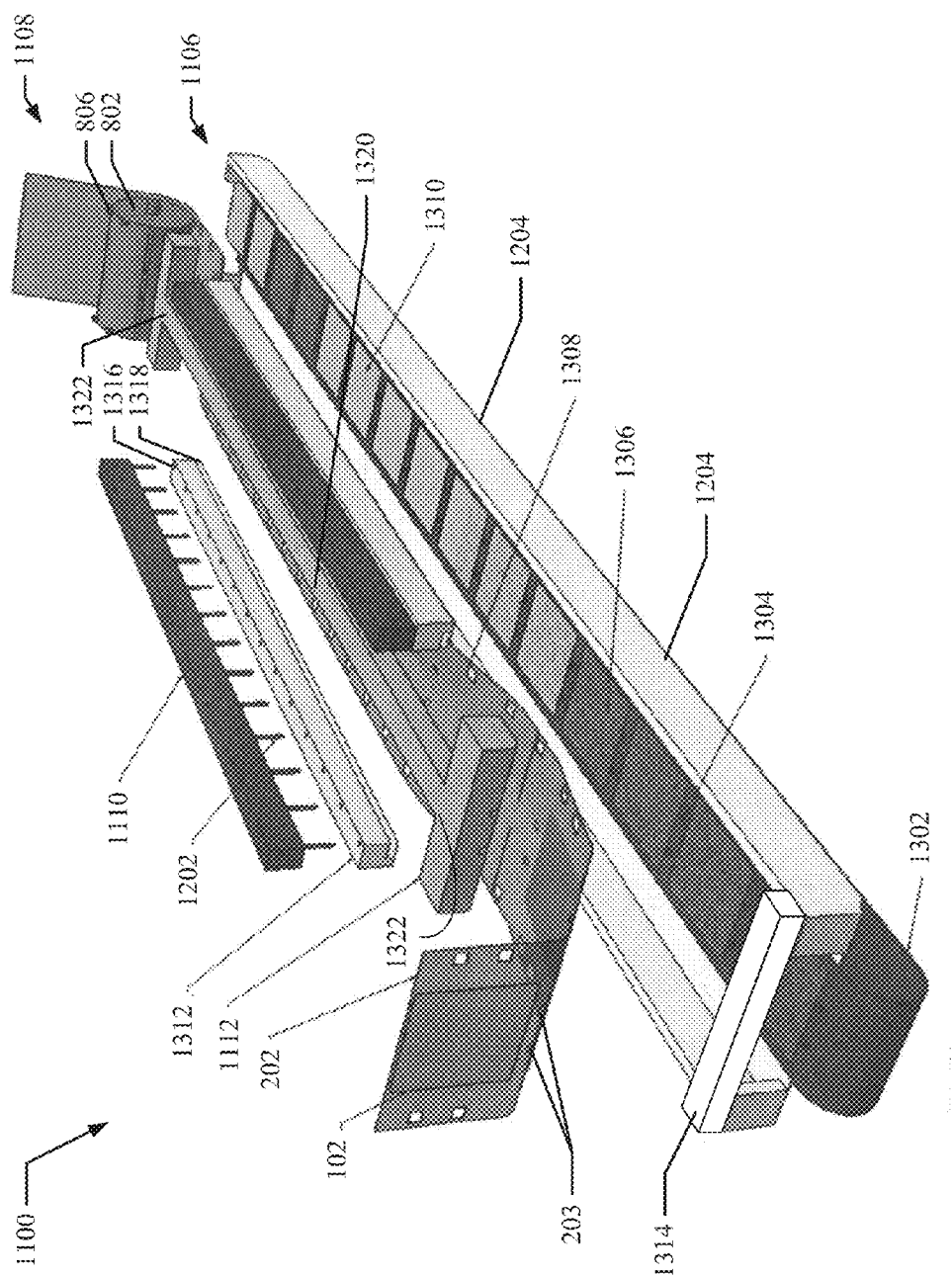
FIG. 13 is an exploded isometric view of the apparatus of FIG. 11.

FIGS. 11-13 depict an apparatus 1100 for performing a batch ELO etch process to remove ELO stacks from support substrates, as described in one embodiment herein. It should be understood that portions of the apparatus 1100 have been removed in FIGS. 11-13, for clarity. The apparatus 1100 includes a tape and substrate loading section 1102 (e.g., at first end 350, etc), an etching section 1104, a substrate unload section 1106 and a tape unload section 1108 (e.g., at second end 370, etc.). The batch process of apparatus 1100 includes loading a length (batch) of the tape and substrate assembly into the etching section 1104, removing the substrates 102 from the section of tape 202 and then unloading the separated tape 202 and substrates 102 from the first length while loading the next length of tape and substrate assembly into the etching section 1104. The length or batch of the tape and substrate assembly may include as little as one substrate, or may include 5, 10 or even more substrates per batch loaded into the etching section 1104 at a time. This process is described in detail below with respect to FIGS. 14, 15A-15E, and 24.

FIG. 12 shows an overhead view of a portion of the etching section 1104 including the pin rails 1110 and side rails 1204 of the apparatus 1100. The tape 202 includes a plurality of openings or slots 206 along its sides, similar to those shown in FIG. 2B. The pin rails 1110 include a plurality of index pins 1202 that engage the tape 202 in the slots 206. The tape engaging drum 802 drives the tape into and out of the etching section 1104, by engaging the slots 206 in the tape 202. Guide rails 1312 each included a slot 1318 that receives a side of the tape 202. The guide rails 1312 also include a plurality of index pin receiving holes 1316 through which the index pins 1202 extend. The apparatus 1100 includes sidewalls 1204.

FIG. 13 depicts an exploded view of apparatus 1100. As previously indicated portions of apparatus 1100 are omitted from FIG. 13 for clarity. Apparatus 1100 has a conveyor belt 1302 which contains substrate pockets 1306. The substrate pockets 1306 are each sized to accept a single substrate therein. The substrate pockets 1306 are filled with etchant by an etchant delivery device 1314, that sprays or drips etchant into the substrate pockets 1314. The etchant delivery device 1314 is provided etchant by a pump (not shown) that pumps etchant from an etchant sump (not shown) in the bottom of apparatus 1100. The substrate handling belt 1302 also includes a plurality of drive pins 1304 located on each side of each substrate pocket 1306. The drive pins 1304 engage indexing holes 203 in tape 202 to thereby maintain the substrates 102 in the substrate pockets 1306. Once the substrates 102 have been released from the tape 202, they remain in the substrate pockets 1306 to be conveyed out of apparatus 1100, by the conveyor belt 1302 through substrate unload section 1106. To provide the required downward force on the tape 202 and substrates 102, apparatus 1100 includes a weight bar 1112. The weight bar 1112 is generally formed in the shape of an "H," including an elongated longitudinal member 1320 and shorter transverse members 1322 formed on the ends of thereof. The weight bar 1112 provides the required deflection of the tape 202 to remove the substrates at 102 from the tape 202 in the etching section 1104, as shown at 1308. The operation of apparatus 1100, and the various components thereof, will now be described with respect to FIGS. 14 and 15A-15E.

Figure 15B:
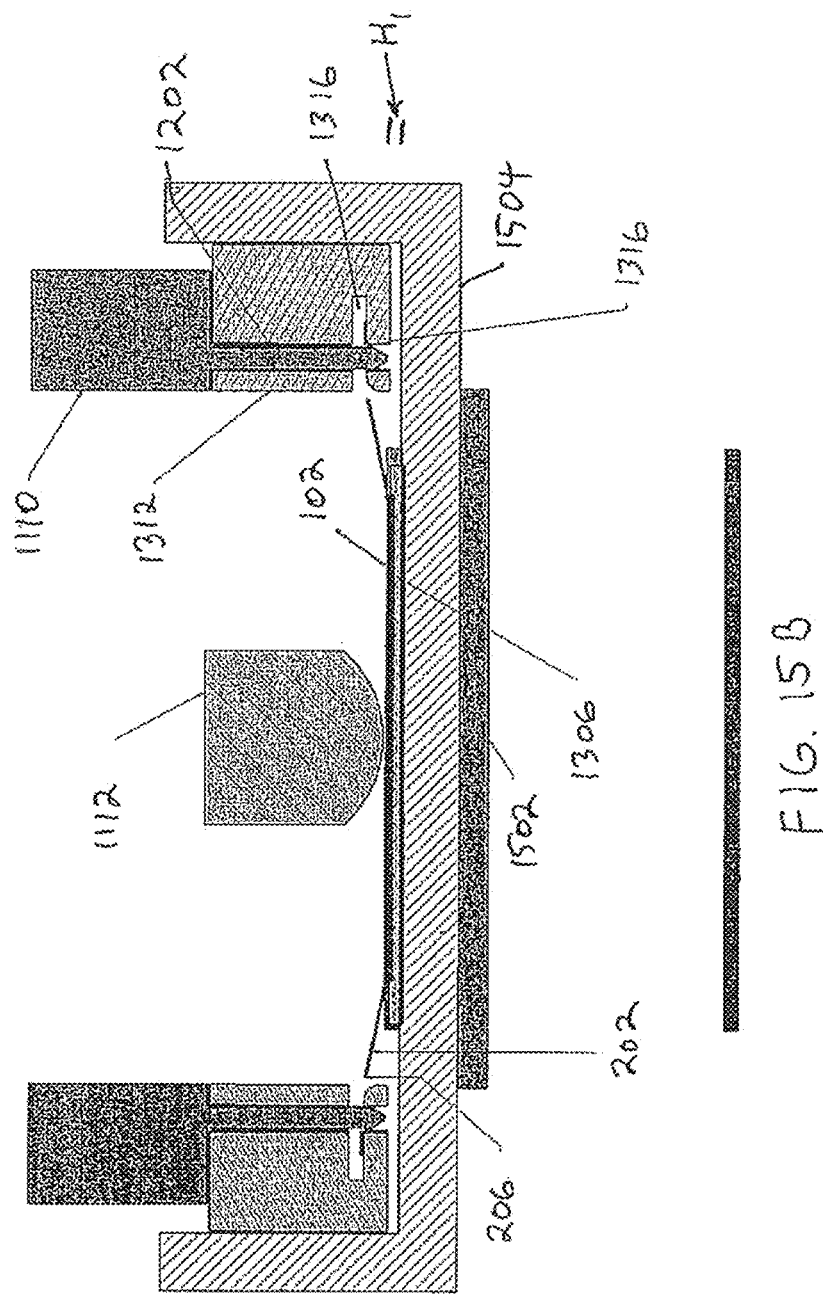
Figure 15D:
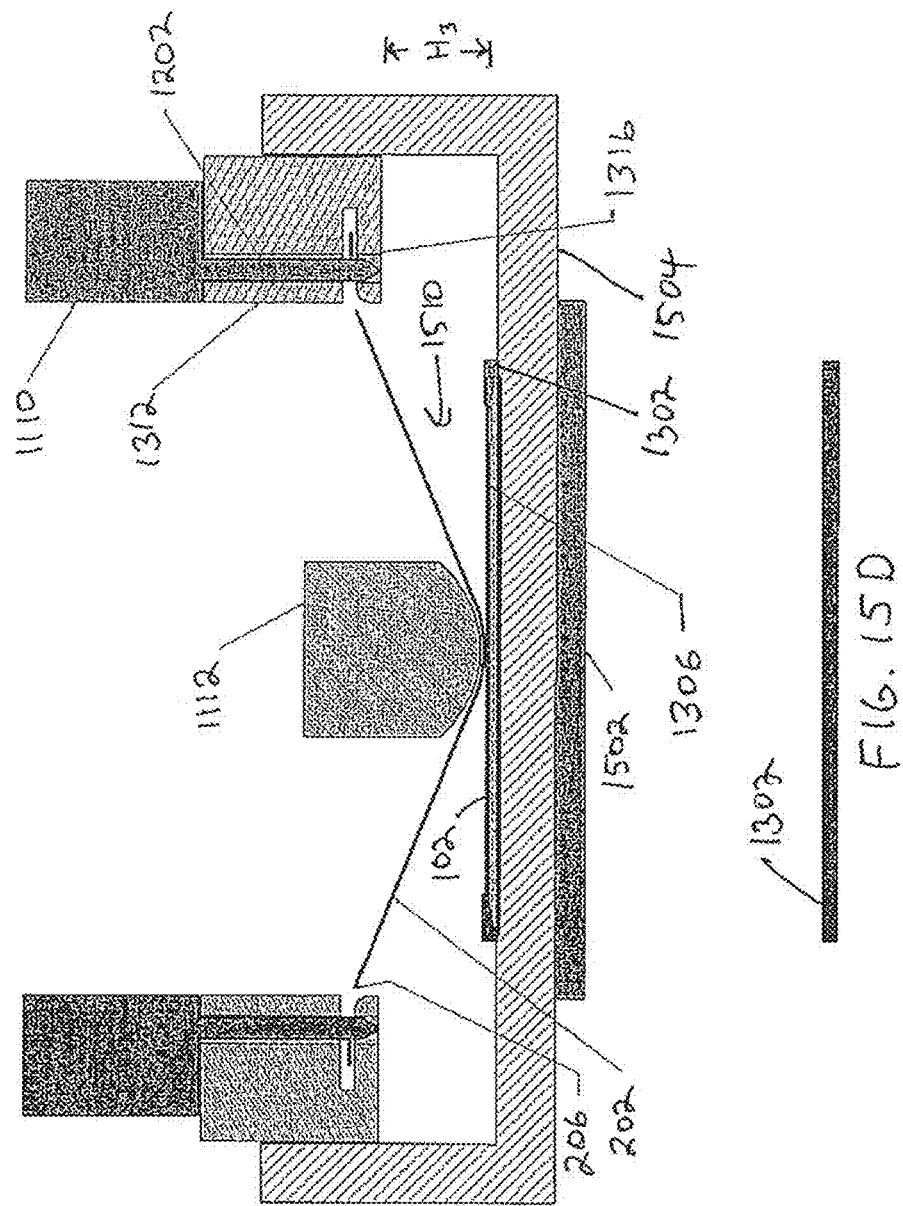

FIG. 14 shows a side view of apparatus 1100, with some of the components shown as transparent, and some of the components removed for clarity. FIG. 14 also includes section line 15-15 through the etching section 1104. FIGS. 15A-15E show the components of the etching section 1104 in the various stages of removing the substrates 102 from the tape 202. FIG. 15A shows the various components of apparatus 1100 in their position when the tape and substrate assembly is initially loaded into the etching section 1104. FIG. 15 A also shows sidewalls 1204 connected by the bed 1504 of apparatus 1100. In the initial position, the guide rails 1312 are in contact with the bed 1504. The tape 202 has been guided such that the sides of the tape 202 are in slots 1318 of the guide rails 1312. The pin rails 1110 are in a raised position such that the index pins 1202 are in the index pin receiving holes 1316, but have not entered slots 206 of tape 202. The substrates 102 are in the substrate pockets 1306 of the conveyor belt 1302, and the substrate pockets have been previously filled with etchant by the etchant delivery device 1314 (see FIG. 13). The tape 202 is in a relatively planar configuration and is still in full contact with the substrates 102. The weight bar 1112 is in a raised position and is not in contact with the tape and substrate assembly. FIGS. 15A-15E also illustrate heater 1502 which heats bed 1504 and the etchant in substrate pocket 1306 to accelerate the etching process.

In step 2404 of method 2400, the sides of the tape 202 are locked into position. Also in step 2404, the weight bar 1112 is lowered to apply force to the center of the tape and substrate assembly. Turning to FIG. 15B, it can be seen that the weight bar 1112 is in contact with the approximate center of the tape and substrate assembly. The pin rails 1110 are in a lowered position such that the index pins 1202 have further entered index pin receiving holes 1316 of the guide rails 1312 and extend through slots 206 of tape 202 to lock the sides of the tape 202 in position.

Once the sides of the tape 202 are locked into position, the method 2400 proceeds to step 2406 where the sides of the tape 202 are raised relative to the substrate 102. As can be seen in FIG. 15B the pin rails 1110 along with the guide rails 1312 have been raised to a height $H_1$, lifting the sides of the tape 202 along with them. This action places tension in tape 202, but at this point in the method 2400, the tape 202 is still fully engaged with the substrate 102. At step 2408 of method 2400, the sides of the tape 202 are further raised to form a crevice between the tape 202 and the substrate 102. In FIG. 15C, the pin rails 1110 along with the guide rails 1312 have been raised further to an increased height $H_2$, lifting the sides of the tape 202 even further above the substrate 102, to thereby form a crevice 1510 between the tape 202 and the substrate 102 along the sides of the tape 202.

In step 2410 of method 2400, the sides of the tape 202 are raised further to further increase the crevice between the tape 202 and the substrate 102. As is shown in FIG. 15D, the pin rails 1110 along with the guide rails 1312 have been raised even further to increased height $H_3$, lifting the sides of the tape 202 even further above the substrate 102, to thereby increase the size of the crevice 1510 between the tape 202 and the substrate 102 along the sides of the tape 202.

In step 2412 of method 2400, the substrate 102 is completely released from the tape 202, the tape 202 having the epitaxial layers remaining thereon. Turning to FIG. 15E, it can be seen that the pin rails 1110 along with the guide rails 1312 have been raised even further to increased height $H_4$, wherein the tape 202 is no longer in contact with the substrate 102, and the tape 202 with the epitaxial layers has been removed from the substrate 102. The weight bar 1112 has also been raised to avoid increasing tension in tape 202 which may result in damage to the epitaxial layers thereon.

In step 2414 of method 2400, the weight bar 1112 is raised to remove force from the center of the tape 202 in guide rails 1312 or lowered to return the tape 202 to its generally planar configuration. Pin rails 1110 remain raised such that index pins 1202 do not engage slots 206 in tape 202. The method 2400 can then return to step 2402 and the unloaded tape 202 and substrates 102 are unloaded from the etching section 1104 as the next length of tape and substrate assembly is loaded into the etching section 1104.

The right-hand side of the FIG. 14 illustrates how the tape 202 proceeds, in some embodiments, to tape post etch processing sections, such as those shown in FIG. 3A. In one embodiment, the substrates 102 proceed to substrate post etch processing sections also as shown in FIG. 3A. The etchant remaining in the substrate pockets 1306 may be dumped into a sump (not shown) as the substrate handling belt 1302 proceeds around roller 1402 on the right-hand side of FIG. 14. In some embodiments, the etchant may proceed to an etchant Processing section such as a filter, prior to being returned to the sump. In some embodiments, a sump may not be used, and fresh etchant is supplied to the substrate pockets 1306. In these embodiments, the used etchant may be collected for cleaning or disposal.

Figure 16:
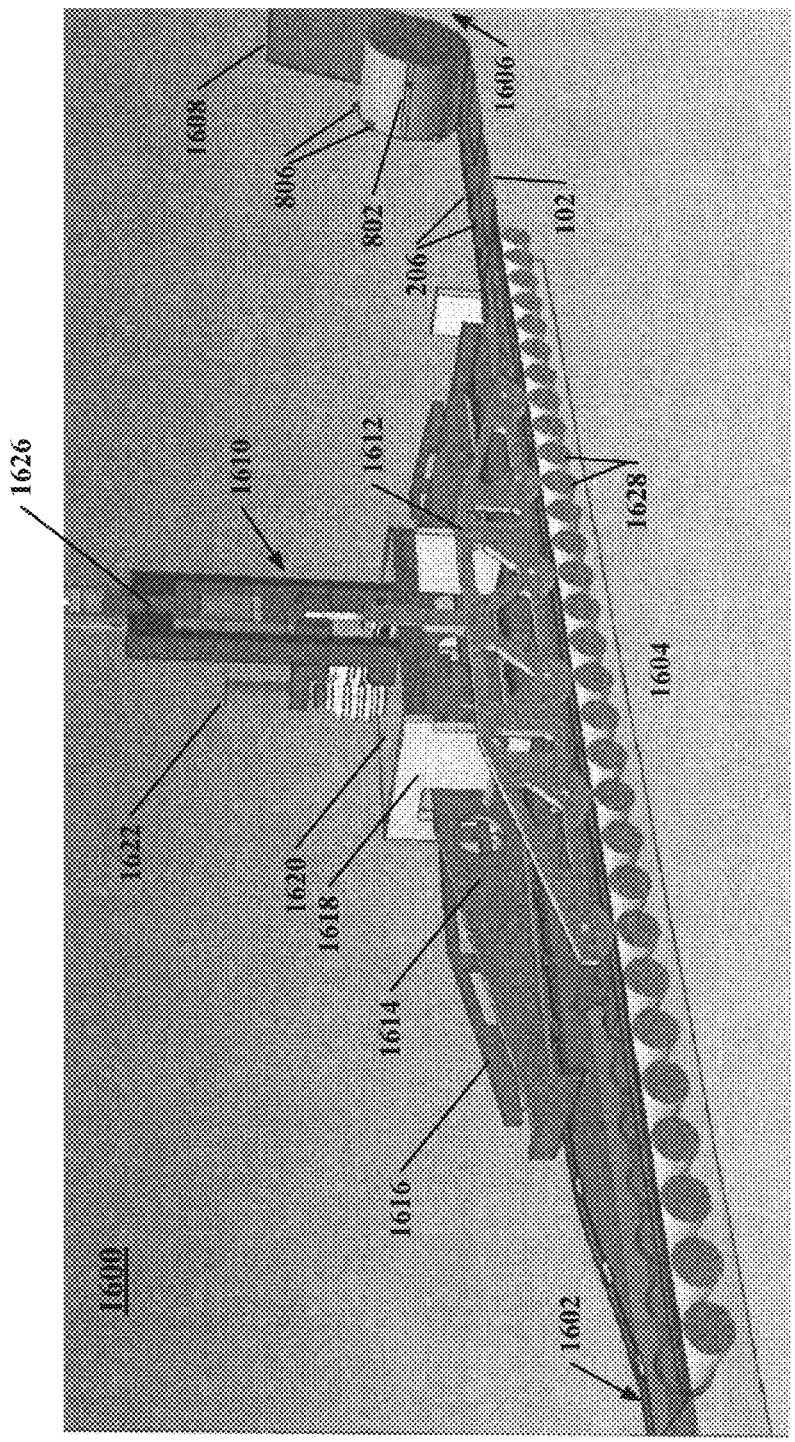
FIG. 16 is a schematic isometric view of another embodiment of an apparatus for performing a batch ELO process to remove ELO stacks from support substrates.
Figure 17:
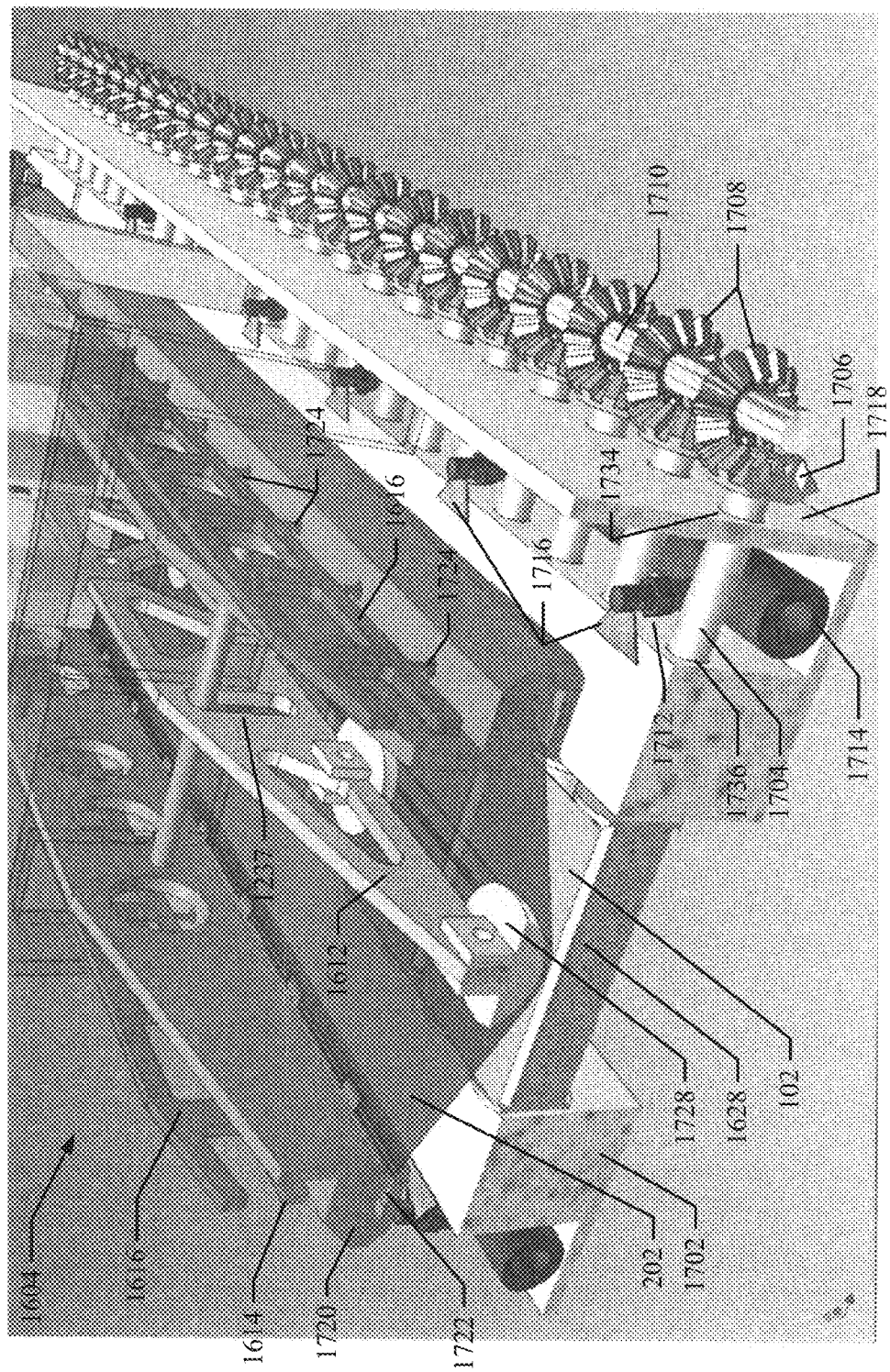
FIG. 17 is an enlarged isometric view of a portion of the apparatus of FIG. 16.
Figure 18:
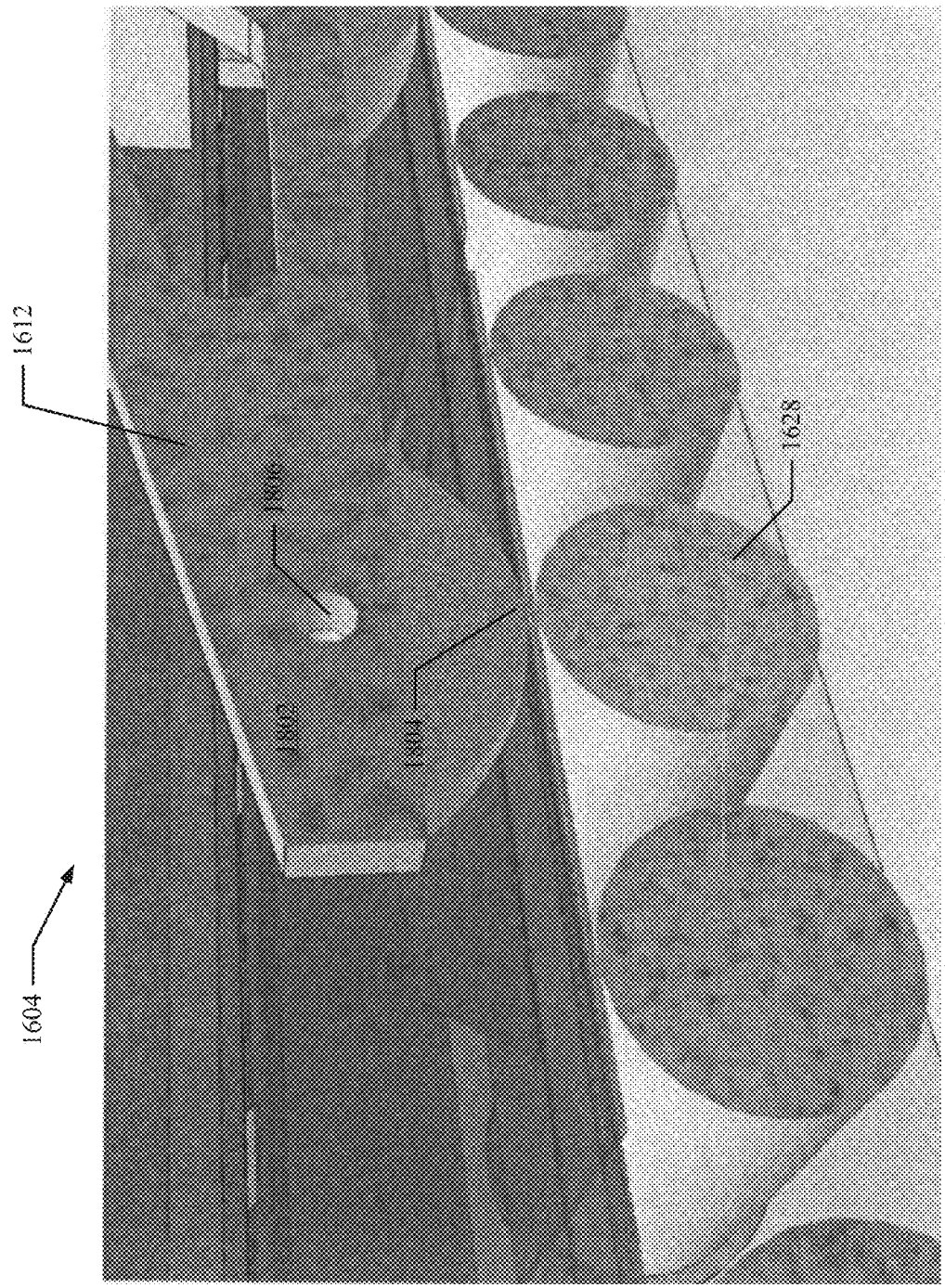
FIG. 18 is an enlarged isometric view of another portion of the apparatus of FIG. 16.

In FIGS. 16-18, a further embodiment of an apparatus 1600 for performing a batch ELO etch process to remove ELO stacks from support substrates in batches, is shown. It should be understood that portions of the apparatus 1600 have been removed in FIGS. 16-18, for clarity. The apparatus 1600 includes a tape and substrate loading section 1602, an etching section 1604, a substrate unload section 1606, and a tape unload section 1608. The batch process of apparatus 1600 includes loading a length of the tape and substrate assembly into the etching section 1604, removing the substrates 102 from the section of tape 202 and then unloading the separated tape 202 and substrates 102 from the first length while loading the next length of tape and substrate assembly into the etching section 1604. This process is described in detail below with respect to FIGS. 19, 20A-20D, and 25.

FIG. 16 shows an isometric view of apparatus 1600, with the apparatus 1600 having been split out longitudinally such that only half of the apparatus 1600 is illustrated. As shown in FIG. 16, apparatus 1600 includes a housing 1618 and a chamber lid 1620 mounted on top of the housing 1618. The housing 1618 encloses a tape and substrate release mechanism that includes a lift rail 1614, a tensioning pin rail 1616 and point load rail 1612. A tape and substrate release mechanism actuator 1610 is mounted on top of the chamber lid 1620, and is supported by a cylinder support bracket 1626. The tape and substrate release mechanism actuator 1610, includes a number of actuator cylinders including a pin cylinder 1622, as shown in FIG. 16. Also shown in FIG. 16, is a tape engaging to drum 802 that includes pins 806 that engage the slots 206 in the tape 202, to advance the tape 202 through apparatus 1600. A series of rollers 1628 support the substrates 102 from below.

FIG. 17 illustrates an isometric view of apparatus 1600 is shown from the tape and substrate loading section 1602 end of the apparatus 1600. The series of rollers 1628 are each supported on a roller driveshaft 1704. Each roller driveshaft 1704 extends through a drive shaft bore 1736 in a bottom housing 1702 of the apparatus 1600 and through a further drive shaft bore 1734 in housing wall 1718. A driven miter gear 1706 is mounted on the end of each roller driveshaft 1704. The driven miter gears 1706 are driven by driving miter gears 1708 that are mounted on and driven by gear driveshaft 1710. The driveshaft 1710 is driven by an electric motor (not shown), and in one embodiment may be synchronized with the driving mechanism for tape engaging drum 802 (also not Shown).

FIG. 17 also shows further details of the tape and substrate release mechanism. The lift rails 1614 include tape supports 1720 attached to the bottom thereof. The tape supports 1720 include tape receiving slots 1722 through which the sides of the tape 202 are guided. The two lift rails 1614 are connected to each other by two support bars 1730 (one shown in FIG. 17) to maintain the spacing there between. The tensioning pin rail 1616 includes a plurality of tensioning pins 1724 that extend through tensioning pin bores 1726 in the tape Support 1720 for engaging the slots 206 in tape 202 as is described in further detail below. The point load rail 1612 includes a number of point loads 1728 mounted to the bottom thereof. The point loads 1728 are spaced along the bottom of the point load rail 1612 at an interval that is equal to the distance between the centers of the substrates 102, such that each point load 1728 applies pressure to the center of a substrate 102. The point load rail 1612 also includes grooves 1732 through which support bars 1730 extends. The grooves 1732 and support bars 1730 interact such that the point load rail 1612 is maintained in a direction parallel to the longitudinal direction of apparatus 1600. To provide etchant to the etching section 1604, a plurality of etching spray nozzles 1712 direct an etchant spray 1716 toward the substrate and tape assembly Etchant is supplied to the etchant spray nozzles 1712 by an etchant supply conduit 1714. The etchant supply conduit 1714 may be connected to the output of an etchant pump (not shown) that in one embodiment pumps etchant from an etchant sump (also not shown) that is located in the bottom of apparatus 1600.

FIG. 18 illustrates a further alternate embodiment of the point loads in accordance with one embodiment. The point load rail 1612 includes a plurality of arcuate extensions 1802 that function as point loads. The bottom most point 1804 of extensions 1802 are spaced along the bottom of the point load rail 1612 at an interval that is equal to the distance between the centers of the substrates 102, such that each bottommost point 1804 applies pressure to the center of a substrate 102. FIG. 18 also shows a point load mounting hole 1806 that may be used to mount discrete point loads (such as point loads 1728 in FIG. 17). The discrete point loads may be mounted to the point load mounting holes 1806, using a fastener that extends through the point load mounting holes 1806.

Figure 19:
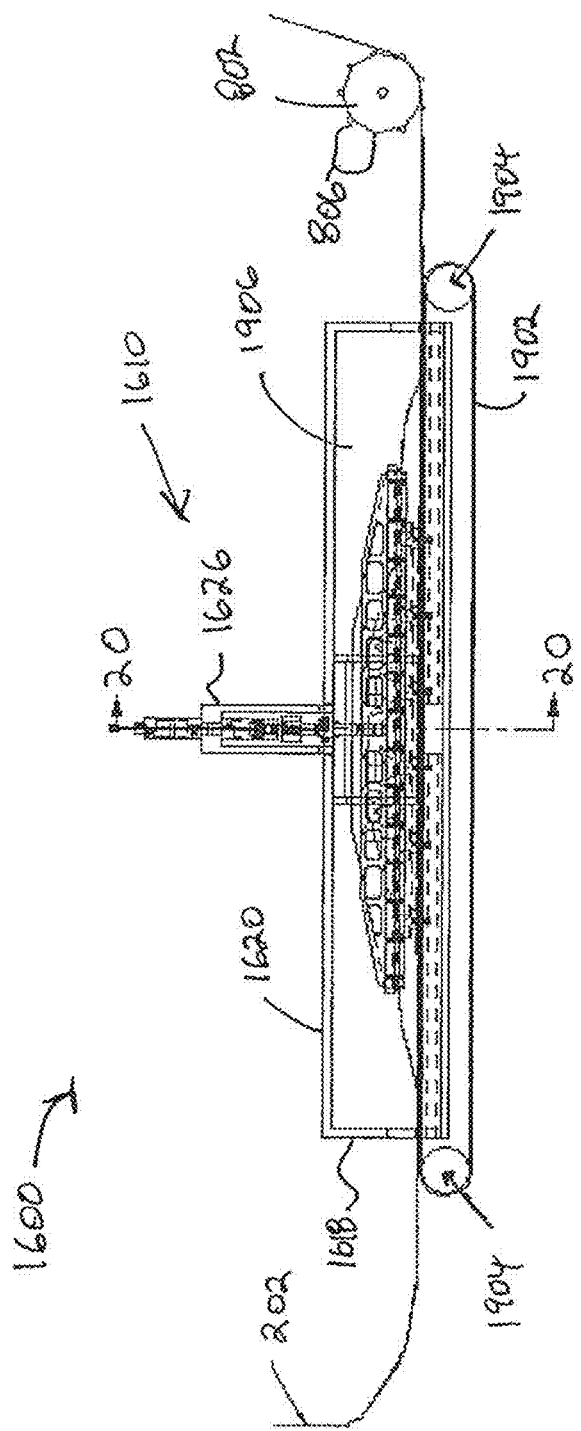
FIG. 19 is a schematic side view of the apparatus of FIG. 16.

FIG. 19 shows a side cross-sectional view of apparatus 1600, taken through the approximate longitudinal centerline of apparatus 1600. The housing 1618 is shown to extend for the length of the etching section 1604. The housing 1618 includes a chamber lid 1620 bottom housing 1702 and housing walls 1718 (see FIG. 17). The housing 1618 forms an interior volume 1906 that may be heated to enhance the etching process. In addition to those components previously described, FIG. 19 also illustrates an optional conveyor belt 1902 that extends above rollers 1628 to provide additional support to the tape 202 and substrates 102 between the rollers 1628. The conveyor belt 1902 is supported at its ends by conveyor rollers 1904. The conveyor rollers 1904 may optionally be driven by a motor and associated linkage (not shown), or the conveyor belt 1902 may be driven by the rollers 1628. FIG. 19 also includes section line 20-20 that extends through the approximate center of the tape and substrate release mechanism actuator 1610. Operation of the tape and substrate release mechanism and the etching process is described below with respect to FIGS. 20A-20D and 25.

Figure 20A:
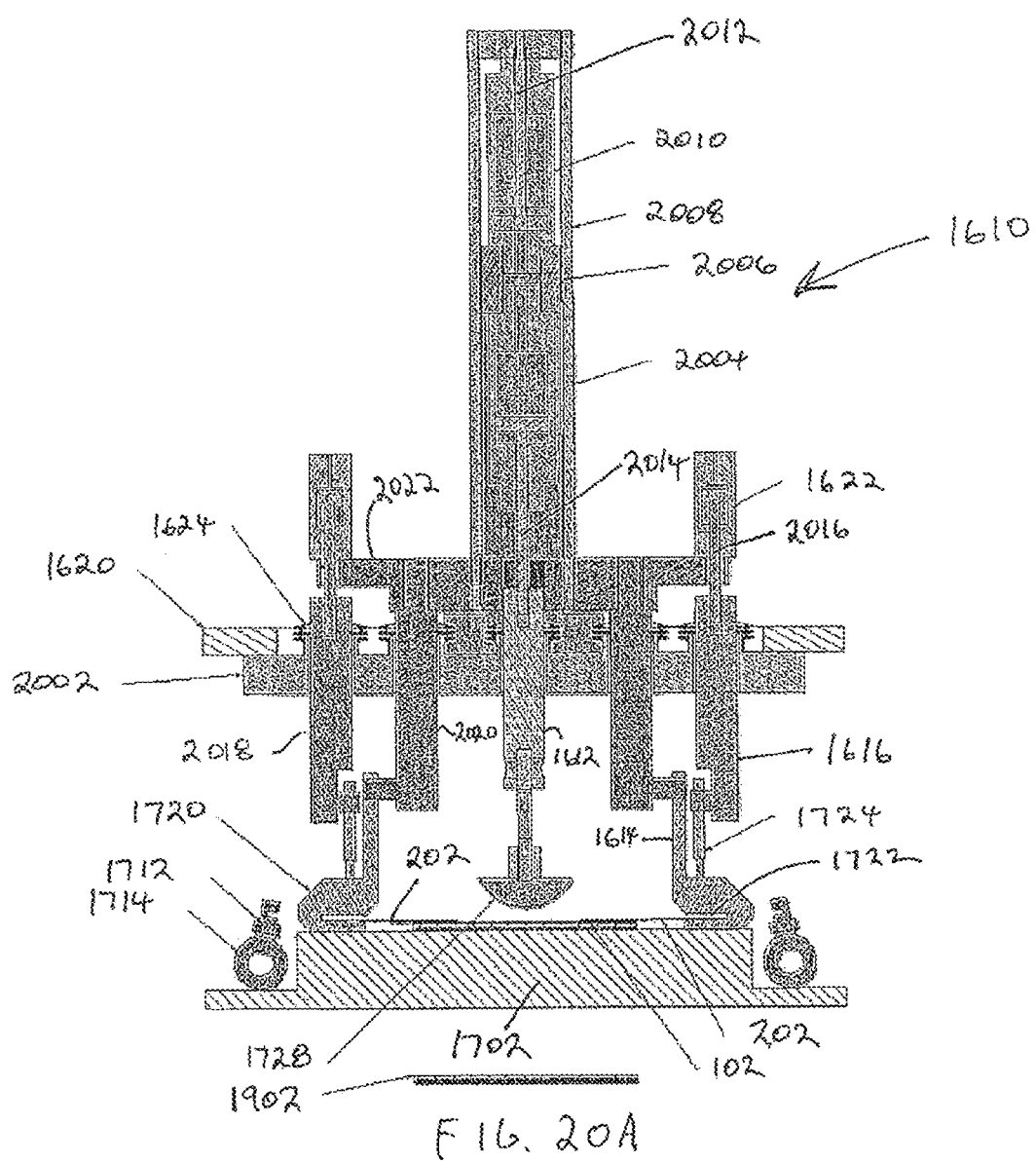
FIGS. 20A-20D are cross sections through section line 20-20 of FIG. 19, during various stages of the operation of the apparatus of FIG. 16.
Figure 25:
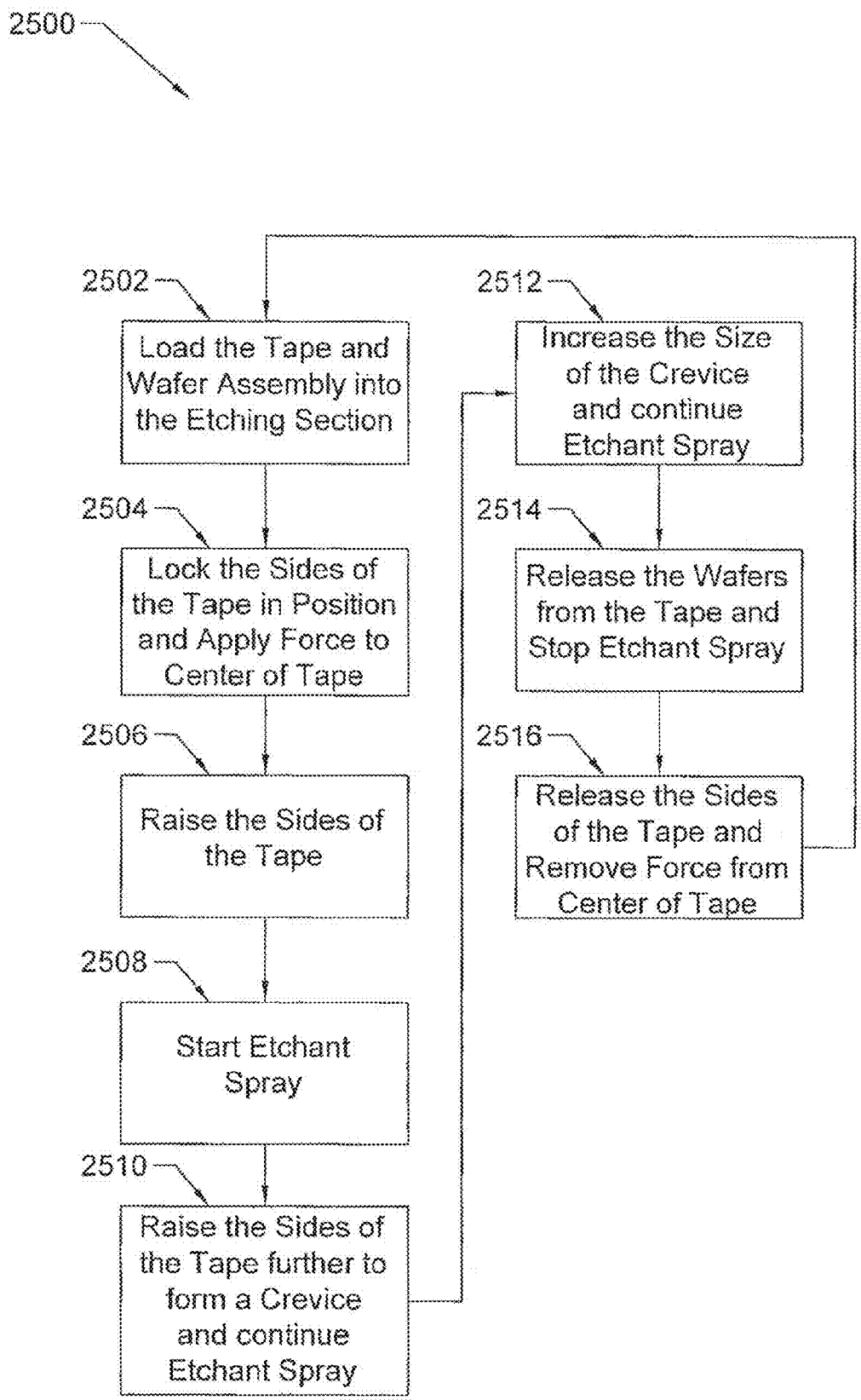
FIG. 25 is a flow chart illustrating another embodiment of a batch ELO method that may be performed by the apparatus of FIGS. 16-20D.

FIG. 20A illustrates the components of the tape and substrate release mechanism in their positions when a length of the tape and substrate assembly is initially loaded into the etching section 1604. FIG. 25 shows the steps of one embodiment of a method 2500 of using apparatus 1600 to remove the substrates 102 from the tape 202 while maintaining the epitaxial layers on the tape 202. In step 2502 a length of the tape and substrate assembly is loaded into the etching section 1604 as shown in FIG. 20A. The tape 202 has been guided such that its sides are in the tape receiving slots 1722 of the tape supports 1720. The lift rails 1614 and tape supports 1720 attached thereto are in their lowest position such that tape supports 1720 are in contact with the bottom housing 1702. The tape 202 is in a generally planar configuration with little or no tension in the tape 202. The rollers 1628 have been omitted from FIGS. 20A-20D for clarity. The tensioning pins 1724 as well as the pin rail 1616 are in a raised position such that the tensioning pins 1724 have not yet engaged the slots 206 in the tape 202. The point load rail 1612 and the point loads 1728 are also in a raised position such that point loads 1728 are not in contact with the tape 202. In addition, at this stage etchant spray nozzles 1712 have not yet started to supply etchant to the etching section 1604.

In order to operate the tape and substrate release mechanism the tape and substrate release mechanism actuator includes a plurality of fluid operated cylinders. A point load cylinder 2004 is connected by a pushrod 2014 to point load rail 1612 to thereby raise and lower the point load rail 1612. Fluid pressure (hydraulic or Pneumatic) is used to operate the various cylinders of the tape and substrate release mechanism actuator. The fluid pressure is supplied by pumps, solenoid valves, and conduits (not shown). A lift rail cylinder 2010 is connected by a pushrod 2012 to pull links 2008 which in turn is connected to a lift rail horizontal support 2022. The lift rail cylinder 2010 thereby raises and lowers the lift rail horizontal support 2022. The lift rail horizontal support 2022 is connected to lift rails 1614 by lift rail vertical support 2020. The tensioning pin cylinders 1622 are also supported on the lift rail horizontal support 2022. This configuration allows the lift rails 1614 to be raised and lowered without requiring independent adjustment of the pin cylinders 1622. The pin cylinders 1622 are connected to the tensioning pin rail 1616 by a pushrod 2016 such that the pin cylinders 1622 can raise and lower tensioning pins 1724. A support plate 2002 provides support to the various components of the tape and substrate release mechanism and in conjunction with the chamber lid 1620 and the bellows 1624 provides a sealed environment for the top of chamber 1906.

Figure 20B:
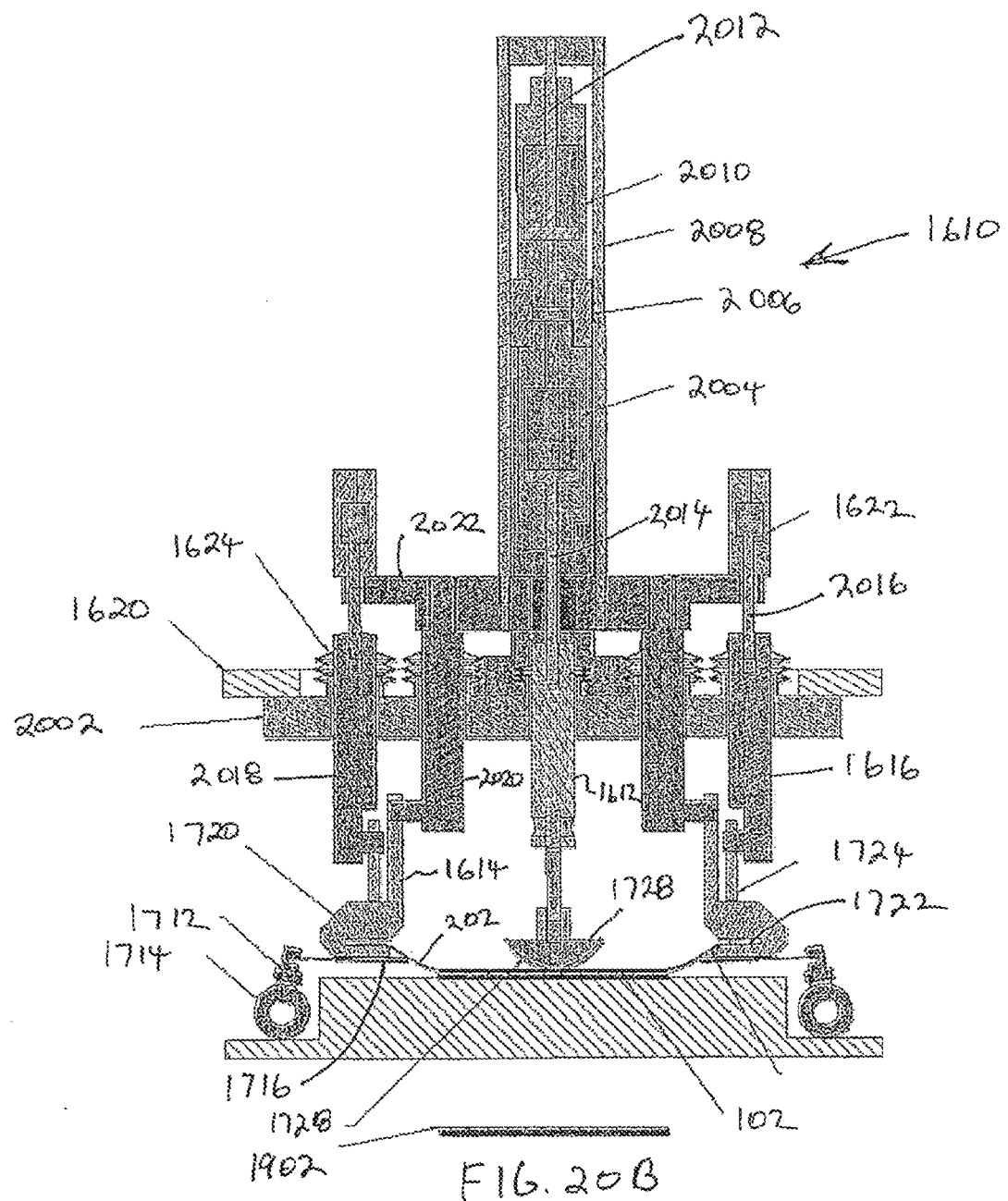
Figure 20C:
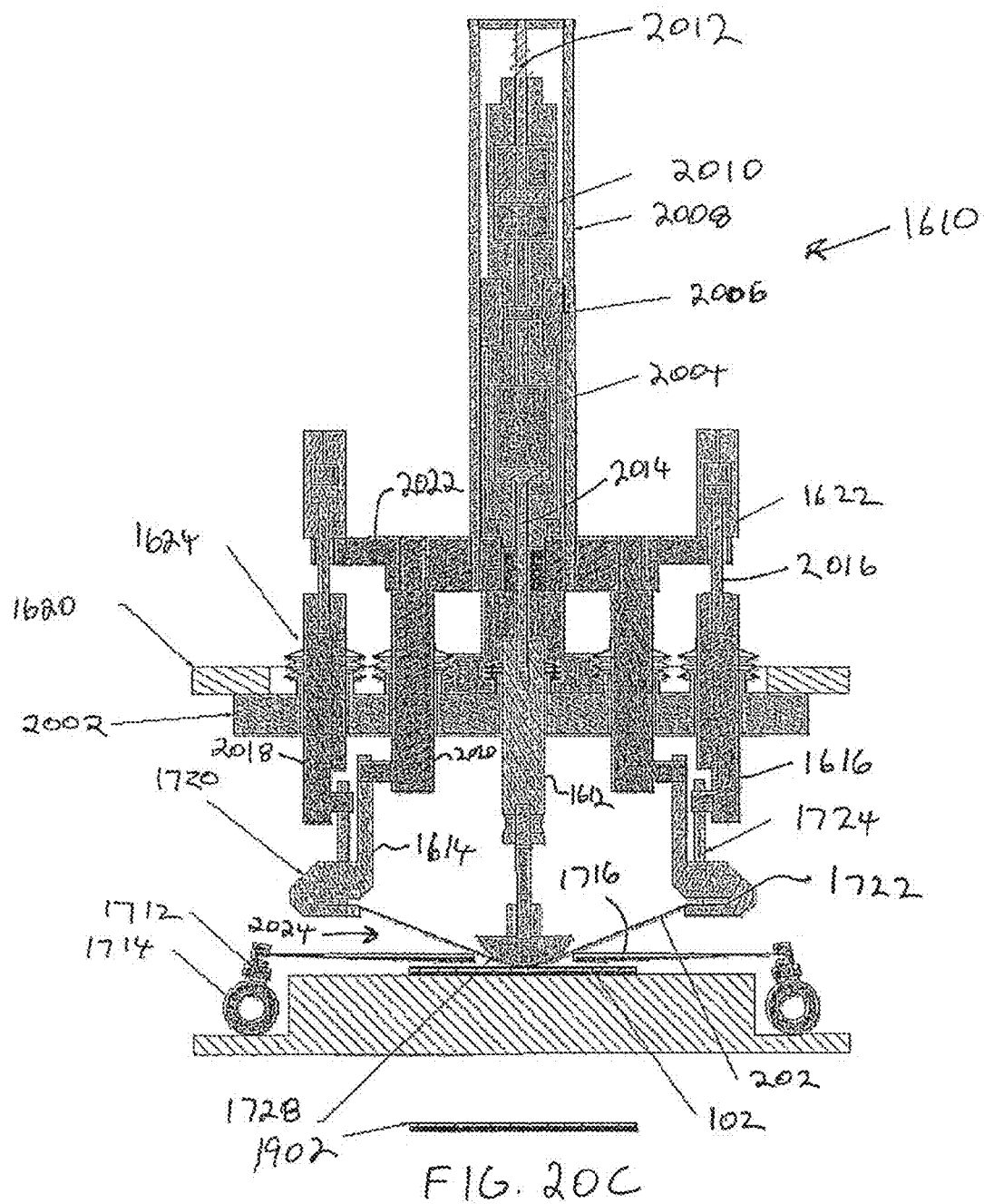

The method 2500 further provides step 2504 wherein the pin cylinders 622 are activated to lower tensioning pins 1724 so that the pins 1724 extend through slots 206 in tape 202 and thereby lock the sides of the tape 202 in position. The point load cylinder 2004 is also activated to lower the point load rail 1612 such the point loads 1728 contact the approximate center of tape 202 and apply force to the center of substrates 102. The method 2500 then proceeds to step 2506 wherein the sides of the tape 202 are initially raised. This position is shown in FIG. 20B, after the point loads 1728 and the tensioning pins 1724 have been lowered, lift rail cylinder 2010 is activated to raise lift rail horizontal support 2022 thereby lifting tape Supports 1720 and the sides of the tape 202. The method 2500 then proceeds to step 2508 and etchant is then supplied via etchant supply conduit 1714 to etchant spray nozzles 1712 and the etchant spray 1716 is directed toward the tape 202 and substrate 102 interface.

After the etchant spray 1716 has started, the method 2500 proceeds to step 2510 wherein the sides of the tape are raised further to form a crevice 2024 as shown in FIG. 20O. The etchant spray 1716 can then reach further into crevice 2024 to release the substrate 102 from the tape 202, while the epitaxial layers remain adhered to the tape 202. The lift rail cylinder 2010 continues to raise the lift rails 1614 and the sides of the tape 202 to further increase the size of the crevice 2024 while the etchant spray 1716 is continued as shown in step 2512 of method 2500.

Figure 20D:
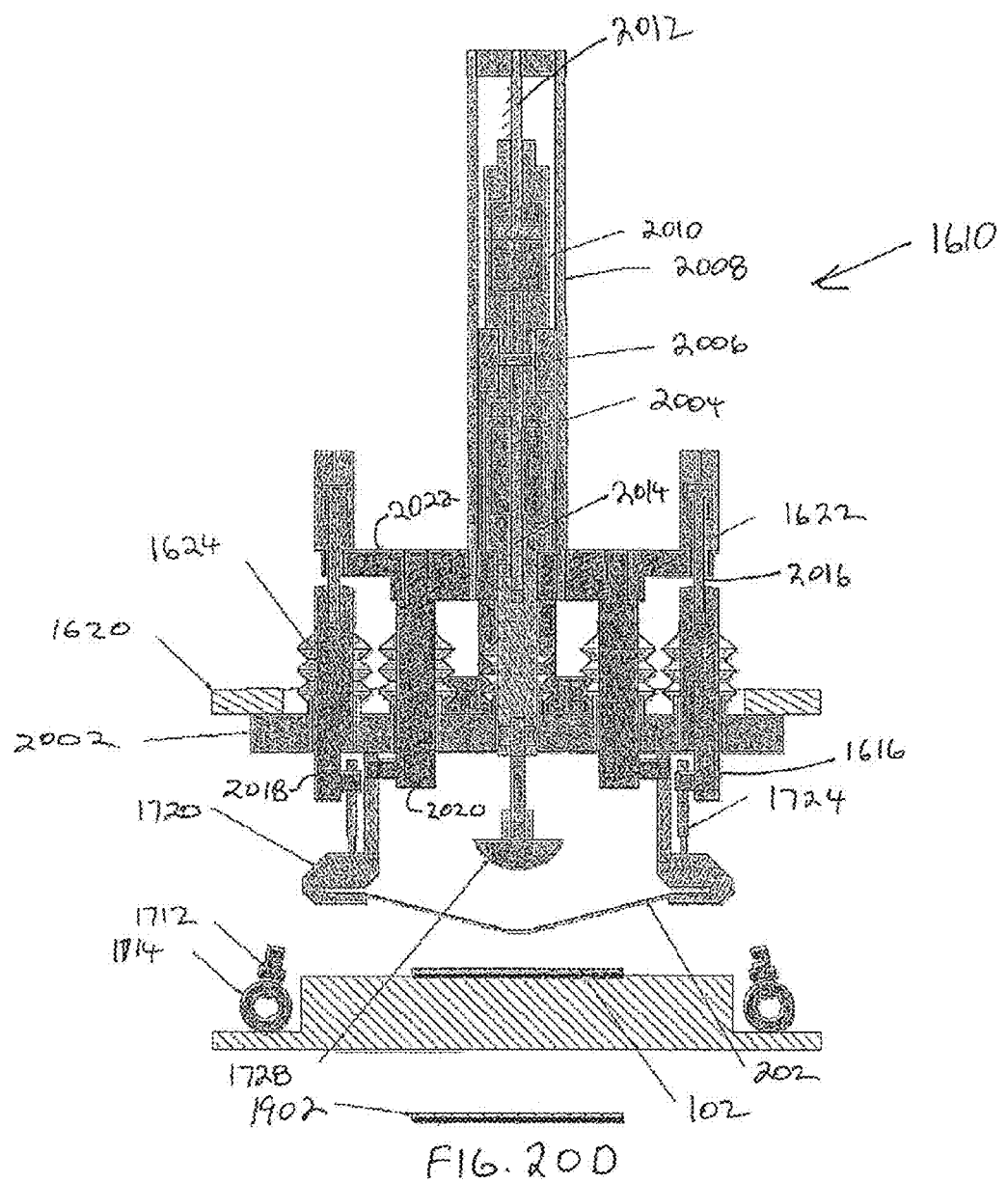

In step 2514 of method 2500, the substrates 102 have completely released from the tape 202, as shown in FIG. 20D. The etchant spray 1716 is terminated at this point. The point load cylinder 2004 raises the point loads 1728 so that they no longer contact the tape 202. The pin cylinders 1622 also lift tensioning pins 1724 such that they no longer engage slots 206 in tape 202, and the sides of the tape 202 are released.

The method 2500 then proceeds back to step 2502 where the tape and substrate release mechanism returns to its position as shown in FIG. 20A. The next length of tape and substrate assembly can then be loaded into the etching section 1604, while the released tape 202 with the epitaxial layers thereon, and the released substrates 102 are simultaneously directed out of the etching section 1604 through the tape unload section 1608 and the substrate unload section 1606, respectively.

In some embodiments, the tape 202 proceeds to tape post etch processing sections as shown in FIG. 3A. In some embodiments, the substrates 102 proceed to substrate post etch Processing sections also as shown in FIG. 3A. The etchant sprayed during the process may be drained into a sump (not shown). In some embodiments, the etchant may proceed to an etchant Processing section such as a filter, prior to being returned to the sump. In some embodiments, a sump may not be used, and fresh etchant is supplied to the etchant spray nozzles 1712. In these embodiments, the used etchant may be collected for cleaning or disposal. In some embodiments all of the nozzles are sprayed continuously. In other embodiments, the nozzles are cycled on and off in sequence so that the total volume of etchant required for the system is reduced. In other embodiments, the exhaust is passed through a condenser and the condensate is sent back to the sump for reuse.

FIGS. 21A-21D illustrate various embodiments of point loads that may be used in conjunction with the various apparatus described above. For example in one embodiment the point loads shown in FIGS. 21A-21D may be used in place of point load 1728 of apparatus 1600.

FIG. 21A shows a semispherical point load 2100 having a pushrod 2108 and a semispherical rigid portion 2110. The semispherical portion 2110 is covered by a conformal semispherical compressible layer 2112. The semispherical point load 2100 applies pressure in a substantially circular region, which may be adjustable as described below with respect to FIGS. 22A-22C.

FIG. 21B shows a linear point load 2102 having a pushrod 2108 and a linear rigid portion 2114. The linear rigid portion 2114 is covered by a conformal linear compressible layer 2116. The linear point load 2102 is similar in function to point load 2100, however point load 2102 applies pressure along an elongated linear region.

FIG. 21C shows a triangular point load 2104 having a pushrod 2108 and a triangular rigid portion 2118. The triangular rigid portion 2118 is covered by a conformal triangular compressible layer 2120. The triangular point load 2104 is similar in function to point load 2100, however point load 2104 applies pressure in a relatively smaller region (point) than point load 2100.

FIG. 21D shows a dual triangular point load 2106 having a pushrod 2108 and a dual triangular rigid portion 2122. The dual triangular rigid portion 2122 is covered by a conformal dual triangular compressible layer 2124. The dual triangular point load 2104 is similar in function to the triangular point load 2104, however point load 2106 applies pressure to two regions (points).

The pushrods 2108 of the above point loads 2100, 2102, 2104, and 2106 may be connected to associated components of the above-described apparatus. For example the pushrods 2108 may be connected to the point load mounting holes 1806 of apparatus 1600 as shown in FIG. 18, using a fastener that extends through the point load mounting holes 1806. The selection of which of the point loads should be used maybe dependent upon materials of the tape, epitaxial layers, on operational parameters of the various apparatus, combinations thereof, etc. The compressible layer of the various point loads may be formed of a gasket-type material such as an ethylene propylene diene monomer (EPDM) or an expanded Polytetrafluoroethylene (ePTFE).

FIGS. 22A-22C illustrate how the compressible layers of the point loads 2100, 2102, 2104 and 2106 affect the ELO process. While FIGS. 22A-22O show the semispherical point load 2100 of FIG. 21A, the same principles described below are equally pertinent to the other point loads. In FIG. 22 the point load 2100 is shown contacting the tape 202 and substrate 102 with a baseline amount of pressure. Also in FIG. 22, a baseline amount of tension is applied to tape 202. The combination of the pressure applied by the point load 2100 and the tension applied to tape 202 results in angle α between the substrate 102 and the tape 202. In FIG. 22B, the amount of tension applied to tape 202 has been reduced below the baseline, while the pressure applied by the point load 2100 has been maintained at the baseline pressure. This combination of the pressure applied by the point load 2100 and the tension applied to tape 202 results in angle β between the substrate 102 and the tape 202. In FIG. 22O, the amount of tension applied to tape 202 has been maintained at the baseline, while the pressure applied by the point load 2100 has been increased above the baseline pressure. This combination of the pressure applied by the point load 2100 and the tension applied to tape 202 results in angle β between the substrate 102 and the tape 202. The pressure applied by the point load 2100 and the tension applied to tape 202 is selected to maximize the etching rate of the etching process while minimizing or eliminating damage to the epitaxial layers that may occur during the etching process.

It is appreciated the present lift off systems and methods are compatible with a variety of wafer configurations. In one embodiment the substrate 102 may contain or be formed of a variety of materials, such as Group III/V materials, and may be doped with other elements. In one embodiment, the materials can include Groups III/V semiconductor materials, and may be doped with other elements. In one embodiment, growth substrate 102 contains gallium arsenide, doped gallium arsenide, gallium arsenide alloy, indium aluminum gallium phosphide alloys, indium aluminum phosphide alloys, indium gallium phosphide alloys, other group III/V semiconductors, germanium, materials with similar lattice constants, derivatives thereof, etc. The sacrificial layer may contain aluminum arsenide, gallium aluminum arsenide, derivatives thereof, alloys thereof, or combinations thereof. The sacrificial layer 104 may have a thickness of about 20 nm or less, preferably, within a range from about 1 nm to about 10 nm, and more preferably, from about 4 nm to about 6 nm.

In some embodiments, the epitaxial material of the epitaxial material layer 110 may contain gallium arsenide, aluminum gallium arsenide, indium gallium phosphide, alloys thereof, derivatives thereof, or combinations thereof. The epitaxial material layer 110 may contain one layer or more layers. In some examples, the epitaxial material layer 110 contains a layer having gallium arsenide and another layer having aluminum gallium arsenide. In another example, the epitaxial material layer 110 contains a gallium arsenide buffer layer, an aluminum gallium arsenide passivation layer, and a gallium arsenide active layer. The gallium arsenide buffer layer may have a thickness within a range from about 100 nm to about 500 nm, such as about 300 nm, the aluminum gallium arsenide passivation layer may have a thickness within a range from about 10 nm to about 50 nm, such as about 30 nm, and the gallium arsenide active layer may have a thickness within a range from about 500 nm to about 2,000 nm, such as about 1,000 nm. In some examples, the epitaxial material layer 106 further contains a second aluminum gallium arsenide passivation layer. The second gallium arsenide buffer layer may have a thickness within a range from about 100 nm to about 500 nm, such as about 300 nm. In other embodiments herein, the epitaxial material layer 106 may have a cell structure containing multiple layers. In some embodiments, device structure 106 may contain gallium arsenide, aluminum gallium arsenide, indium aluminum gallium phosphide, indium gallium phosphide, indium aluminum phosphide, alloys thereof, derivatives thereof, or combinations thereof. The device structure may be doped. Device structure 106 may contain one layer of material, but generally contains multiple layers. The overall thickness of device structure 106, including the sum of all layer thicknesses within the stack, may be within a range from about 0.5 µm to about 5 µm, such as from about 1 µm to about 2 µm.

Some implementations relate to apparatus and methods for epitaxial lift off (ELO) techniques which are used to form thin films and devices. The ELO thin films generally contain epitaxially grown layers which are formed on a sacrificial layer disposed on or over a support or growth substrate, such as a substrate. For example, the substrate is a gallium arsenide (GaAs) substrate. A support material or tape may be disposed on the opposite side of the epitaxial material than the substrate. The tape may be used to hold the epitaxial material during the etching and removal steps of the ELO process, and thereafter. In various embodiments, the apparatus for removing the ELO film from the substrates without damaging the ELO film may include an etchant reservoir, substrate handling and tape handling mechanisms, various tension control devices to protect the epitaxial material during the lift-off process and etchant delivery systems to route the etchant to the sacrificial layer between the tape and substrate.

In one embodiment, a method for performing an epitaxial lift off process on a tape, epitaxial layer and substrate assembly is provided and includes supporting the substrates, providing etchant to an interface between the tape and substrates, and lifting the tape from the substrates, while providing the etchant, to thereby remove the tape and epitaxial layers from the substrates. Examples include GaAs substrates and hydrofluoric acid as the etchant.

In another embodiment, an apparatus for performing a batch epitaxial lift off process on a tape, epitaxial layer and substrate assembly is provided and includes a first end having a tape and substrate loading section, a second end having a tape unload section and a substrate unload section, and an etching section, wherein the etching section has a tape tensioning device for engaging the tape, a substrate support for supporting the substrates, and an etchant supply for providing etchant to the etching section, wherein the tape tensioning device for engaging the tape lifts the tape from the substrates, while the etchant supply delivers an etchant to the etching section, to thereby remove the tape and epitaxial layers from the substrates.

In one embodiment, a method for performing and epitaxial lift off process on a tape and substrate assembly comprising a tape, a plurality of substrates, a plurality of epitaxial layers between the plurality of substrates and the tape, and a plurality of sacrificial layers disposed between the substrates and the epitaxial layers, the method comprises: supporting the substrates; providing etchant to an interface between the tape and substrates; exposing the sacrificial layers to the etchant while removing material of the sacrificial layer during an etching process; and lifting the tape from the substrates to thereby separate the tape and epitaxial layers from the substrates. The tape and epitaxial layers can be continuously removed from the substrates during a continuous process. The tape and epitaxial layers can be removed from the substrates in discreet batches during a batch process, and each batch comprising a length of tape and a plurality of substrates.

In one embodiment, the substrate support comprises a conveyor belt, the conveyor belt including a plurality of wafer pockets, each wafer pocket being configured to accept a single substrate; and the etchant supply comprises an etchant delivery device that sprays or drips an etchant into the wafer pockets. The substrate support can comprise a series of rollers. In one embodiment a tape tensioner further comprises a point load rail, the point load rail including a plurality of point loads that provides force on a center of the tape and substrates. The plurality of point loads can be integral with the point load rail. The plurality of point loads can be discrete elements that are attached to the point load rail using a fastener.

Thus present systems and methods facilitates efficient and effective etching with less etching materials. In addition to saving on the etching material costs themselves, the present systems and methods facilitate savings in facilities and equipment that would otherwise have to be utilized to deal with larger quantities of etchant material.

The foregoing descriptions of specific embodiments have been presented for purposes of illustration and description. They are not intended to be exhaustive or to limit the invention to the precise forms disclosed, and many modifications and variations are possible in light of the above teaching. The embodiments were chosen and described in order to explain the principles and its practical application, to thereby enable others skilled in the art to utilize the invention and various embodiments with various modifications as are suited to the particular use contemplated. It is intended that the scope be defined by the Claims appended hereto and their equivalents.

What is claimed is:

1. A method for performing etching to separate an epitaxial lift off component from a support substrate using a belt and chain apparatus, the method comprising:
    using an etchant application component that comprises a substrate pocket and an etchant supply component, wherein the etchant supply component includes a plurality of etching spray nozzles;
    coupling the epitaxial lift off component to a tape using a tape application component, wherein a sacrificial layer is between the epitaxial lift off component and the substrate;
    directing an etchant spray towards the tape and the substrate;
    routing an etchant to the sacrificial layer using an etchant delivery system; and
    separating the epitaxial lift off component from the substrate using a separation assistance component, wherein the separation assistance component comprises a drive link ramp, a chain drive, guide rails, and pin rails.

2. The method of claim 1, wherein the drive link ramp comprises an elongated slot and a height that increases from a first end of the apparatus through an etching section.

3. The method of claim 1, wherein the chain drive comprises a plurality of drive pins.

4. The method of claim 1, wherein the separation assistance component further comprises a plurality of point loads configured to contact the center of the tape as the tape is driven along and up an increasing height of the drive link ramp.

5. The method of claim 1, wherein each guide rail includes a guide slot that receives one side of the tape and a plurality of index pin receiving holes.

6. The method of claim 5, wherein each pin rail includes a plurality of index pins.

7. The method of claim 6, wherein the pin rails are operable to be lowered with respect to the guide rails such that the plurality of index pins extend into the plurality of index pin receiving holes and through a plurality of engagement slots along sides of the tape.

8. The method of claim 6, wherein the separation assistance component further comprises two pin rails.

9. A method for performing etching to separate an epitaxial lift off component from a support substrate using a belt and chain apparatus, wherein the belt and chain apparatus comprises:
    an etchant application component that comprises a substrate pocket and an etchant supply component, wherein the etchant supply component includes a plurality of etching spray nozzles;
    a tape application component configured to couple the epitaxial lift off component to a tape, wherein a sacrificial layer is between the epitaxial lift off component and the substrate;
    an etchant spray configured to be directed towards the tape and the substrate;
    an etchant delivery system configured to route an etchant to the sacrificial layer; and
    a separation assistance component configured to separate the epitaxial lift off component from the substrate, wherein the separation assistance component comprises a drive link ramp, a chain drive, guide rails, and pin rails.

10. The method of claim 9, wherein the drive link ramp comprises an elongated slot and a height that increases from a first end of the apparatus through an etching section.

11. The method of claim 9, wherein the separation assistance component further comprises a plurality of point loads configured to contact the center of the tape as the tape is driven along and up an increasing height of the drive link ramp, and wherein each pin rail includes a plurality of index pins.

12. The method of claim 11, wherein each guide rail includes a guide slot that receives one side of the tape and a plurality of index pin receiving holes.

13. The method of claim 12, wherein the pin rails are operable to be lowered with respect to the guide rails such that the plurality of index pins extend into the plurality of index pin receiving holes and through a plurality of engagement slots along sides of the tape.

14. The method of claim 13, wherein the separation assistance component further comprises two pin rails.

* * * * *